(12) United States Patent
Sasaki et al.

(10) Patent No.: US 7,198,880 B2
(45) Date of Patent: Apr. 3, 2007

(54) POSITIVE RESIST COMPOSITION

(75) Inventors: Tomoya Sasaki, Shizuoka (JP);
Kazuyoshi Mizutani, Shizuoka (JP);
Shinichi Kanna, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 283 days.

(21) Appl. No.: 10/422,789

(22) Filed: Apr. 25, 2003

(65) Prior Publication Data

US 2003/0232277 A1 Dec. 18, 2003

(30) Foreign Application Priority Data

Apr. 26, 2002 (JP) .......................... P. 2002-126433
Jul. 31, 2002 (JP) .......................... P. 2002-223234
Jul. 31, 2002 (JP) .......................... P. 2002-223386

(51) Int. Cl.
*G03F 7/004* (2006.01)

(52) U.S. Cl. ................................ 430/270.1; 430/287.1

(58) Field of Classification Search ............. 430/270.1, 430/287.1, 176
See application file for complete search history.

(56) References Cited

U.S. PATENT DOCUMENTS

| 6,548,219 | B2 * | 4/2003 | Ito et al. .................... 430/270.1 |
| 6,710,148 | B2 * | 3/2004 | Harada et al. ............... 526/245 |
| 6,790,579 | B1 * | 9/2004 | Goodall et al. .............. 430/170 |
| 6,864,037 | B2 * | 3/2005 | Hatakeyama et al. ..... 430/270.1 |

FOREIGN PATENT DOCUMENTS

| EP | 1203659 A2 * | 5/2002 |
| JP | 04050850 A * | 2/1992 |
| JP | 2003005372 A * | 1/2003 |
| WO | WO 00/17712 A1 | 3/2000 |

OTHER PUBLICATIONS

English language abstract of JP 04-50850.*
English language abstract of JP 2003-005372.*
English language translation of JP 04-050850.*
T. Fujigaya et al., A New Photoresist Material for 157 nm Lithography-2, J. Photopolym. Sci. Technol., (2002) vol. 15, No. 4, pp. 643-654.
R.R. Kunz et al., Outlook for 157-nm resist design, Proc. SPIE vol. 3678 (1999) pp. 12-23.
Dirk Schmaljohann et al., Design Strategies for 157 nm Single-Layer Photoresists: Lithographic Evaluation of a Poly($\alpha$-trifluoromethyl vinyl alcohol) Copolymer, in Advances in Resist Technology and Processing XVII, Francis M. Houlihan, Editor, Proceedings of SPIE vol. 3999 (2000), pp. 330-334.
Michael K. Crawford et al., New Materials for 157 nm Photoresists: Characterization and Properties, in Advances in Resist Technology and Processing XVII, Francis M. Houlihan, Editor, Proceedings of SPIE vol. 3999 (2000), pp. 357-364.
Kyle Patterson et al., Polymers for 157 nm Photoresist Applications: A Program Report, in Advances in Resist Technology and Processing XVII, Francis M. Houlihan, Editor, Proceedings of SPIE vol. 3999 (2000), pp. 365-374.

* cited by examiner

*Primary Examiner*—Amanda Walke
(74) *Attorney, Agent, or Firm*—Sughrue Mion, PLLC

(57) ABSTRACT

A positive resist composition comprising:
(A1) a resin containing at least one type of repeating unit represented by the specific formula and additionally containing at least one type of repeating unit represented by the specific formula, which increases the solubility in an alkali developing solution by the action of an acid, and
(B) a compound which is capable of generating an acid by the action of actinic ray or radiation.

16 Claims, No Drawings

POSITIVE RESIST COMPOSITION

FIELD OF THE INVENTION

The present invention relates to a positive resist composition preferable for use in the microlithography process for producing super LSI and high-capacity microchip and for use in other photofabrication processes. More specifically, the invention relates to a positive resist composition capable for fabricating highly fabricated precision patterns using vacuum ultraviolet ray of 160 nm or less.

BACKGROUND OF THE INVENTION

Integrated circuits have increasing been made at higher integration levels. For the production of semiconductor substrates for super LSI and the like, it is now required to fabricate ultra super fine patterns of a line width of quarter-micron or less. As one of approaches for making such super fine patterns, a method has been known for modifying the wavelength of exposure light sources for use in resist patterning into shorter wavelength.

For the production of a semiconductor device up to an integration level of 64 megabits, so far, the i beam (365 nm) from high pressure mercury arc lamp has been used as a light source. Numerous compositions including novolak resin and naphthoquinone diazide compounds as photosensitive materials have been developed for the positive resist corresponding to the light source and have successfully achieved great results in the processing of a line width of about 0.3 μm. For the production of a semiconductor device at an integration level up to 256 megabits or more, further, KrF excimer laser (248 nm) in place of the i beam has been used as an exposure light source.

For the purpose of producing semiconductor at an integration level of 1 gigabits or more, still further, the use of ArF excimer laser (193 nm) as a light source of shorter wavelength together with the use of F2 excimer laser (157 nm) for the fabrication of patterns of 0.1 μm or less has been investigated recently.

Following the modification of the wavelengths of these light sources into shorter wavelength, constituent components of resist materials and the structures of such compounds have been changed dramatically.

As a resist composition for exposure to KrF excimer laser, so called chemical amplification resist has now been developed, where a resin with the essential backbone poly(hydroxystyrene) with small absorption in the 248-nm zone, as protected with acid decomposable groups, is used as the main ingredient, in combination with compounds generating acids under irradiation of far ultraviolet ray (optical acid generators).

Further, resists of chemical amplification type have been developed as resist compositions for exposure to ArF excimer laser (193 nm) alike, where acid decomposable resin with an alicyclic structure with no absorption at 193 nm is introduced in the main chain or side chain of a polymer.

It is revealed that even the alicyclic type resin has such large absorption in a region around 157 nm for $F_2$ excimer laser beam (157 nm) that the alicyclic type resin is unsatisfactory for obtaining an intended pattern of 0.1 μm or less.

In contrast, Proc. SPIE., Vol. 3678, p. 13 (1999) reports that a resin introduced with fluorine atom (perfluoro structure) has sufficient transparency at 157 nm, while the structures of the effective fluorine resins are proposed in Proc. SPIE., Vol. 3999, p. 330 (2000); ibid., p. 357 (2000); ibid., p. 365 (2000); and WO-00/17712. Resist compositions containing fluorine-containing resins have been investigated so far.

Additionally, J. Photopolym. Sci. Technol., Vol. 15, No. 4, p. 643 discloses a resin for exposure to F2 excimer laser beam, which is prepared by copolymerization of vinyl sulfonate with a styrene monomer with fluorine atom.

However, these resists cannot satisfactorily exert various performances such as transparency at 157 nm, sensitivity, resolution, contact potency to developers and the like.

Further, resist compositions of related art, which contain fluorine resins for exposure to F2 excimer laser beam, are problematic in terms of line edge roughness, development defects, development residue (scum) and the like. Therefore, it has been desired that these problems may be overcome.

The term "line edge roughness" means that the edge in the interface between the line pattern on resist and the substrate is in shapes irregularly deforming along the direction vertical to the line direction, which is ascribed to the characteristic profile of the resist. When the pattern is observed directly overhead, it is observed that the edge has protrusions and recesses (in about ± several nm to several tens nm). Because the protrusions and recesses are transferred onto the substrate at the etching process, the protrusions and recesses when they are large cause poor electric properties, leading to the reduction of the yield.

SUMMARY OF THE INVENTION

It is an object of the invention to provide a positive resist composition preferable for use in an exposure light source of 160 nm or less, especially $F_2$ excimer laser beam (157 nm). Specifically, it is an object of the invention to provide a positive resist composition with sufficient transparency when a light source of 157 nm is used.

It is an additional object of the invention to provide a positive resist composition with sufficient transparency when a light source of 157 nm is used, with high sensitivity and high resolution, and with great contact potency to developing solution.

It is a still additional object of the invention to provide a positive resist composition with sufficient transparency when a light source of 157 nm is used, and with less line edge roughness, development defects and scum.

The present inventors made investigations, taking account of the various properties described above. Consequently, the inventors found that the objects of the invention could be attained by the following specific composition. Thus, the inventors achieved the invention.

The invention has the following constitutions.

(1) A positive resist composition comprising:

(A1) a resin containing at least one type of repeating unit represented by the following formula (I) or (II) and additionally containing at least one type of repeating unit represented by the following formulas (IA) to (VIA), which increases the solubility in an alkali developing solution by the action of an acid, and (B) a compound which is capable of generating an acid by irradiation of actinic ray or radiation:

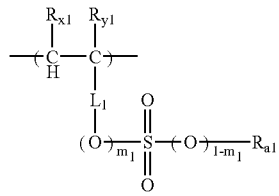
(I)

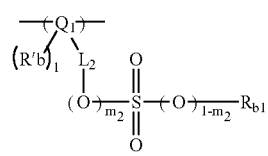
(II)

wherein $R_{x1}$ and $R_{y1}$ each independently represents a hydrogen atom, a halogen atom, a cyano group, or an alkyl group which may optionally have a substituent, $L_1$ represents a divalent binding group, $m_1$ and $m_2$ represent 0 or 1, $R_{a1}$ and $R_{b1}$ represents an alkyl group which may optionally have a substituent, an aryl group which may optionally have a substituent, or an aralkyl group which may optionally have a substituent, $Q_1$ represents an alicyclic hydrocarbon group, Rb' represents a hydrogen atom, an organic group or a halogen atom, l represents an integer of 0 to 3, $L_2$ represents single bond or a divalent binding group):

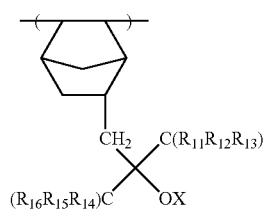
(IA)

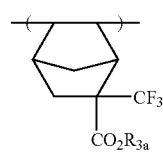
(IIA)

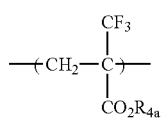
(IIIA)

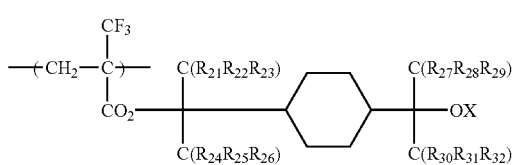
(IVA)

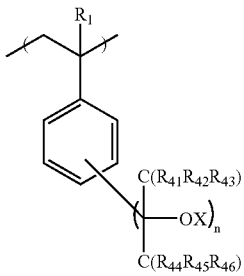
(VA)

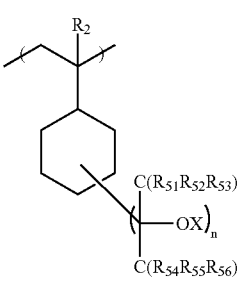
(VIA)

wherein $R_1$ and $R_2$ represent a hydrogen atom, a halogen atom, a cyano group or a trifluoromethyl group, X represents a group decomposable by the action of an acid, $R_{3a}$ and $R_{4a}$ represent a group decomposable by the action of an acid, $R_{11}$ to $R_{16}$, $R_{21}$ to $R_{32}$, $R_{41}$ to $R_{46}$, and $R_{51}$ to $R_{56}$ each independently represents a hydrogen atom, a fluorine atom, or an alkyl group which may optionally have a substituent, provided that at least one of $R_{11}$ to $R_{16}$, at least one of $R_{21}$ to $R_{32}$, at least one of $R_{41}$ to $R_{46}$, or at least one of $R_{51}$ to $R_{56}$ is a fluorine atom, n represents an integer of 1 to 5.

(2) The positive resist composition according to the above (1), wherein $L_1$ in the formula (I) is a phenylene group.

(3) The positive resist composition according to the above (1), wherein $Q_1$ in the formula (II) is a norbornene residue.

(4) The positive resist composition according to the above (1), wherein $L_1$ in the formula (I) or $L_2$ in the formula (II) has a carbonyl group.

(5) The positive resist composition according to the above (1), wherein the resin (A1) has at least one type of repeating unit selected from the group consisting of repeating units represented by the following formulae (IB), (IVB), (VB) and (VIB):

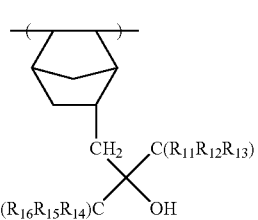
(IB)

-continued

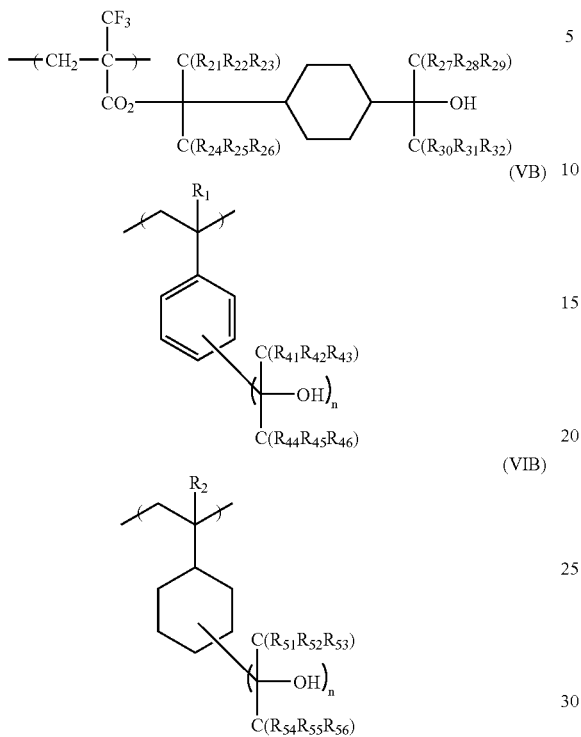

wherein $R_1$ and $R_2$ represent a hydrogen atom, a halogen atom, a cyano group or a trifluoromethyl group, $R_{11}$ to $R_{16}$, $R_{21}$ to $R_{32}$, $R_{41}$ to $R_{46}$, and $R_{51}$ to $R_{56}$ each independently represents a hydrogen atom, a fluorine atom, or an alkyl group which may optionally have a substituent, provided that at least one of $R_{11}$ to $R_{16}$, at least one of $R_{21}$ to $R_{32}$, at least one of $R_{41}$ to $R_{46}$, or at least one of $R_{51}$ to $R_{56}$ is a fluorine atom, n represents an integer of 1 to 5.

(6) A positive resist composition comprising:

(A2) a resin containing a repeating unit represented by the following formula (I') which increases the solubility in an alkali developing solution by the action of an acid, and (B) a compound which is capable of generating an acid by irradiation of actinic ray or radiation:

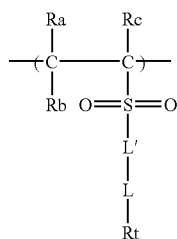
(I')

wherein Ra, Rb and Rc each independently represents a hydrogen atom, a fluorine atom or a fluorinated alkyl group, L represents a single bond or a binding group, Rt represents an alkyl group, an alicyclic alkyl group, an aryl group or an aralkyl group, and L' represents a single bond or an oxygen atom.

(7) The positive resist composition according to the above (6), wherein the repeating unit is a repeating unit represented by the following formula (I'a):

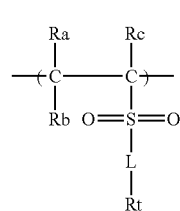
(I'a)

wherein Ra, Rb and Rc each independently represents a hydrogen atom, a fluorine atom or a fluorinated alkyl group, L represents a single bond or a binding group, and Rt represents an alkyl group, an alicyclic alkyl group, an aryl group or an aralkyl group.

(8) The positive resist composition according to the above (6), wherein the repeating unit is a repeating unit represented by the following formula (I'b):

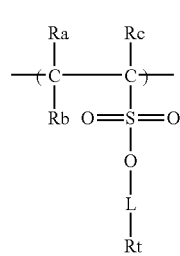
(I'b)

wherein Ra, Rb and Rc each independently represents a hydrogen atom, a fluorine atom or a fluorinated alkyl group, L represents a single bond or a binding group, and Rt represents an alkyl group, an alicyclic alkyl group, an aryl group or an aralkyl group.

(9) The positive resist composition according to the above (6), wherein the resin (A2) contains at least one type of repeating unit selected from the group consisting of repeating units represented by the formulae (II') to (IV):

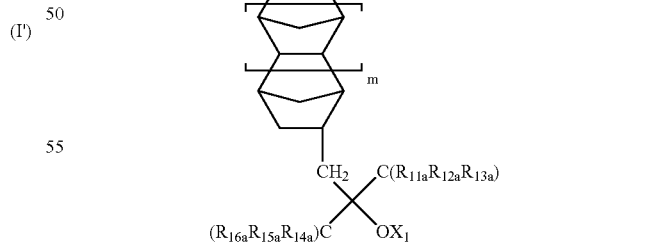
(II')

wherein $R_{11a}$ to $R_{16a}$ each independently represents a hydrogen atom, a fluorine atom or a fluorinated alkyl group, provided that at least one of $R_{11a}$ to $R_{16a}$ is not a hydrogen atom, $x_1$ represents a hydrogen atom or a group decomposable by the action of an acid, and m represents 0 or 1:

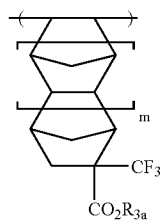

(III)

wherein $R_{3a}$ represents a hydrogen atom or a group decomposable by the action of an acid, and m represents 0 or 1:

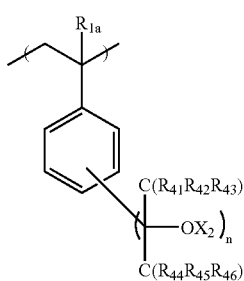

(IV)

wherein $R_{1a}$ represents a hydrogen atom, a fluorine atom, a chlorine atom, a bromine atom, a cyano group or a trifluoromethyl group, $R_{41}$ to $R_{46}$ each independently represents a hydrogen atom, a fluorine atom or a fluorinated alkyl group, provided that at least one of $R_{41}$ to $R_{46}$ is not a hydrogen atom, $X_2$ represents a hydrogen atom or a group decomposable by the action of an acid, n represents an integer of 2 to 5, provided that $R_{41}$ to $R_{46}$ and $X_2$ may be the same or different when they each exists in a number of 2 or more.

(10) The positive resist composition according to the above (6), wherein the resin (A2) comprises at least one type of repeating unit formed with vinyl ether compounds.

(11) The positive resist composition according to the above (6), wherein the resin (A2) comprises at least one type of repeating unit formed with a α-halogenated acrylate ester or a α-trihalogenated methacrylate ester.

(12) The positive resist composition according to the above (6), wherein the resin (A2) has a weight average molecular weight of 3,000 to 30,000 and a molecular weight dispersion degree of 1.1 to 1.5.

(13) The positive resist composition according to the above (6), wherein the resin (A2) is obtained by a procedure of removing low molecular components from the polymer resulting from radical polymerization.

(14) The positive resist composition according to the above (6), wherein the resin (A2) is obtained by continuous or intermittent addition of monomers during the radical polymerization of monomers in the presence of radical polymerization initiators.

(15) The positive resist composition according to the above (1) or (6), wherein the compound (B) comprises a compound (B1) which is capable of generating an organic sulfonic acid by irradiation of actinic ray or radiation.

(16) The positive resist composition according to the above (1) or (6), wherein the compound (B1) comprises:

a compound capable of generating an organic sulfonic acid by irradiation of actinic ray or radiation, in which the organic sulfonic acid is substituted with at least one fluorine atom; and a compound capable of generating an organic sulfonic acid by irradiation of actinic ray or radiation, in which the organic sulfonic acid is not substituted with a fluorine atom.

(17) The positive resist composition according to the above (1) or (6), wherein the compound (B) comprises a compound (B2) capable of generating a carboxylic acid by irradiation of actinic ray or radiation.

(18) The positive resist composition according to the above (1) or (6), further comprising (X) a non-polymer type dissolution inhibitor.

(19) The positive resist composition according to the above (1) or (6), further comprising a mixture solvent of propylene glycol monoalkyl ether acetates with propylene glycol monoalkyl ethers or alkyl lactates.

DETAILED DESCRIPTION OF THE INVENTION

The invention is now described in detail hereinbelow.

[1] (A1) The Resin of the Invention

The positive resist composition of the invention contains a resin containing at least one type of repeating unit represented by the formula (I) or (II) and additionally contains at least one type of repeating unit represented by formulas (IA) to (VIA), which increases the solubility in an alkali developing solution by the action of an acid [also referred to as "Resin (A1)"].

In the formulae (I) to (II), $R_{x1}$ and $R_{y1}$ each independently represents a hydrogen atom, a halogen atom, a cyano group, or an alkyl group which may optionally have a substituent. $L_1$ represents a divalent binding group. $m_1$ and $m_2$ represent 0 or 1. $R_{a1}$ and $R_{b1}$ represent an alkyl group which may optionally have a substituent, an aryl group which may optionally have a substituent, or an aralkyl group which may optionally have a substituent. $Q_1$ represents an alicyclic hydrocarbon group. Rb' represents a hydrogen atom, an organic group or a halogen atom. 1 represents an integer of 0 to 3, and $L_2$ represents a single bond or a divalent binding group.

The alkyl group as $R_{x1}$ and $R_{y1}$ may be substituted with a halogen atom such as fluorine atom and a cyano group, and preferably includes alkyl groups having one to 3 carbon atoms, for example a methyl group and a trifluoromethyl group.

The halogen atom as $R_{x1}$ and $R_{y1}$ includes a fluorine atom, a chlorine atom, a bromine atom and an iodine atom.

The divalent binding group as $L_1$ and $L_2$ includes alkylene groups, cycloalkylene groups, alkenylene groups or arylene groups, which are divalent and may optionally have a substituent, or —O—CO—$R_{22a}$—, —CO—O—$R_{22b}$—, —CO—N($R_{22c}$)—$R_{22d}$—.

$R_{22a}$, $R_{22b}$ and $R_{22d}$ may be the same or different and represent a single bond, alkylene groups, cycloalkylene groups, alkenylene groups or arylene groups, which are divalent and may have an ether group, an ester group, an amide group, a urethane group or a ureido group. $R_{22c}$ represents a hydrogen atom or an alkyl group, a cycloalkyl group, an aralkyl group or an aryl group, which may optionally have a substituent.

The alkylene groups include linear or branched alkylene groups having one to 8 carbon atoms, for example a methylene group, an ethylene group, a propylene group, a butylene group, a hexylene group, and an octylene group.

The alkenylene groups preferably include alkenylene groups having 2 to 6 carbon atoms, which may optionally have a substituent, for example an ethenylene group, a propenylene group and a butenylene group.

The arylene group preferably includes arylene groups having 6 to 15 carbon atoms, which may optionally have a substituent, for example a phenylene group, a tolylene group and a naphthylene group.

The alkyl group as $R_{a1}$ and $R_{b1}$ includes linear, branched and cyclic alkyl groups having generally one to 20 carbon atoms, preferably one to 15 carbon atoms, more preferably one to 10 carbon atoms. The linear and branched alkyl groups preferably include a methyl group, an ethyl group, a propyl group, a n-butyl group, a sec-butyl group, a hexyl group, a 2-ethylhexyl group and an octyl group.

The cyclic alkyl groups may be monocyclic or polycyclic. The monocyclic cycloalkyl group preferably includes for example a cyclopropyl group, a cyclopentyl group, a cyclohexyl group, a cyclobutyl group and a cyclooctyl group. The polycyclic cycloalkyl group preferably includes for example an adamantyl group, a norbornyl group, an isobornyl group, a camphornyl group, a dicyclopentyl group, a α-pinenyl group, a tricyclodecanyl group, a tetracyclododecyl group, and a androstannyl group. The cycloalkyl group includes cycloalkyl groups wherein a part of the carbon atoms in the cycloalkyl groups is substituted with a hetero atom such as an oxygen atom.

The aryl group as $R_{a1}$ and $R_{b1}$ includes aryl groups having generally one to 20 carbon atoms, preferably one to 15 carbon atoms, more preferably one to 10 carbon atoms and preferably includes for example a phenyl group, a tolyl group, a dimethylphenyl group, a 2,4,6-trimethylphenyl group, a naphthyl group, a anthryl group, and a 9,10-dimethoxyanthryl group.

The aralkyl group as $R_{a1}$ and $R_{b1}$ includes an aralkyl groups having generally one to 20 carbon atoms, preferably one to 15 carbon atoms, more preferably one to 10 carbon atoms, and preferably includes, for example, a benzyl group, a phenethyl group and a naphthylmethyl group.

The examples of a substituent, which $R_{a1}$ and $R_{b1}$ may optionally have, include a hydroxyl group, an alkoxyl group, a halogen atom and a cyano group.

The alicyclic hydrocarbon group as $Q_1$ is a group wherein at least one of the atoms composing the alicyclic ring is contained in the main chain of the resin and exists therein and another atom composing the alicyclic ring is bound to $L_2$.

The alicyclic hydrocarbon group as $Q_1$ may be monocyclic or polycyclic. The monocyclic type includes alicyclic hydrocarbon groups having 3 to 8 carbon atoms and the examples thereof preferably includes a cyclopropyl group, a cyclopentyl group, a cyclohexyl group, a cycloheptyl group and a cyclooctyl group.

The polycyclic type includes an alicyclic hydrocarbon groups having 6 to 20 carbon atoms and the examples thereof include for an adamantyl group, a norbornyl group, an isobornyl group, a camphornyl group, a dicyclopentyl group, a α-pinenyl group, a tricyclodecanyl group, a tetracyclododecyl group, and a androstannyl group. The cycloalkyl group includes cycloalkyl groups where a part of the carbon atoms in the cycloalkyl groups is substituted with a hetero atom such as an oxygen atom.

The organic group as Rb' includes a linear or branched or cyclic alkyl group, an aryl group, and an aralkyl group, having carbon atoms up to 10, an ester group having total carbon atoms up to 11, an amide group, an alkoxyl group, and a cyano group. The substituents include a halogen atom, a hydroxyl group, an alkoxyl group and a cyano group. These substituents may be bonded to an appropriate carbon atom in the organic group. Preferable examples of Rb' include a hydrogen atom, a fluorine atom, a chlorine atom, $CF_3$, $OCH_3$, CN, $CH_3$, and $C_2H_5$.

Preferably, $Q_1$ includes a norbornene residue, $L_1$ includes a divalent binding group such as a phenylene group and a ester group, $L_2$ includes a divalent binding group having a carbonyl group such as an ester group, $R_{x1}$ includes a hydrogen atom and $R_{y1}$ includes a hydrogen atom, a methyl group or a trifluoromethyl group.

Specific examples of the repeating units represented by the formulae (I) and (II) are listed below. However, the invention is not limited to them.

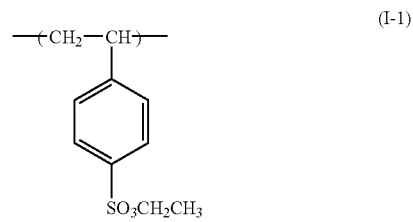

(I-1)

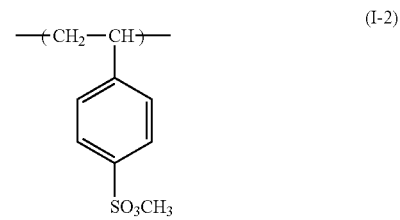

(I-2)

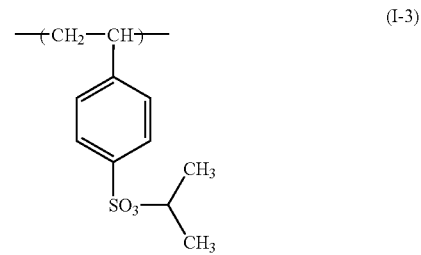

(I-3)

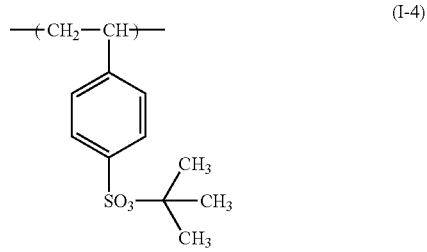

(I-4)

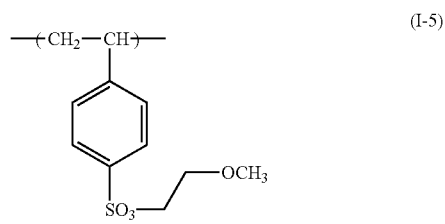

(I-5)

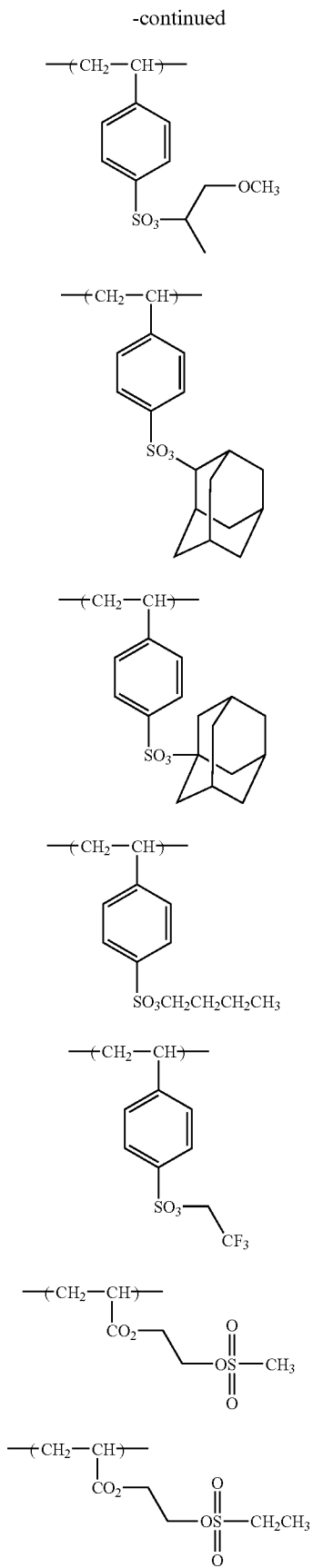
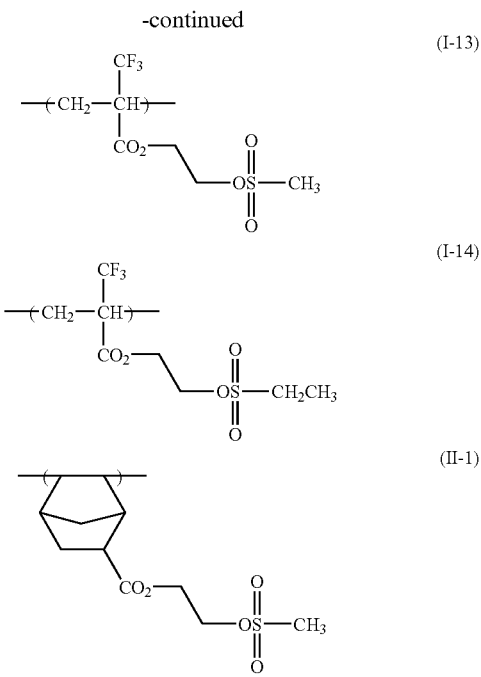

In the formulas (IA) to (VIA), $R_1$ and $R_2$ represent a hydrogen atom, a halogen atom, a cyano group or a trifluoromethyl group. X represents a group decomposable by the action of an acid. $R_{3a}$ and $R_{4a}$ represent a group decomposable by the action of an acid.

$R_{11}$ to $R_{16}$, $R_{21}$ to $R_{32}$, $R_{41}$ to $R_{46}$, and $R_{51}$ to $R_{56}$ each independently represents a hydrogen atom, a fluorine atom, or an alkyl group which may optionally have a substituent, provided that at least one of $R_{11}$ to $R_{16}$, at least one of $R_{21}$ to $R_{32}$, at least one of $R_{41}$ to $R_{46}$, or at least one of $R_{51}$ to $R_{56}$ is a fluorine atom. n represents an integer of 1 to 5.

The group decomposable by the action of an acid (acid decomposable group) as X includes any group decomposable by the action of an acid and preferable examples thereof includes a group represented as —C($R_{14a}$)($R_{15a}$)(O$R_{16a}$), —C($R_{11a}$)($R_{12a}$)($R_{13a}$) and —CO—OC($R_{11a}$)($R_{12a}$)($R_{13a}$).

The group decomposable by the action of an acid (acid decomposable group) as $R_{3a}$ and $R_{3b}$ includes any group decomposable by the action of an acid and preferably includes for example groups represented as —C($R_{14a}$)($R_{15a}$) (O$R_{16a}$) and —C($R_{11a}$)($R_{12a}$)($R_{13a}$).

($R_{11a}$ to $R_{13a}$ each independently represents an alkyl group which may optionally have a substituent, an alkenyl group which may optionally have a substituent, an aralkyl group which may optionally have a substituent, or an aryl group which may optionally have a substituent.

$R_{14a}$ and $R_{14b}$ each independently represents a hydrogen atom or an alkyl group which may optionally have a substituent. $R_{16a}$ represents an alkyl group which may optionally have a substituent, an alkenyl group which may optionally have a substituent, an aralkyl group which may optionally have a substituent, or an aryl group which may optionally a substituent. Two of $R_{11a}$, $R_{12a}$ and $R_{13a}$ or two of $R_{14a}$, $R_{15a}$ and $R_{16a}$ may be bonded to each other to form a ring.

The alkyl group, aralkyl group and aryl group in the acid decomposable group may optionally have a substituent and include the same alkyl groups, aralkyl groups and aryl groups as described for Ra1 in the formula (I).

The alkenyl group includes a linear or branched alkenyl group having generally 2 to 6 carbon atoms, preferably 2 to 4 carbon atoms, which may optionally have a substituent. Exemples thereof include an ethenyl group and a 2-methylethenyl group.

The examples of a substituent, which the alkenyl group may optionally have, include a halogen atom, a hydroxyl group, an alkoxyl group and a cyano group. The halogen atom includes for example a fluorine atom, a chlorine atom, and a bromine atom. The alkoxyl group includes a linear, branched or cyclic alkoxyl group having generally one to 10 carbon atoms, preferably one to 6 carbon atoms. Specifically, the alkoxyl group includes for example a methoxy group, an ethoxy group, a propoxy group, a o-propoxy group, a butoxy group, an i-butoxy group and a t-butoxy group.

The alkyl groups as $R_{11}$ to $R_{16}$, $R_{21}$ to $R_{35}$, $R_{41}$ to $R_{46}$, and $R_{51}$ to $R_{56}$ include the same alkyl groups as described for $R_{a1}$ in the formula (I).

Specific examples of the repeating units represented by the formulae (IA) to (VIA) are shown below. However, the invention is not limited to them.

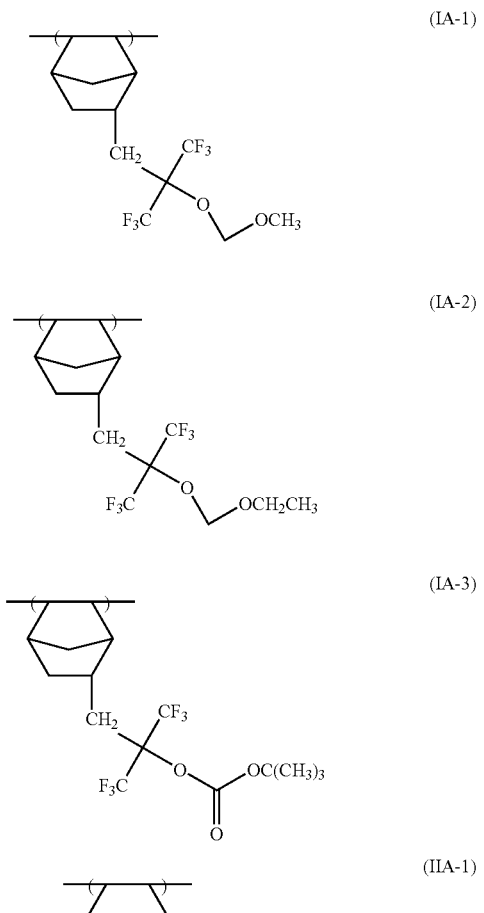

(IA-1)

(IA-2)

(IA-3)

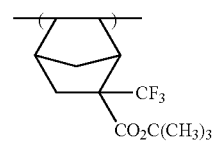

(IIA-1)

-continued

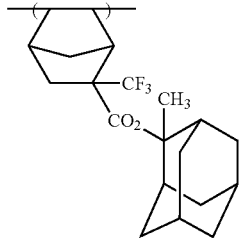

(IIA-2)

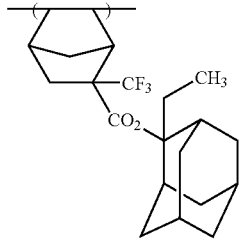

(IIA-3)

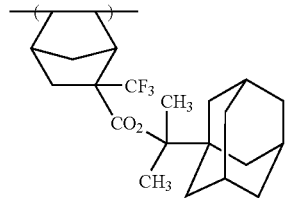

(IIA-4)

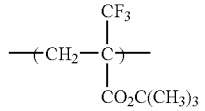

(IIIA-1)

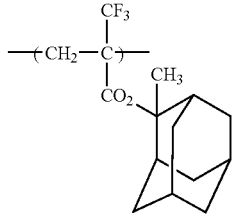

(IIIA-2)

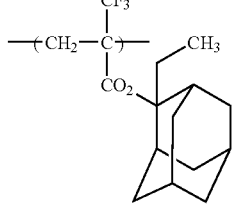

(IIIA-3)

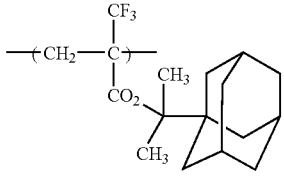

(IIIA-4)

(IVA-1)
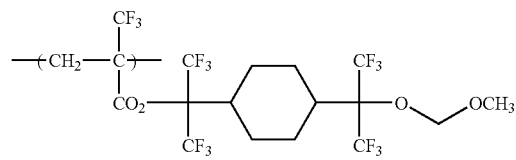
(IVA-2)
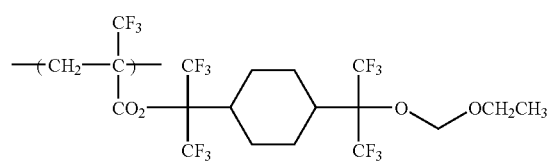
(IVA-3)
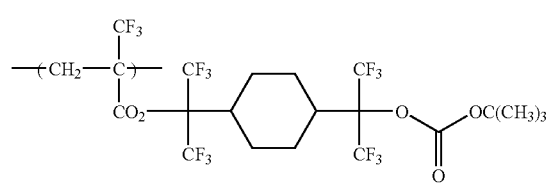
(VA-1)
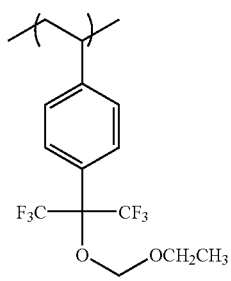
(VA-2)
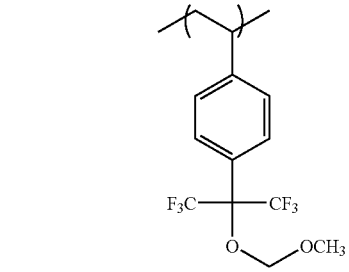
(VA-3)
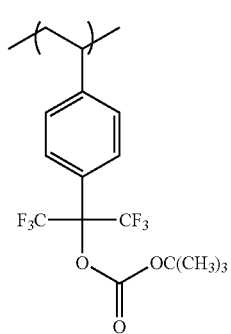
(VA-4)
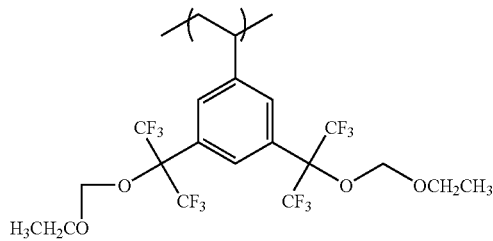
(VA-5)
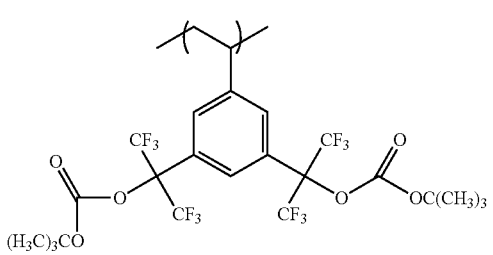
(VA-6)
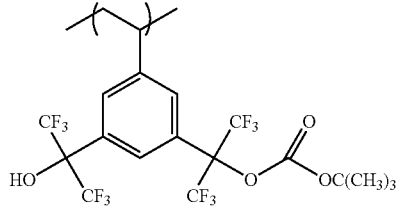
(VIA-1)
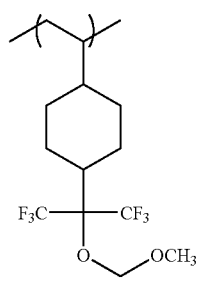
(VIA-2)
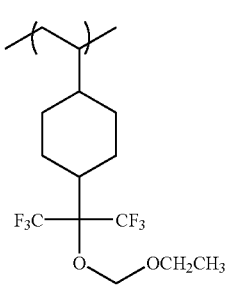

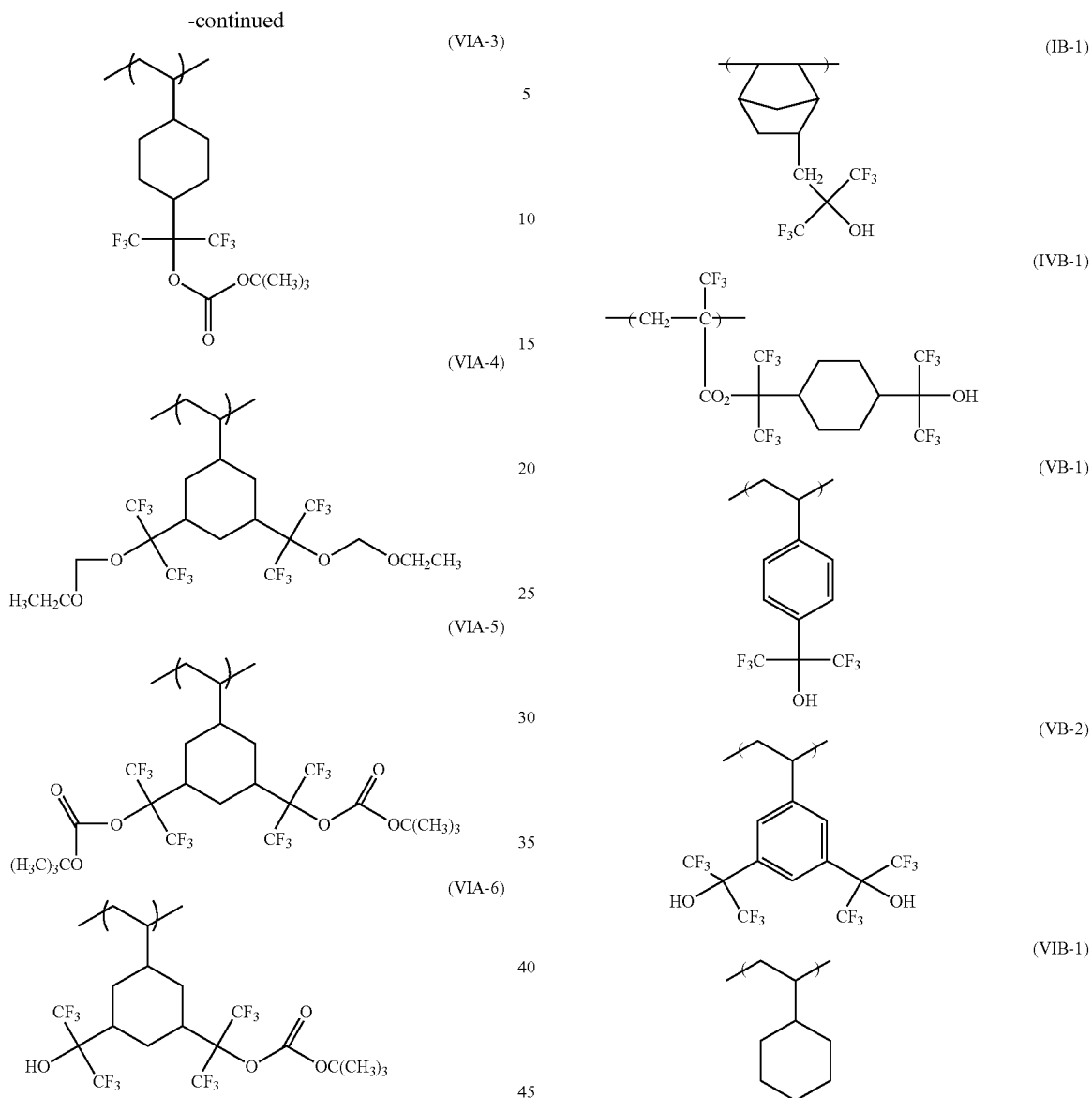

The resin (A1) may further contain at least one type of repeating unit selected from the group consisting of repeating units represented by the formulae (IB), (IVB), (VB) and (VIB).

In the general formulas (IB), (IVB), (VB) and (VIB), $R_1$ and $R_2$ represent a hydrogen atom, a halogen atom, a cyano group or a trifluoromethyl group. $R_{11}$ to $R_{16}$, $R_{21}$ to $R_{32}$, $R_{41}$ to $R_{46}$, and $R_{51}$ to $R_{56}$ each independently represents a hydrogen atom, a fluorine atom, or an alkyl group which may optionally have a substituent, provided that at least one of $R_{11}$ to $R_{16}$, at least one of $R_{21}$ to $R_{32}$, at least one of $R_{41}$ to $R_{46}$, or at least one of $R_{51}$ to $R_{56}$ is a fluorine atom. n represents an integer of 1 to 5.

The alkyl group as $R_{11}$ to $R_{16}$, $R_{21}$ to $R_{32}$, $R_{41}$ to $R_{46}$, and $R_{51}$ to $R_{56}$ includes the same alkyl groups as described for $R_{a1}$ in the formula (I).

Specific examples of the repeating units represented by the formulae (IB), (IVB), (VB) or (VIB) are shown below. However, the invention is not limited to them.

The content of the repeating unit represented by the formula (I) or (II) in the resin (A1) is generally 1 to 95 mol %, preferably 3 to 80 mol %, more preferably 5 to 70 mol %.

The content of the repeat unit represented by the formula (IA) to (VIA) in the resin (A1) is generally 1 to 90 mol %, preferably 3 to 80 mol %, more preferably 5 to 70 mol %.

The content of the repeating unit represented by the formula (IB), (IVB), (VB) or (VIB) in the resin (A1) is generally 1 to 70 mol %, preferably 3 to 60 mol %, more preferably 5 to 50 mol %.

Other than the repeating units described above, the resin (A1) may be copolymerized with other polymerizable monomers for the purpose of improving the performance of the resin.

The copolymerizable monomers for use include those described below. For example, the copolymerizable monomers are compounds with one addition-polymerizable unsaturated bond, as selected from acrylate esters, acrylamides, methacrylate esters, methacrylamides, aryl compounds, vinyl ethers, vinyl esters, styrenes, and crotonate esters.

The repeating units listed in the specific examples are used alone or in combination of plural such repeating units.

The resin (A1) containing the repeating units in accordance with the invention has a number average molecular weight of preferably 1,000 to 200,000, more preferably 3,000 to 200,000 and most preferably 3,000 to 50,000. The molecular weight distribution (dispersion degree) of the resin (A1) is 1 to 10, preferably 1 to 3, more preferably 1 to 2 and most preferably 1 to 1.7. A resin with a smaller molecular distribution level has greater coatability, sensitivity and contrast.

In accordance with the invention, a resin with a molecular weight of 1,000 or less is at a ratio of preferably 20% or less, more preferably 15% or less, still more preferably 10% or less. Additionally, the ratio of residual non-reacted monomers in the resin (A1) is preferably 10% or less, more preferably 7% or less and still more preferably 5% or less.

The amount of the resin (A1) to be added is generally 50 to 99.5% by weight, preferably 60 to 98% by weight, and more preferably 65 to 95% by weight based on a total solid content in the composition.

The resin (A1) can be synthetically prepared by general methods (for example, radical polymerization). For example, one general synthesis method includes a step of charging monomer species once in a reactor or in portions in a reactor in an intermediate course of reaction, a step of dissolving if necessary the monomer species in reaction solvents for example ethers such as tetrahydrofuran, 1,4-dioxane, and diisopropyl ether, ketones such as methyl ethyl ketone and methyl isobutyl ketone, esters such as ethyl acetate, solvents capable of dissolving various monomers such as propylene glycol monomethyl ether acetate described below, a subsequent step of initiating polymerization under heating if necessary in inert gas atmosphere such as nitrogen and argon, using a commercially available radical initiator (for example, azo-series initiators, peroxides, etc.). If desired, the initiator can be added additionally or added in portions. After the termination of the reaction, the resulting reaction mixture is charged in solvents, to recover a desired polymer by powdery or solid recovery methods. The concentration of the reaction solution is 20% by weight or more, preferably 30% by weight or more, more preferably 40% by weight or more. The reaction temperature is 10° C. to 150° C., preferably 30° C. to 120° C., more preferably 50 to 100° C. Some monomer can be synthetically prepared more preferably by anion polymerization. Polymerization methods are described in "Experimental Chemistry Lecture Series 28, Polymer synthesis", edited by Japan Chemical Association (issued by Maruzen) and "Experimental Chemistry Lecture Series 19, Polymer synthesis", edited by Japan Chemical Association (issued by Maruzen).

The monomer containing a sulfonate group, which corresponds to the repeating unit represented by the formula (I) or (II), can be synthetically prepared by general methods, by using a chlorosulfonyl group-containing monomer and alcohol, or by using a hydroxyl group-containing monomer and sulfonyl chloride.

[2] (A2) Resin Having a Repeating Unit Represented by the Formula (I'), which Increases the Solubility in Alkali Developing Solution by the Action of an Acid The positive resist composition of the invention contains a resin having a repeating unit represented by the formula (I'), which increases the solubility in alkali developing solution by the action of an acid (sometimes referred to as "Resin (A2)" hereinbelow).

Ra, Rb and Rc each independently represents a hydrogen atom, a fluorine atom or a fluorinated alkyl group.

The fluorinated alkyl group as Ra, Rb and Rc means an alkyl group wherein at least one of the hydrogen atoms therein is fluorinated and includes preferably fluorinated alkyl groups having one to 6 carbon atoms, more preferably fluorinated alkyl groups having one to 3 carbon atoms. Specific examples of the fluorinated alkyl group include a trifluoromethyl group, a difluoromethyl group, a fluoromethyl group, a pentafluoroethyl group, a 2,2,2-trifluoroethyl group, a 2-fluoroethyl group, a 3,3,3-trifluoropropyl group, and a 3-fluoropropyl group. The fluorinated alkyl group is particularly preferably a trifluoromethyl group.

The fluorinated alkyl group as Ra, Rb and Rc may optionally have a substituent. The examples of a substituent include a chlorine atom, a bromine atom and an iodine atom.

L represents a single bond or a binding group, preferably single bond. The binding group as L preferably contains 20 or less carbon atoms and includes for example —O—, —CO—, —COO—, —OCO—, —CONH—, —NHCO—, —OCONH—, —NHCOO—, —S—, alkylene group (preferably having one to 15 carbon atoms), arylene group (preferably having 5 to 15 carbon atoms), or combinations of two or more thereof.

Rt represents an alkyl group, an alicyclic alkyl group, an aryl group or an aralkyl group. The individual groups of an alkyl group, an alicyclic alkyl group, an aryl group and an aralkyl group as Rt include these groups containing a substituent.

The alkyl group as Rt includes a linear or branched alkyl group having one to 14 carbon atoms, for example a methyl group, an ethyl group, a n-propyl group, an i-propyl group, a n-butyl group, an i-butyl group, a t-butyl group, an amyl group, an i-amyl group, a t-amyl group, a n-hexyl group, a n-octyl group, and a 2-ethylhexyl group. Preferably, the alkyl group is a methyl group or an ethyl group.

The alicyclic alkyl group preferably includes an alicyclic alkyl group having 3 to 30 carbon atoms, for example a cyclopropyl group, a cyclopentyl group, a cyclohexyl group, a cycloheptyl group, a cyclooctyl group, a cyclodecanyl group, a cyclododecanyl group, a tricyclodecanyl group, an adamantyl group, a noradamantyl group, a norbornyl group. These alicyclic alkyl groups may contain an unsaturated bond.

The aryl group preferably includes an aryl group having 6 to 15 carbon atoms, for example a phenyl group and a naphthyl group.

The aralkyl group preferably includes an aralkyl group having 7 to 12 carbon atoms, for example a benzyl group and a phenethyl group.

The examples of a substituent, which the alkyl group, alicyclic alkyl group, aryl group and aralkyl group as Rt may have, include an alkyl group having one to 6 carbon atoms, a halogenated alkyl group having one to 6 carbon atoms, a halogen atom, a cyano group, a nitro group, and a group decomposable by the action of an acid to generate a carboxylic acid. The substituents are preferably a group decomposable by the action of an acid to generate a carboxylic acid. The group decomposable by the action of an acid to generate a carboxylic acid include —COOR$_{3a}$ group (herein, R$_{3a}$ represents a group decomposable by the action of an acid) in the formula (III) below. Further, L' represents a single bond or an oxygen atom.

The repeating unit represented by the formula (I') above is preferably a repeat unit represented by the formula (I'a) or (I'b).

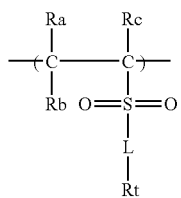
(I'a)

In the formula (I'a), Ra, Rb and Rc each independently represents a hydrogen atom, a fluorine atom or a fluorinated alkyl group. L represents a single bond or a binding group. Rt represents an alkyl group, an alicyclic alkyl group, an aryl group or an aralkyl group.

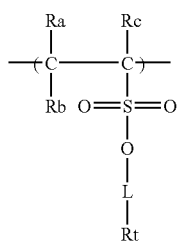
(I'b)

In the formula (I'b), Ra, Rb and Rc each independently represents a hydrogen atom, a fluorine atom or a fluorinated alkyl group. L represents a single bond or a binding group. Rt represents an alkyl group, an alicyclic alkyl group, an aryl group or an aralkyl group.

Ra, Rb, Rc, L and Rt have the same meanings as in the formula (I') as described above.

Specific examples a monomer corresponding to the repeating unit represented by the formula (I'b) are shown below. However, the general formula (I'a) is not limited to them.

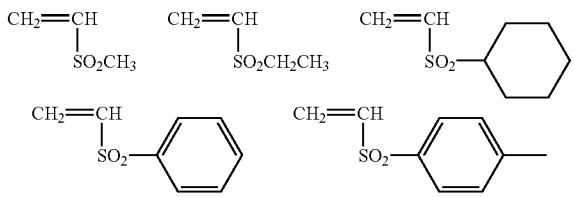

Specific examples of a monomer corresponding to the repeating unit represented by the formula (I'b) are shown below. However, the invention is not limited to them.

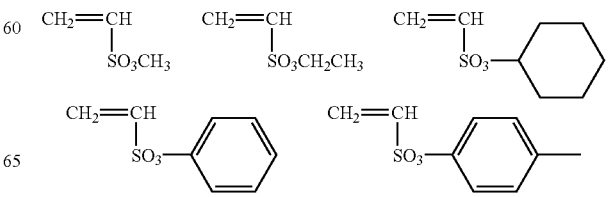

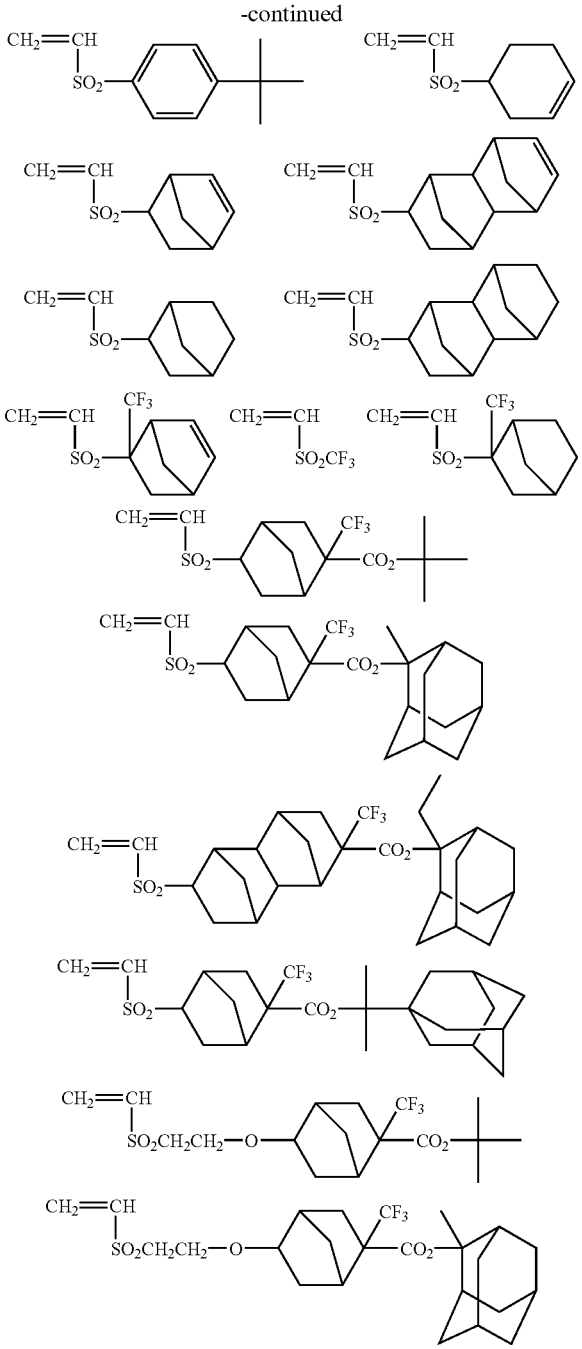

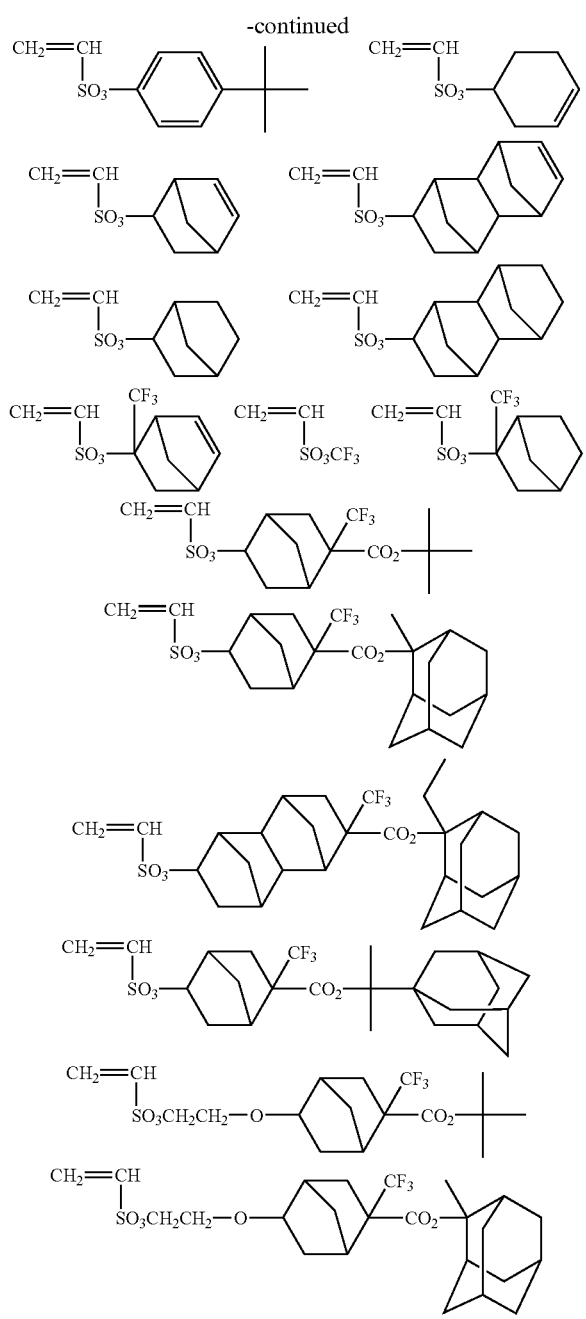

The resin (A2) contains at least one type of repeating unit selected from the group consisting of repeating units represented by the formulae (II') to (IV).

In the formula (II'), $R_{11a}$ to $R_{16a}$ each independently represents a hydrogen atom, a fluorine atom or a fluorinated alkyl group, provided that at least one of $R_{11a}$ to $R_{16a}$ is not a hydrogen atom. $X_1$ represents a hydrogen atom or a group decomposable by the action of an acid. m represents 0 or 1.

The fluorinated alkyl group as $R_{11a}$ to $R_{16a}$ includes the same fluorinated alkyl groups as Ra in the formula (I')

The group decomposable by the action of an acid as $X_1$ (also referred to as "acid decomposable group" hereinbelow) includes for example $-C(R_{36})(R_{37})(R_{38})$, $-C(R_{36})(R_{37})(OR_{39})$, $-COO-C(R_{36})(R_{37})(R_{38})$, $-C(R_{01})(R_{02})(OR_{39})$, and $-C(R_{01})(R_{02})COO-C(R_{36})(R_{37})(R_{38})$.

$R_{36}$ to $R_{39}$ each independently represents an alkyl group which may optionally have a substituent, a cycloalkyl group which may optionally have a substituent, an alkenyl group which may optionally have a substituent, an aralkyl group which may optionally have a substituent, or an aryl group which may optionally have a substituent. $R_{36}$ and $R_{39}$ may be bonded to each other to form a ring.

$R_{01}$ and $R_{02}$ each independently represents a hydrogen atom, an alkyl group which may optionally have a substituent, a cycloalkyl group which may optionally have a substituent, an alkenyl group which may optionally have a substituent, an aralkyl group which may optionally have a substituent, or an aryl group which may optionally have a substituent.

The alkyl group as $R_{36}$ to $R_{39}$, $R_{01}$ and $R_{02}$ preferably includes an alkyl group having one to 8 carbon atoms, for example a methyl group, an ethyl group, a propyl group, a n-butyl group, a sec-butyl group, a hexyl group, a 2-ethylhexyl group and an octyl group.

The cycloalkyl group as $R_{36}$ to $R_{39}$, $R_{01}$ and $R_{02}$ may be monocyclic or polycyclic. The monocyclic cycloalkyl group preferably includes a monocyclic cycloalkyl group having 3 to 8 carbon atoms, for example a cyclopropyl group, a cyclopentyl group, a cyclohexyl group, a cyclobutyl group and a cyclooctyl group. The polycyclic cycloalkyl group preferably includes a polycyclic cycloalkyl group having 6 to 20 carbon atoms, for example an adamantyl group, a norbornyl group, an isobornyl group, a camphornyl group, a dicyclopentyl group, a α-pinenyl group, a tricyclodecanyl group, a tetracyclododecyl group, and an androstannyl group. A part of the carbon atoms in the cycloalkyl group may or may be substituted with a hetero atom such as an oxygen atom.

The aryl group as $R_{36}$ to $R_{39}$, $R_{01}$ and $R_{02}$ preferably includes an aryl group having 6 to 10 carbon atoms, for example a phenyl group, a tolyl group, a dimethylphenyl group, a 2,4,6-trimethylphenyl group, a naphthyl group, an anthryl group, and a 9,10-dimethoxyanthryl group.

The aralkyl group as $R_{36}$ to $R_{39}$, $R_{01}$ and $R_{02}$ preferably includes an aralkyl group having 7 to 12 carbon atoms, for example a benzyl group, a phenethyl group and a naphthylmethyl group.

The alkenyl group as $R_{36}$ to $R_{39}$, $R_{01}$ and $R_{02}$ preferably includes an alkenyl group having 2 to 8 carbon atoms, for example a vinyl group, an allyl group, a butenyl group, and a cyclohexenyl group.

The examples of a substituent, which $R_{36}$ to $R_{39}$, $R_{01}$ and $R_{02}$ may have, include an alkyl group, a cycloalkyl group, an aryl group, an amino group, an amido group, a ureido group, a urethane group, a hydroxyl group, a carboxyl group, a halogen atom, an alkoxyl group, a thioether group, an acyl groups, an acyloxy groups, an alkoxycarbonyl group, a cyano group and a nitro group.

Specific preferable examples of the acid decomposable group include an acetal group such as a 1-alkoxy-1-ethoxy group, a 1-alkoxy-1-methoxy group, and a tetrahydropyranyl group, a t-alkyloxycarbonyl group, an ethoxymethyl group, a methoxyethoxymethyl group, and a t-alkylcarbonylmethyl group.

Specific preferable examples of the repeating unit represented by the formula (II') are described below. However, the invention is not limited to them.

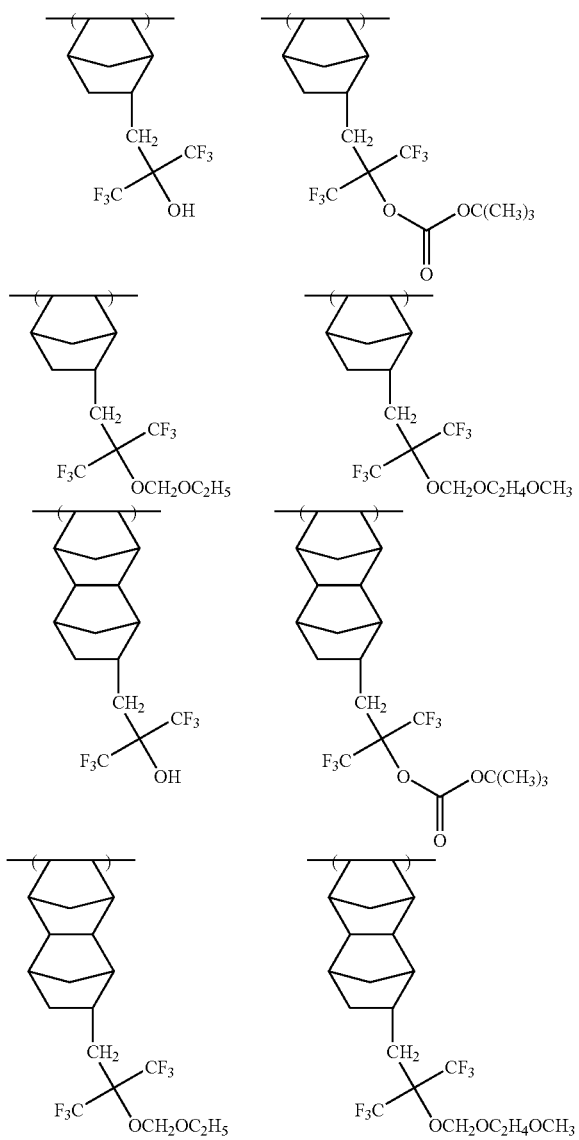

In the general formula (III), $R_{3a}$ represents a hydrogen atom or a group decomposable by the action of an acid. m represents 0 or 1.

The group decomposable by the action of an acid as $R_{3a}$ includes for example —$C(R_{36})(R_{37})(R_{38})$ and —$C(R_{36})(R_{37})(OR_{39})$.

$R_{36}$ to $R_{39}$ each independently represents an alkyl group which may optionally have a substituent, a cycloalkyl group which may optionally have a substituent, an alkenyl group which may optionally have a substituent, an aralkyl group which may optionally have a substituent, or an aryl group which may optionally have a substituent. At least two of $R_{36}$ to $R_{39}$ may be bonded to each other to form a ring.

The alkyl group as $R_{36}$ to $R_{39}$ preferably includes an alkyl group having one to 8 carbon atoms, for example a methyl group, an ethyl group, a propyl group, a n-butyl group, a sec-butyl group, a hexyl group, a 2-ethylhexyl group and an octyl group.

The cycloalkyl group as $R_{36}$ to $R_{39}$ may be monocyclic or polycyclic. The monocyclic cycloalkyl group preferably includes a monocyclic cycloalkyl group having 3 to 8 carbon atoms, for example a cyclopropyl group, a cyclopentyl group, a cyclohexyl group, a cyclobutyl group and a cyclooctyl group. The polycyclic cycloalkyl group preferably includes a polycyclic cycloalkyl group having 6 to 20 carbon atoms, for example an adamantyl group, a norbornyl group, an isobornyl group, a camphornyl group, a dicyclopentyl group, a α-pinenyl group, a tricyclodecanyl group, a tetracyclododecyl group, and an androstannyl group. Herein, a part of the carbon atoms in the cycloalkyl group may or may not be substituted with a hetero atom such as an oxygen atom.

The aryl group as $R_{36}$ to $R_{39}$ preferably includes an aryl group having 6 to 10 carbon atoms, for example a phenyl group, a tolyl group, a dimethylphenyl group, a 2,4,6-trimethylphenyl group, a naphthyl group, an anthryl group, and a 9,10-dimethoxyanthryl group.

The aralkyl group as $R_{36}$ to $R_{39}$ preferably includes an aralkyl group having 7 to 12 carbon atoms, for example a benzyl group, a phenethyl group and a naphthylmethyl group.

The alkenyl group as $R_{36}$ to $R_{39}$ preferably includes an alkenyl group having 2 to 8 carbon atoms, for example a vinyl group, an allyl group, a butenyl group, and a cyclohexenyl group.

The examples of a substituent, which $R_{36}$ to $R_{39}$ may have, include an alkyl group, a cycloalkyl group, an aryl group, an amino group, an amido group, a ureido group, a urethane group, a hydroxyl group, a carboxyl group, a halogen atom, an alkoxyl group, a thioether group, an acyl group, an acyloxy group, an alkoxycarbonyl group, a cyano group and a nitro group.

Specific preferable examples of the group decomposable by the action of an acid include a tertiary alkyl group such as a t-butyl group, a t-amyl group, a 1-alkyl-1-cyclohexyl group, a 2-alkyl-2-adamantyl group, a 2-adamantyl-2-propyl group, and a 2-(4-methylcyclohexyl)-2-propyl group, an acetal group such as a 1-alkoxy-1-ethoxy group, a 1-alkoxy-1-methoxy group and a tetrahydropyranyl group, and a t-alkylcarbonylmethyl group. The group decomposable by the action of an acid is more preferably a tertiary alkyl group, particularly preferably a tertiary alkyl group having an alicyclic group, such as an adamantyl group.

Specific preferable examples of the repeating unit represented by the formula (III) are described below. However, the invention is not limited to them.

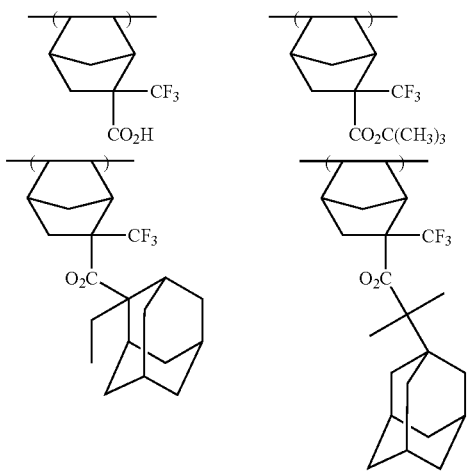

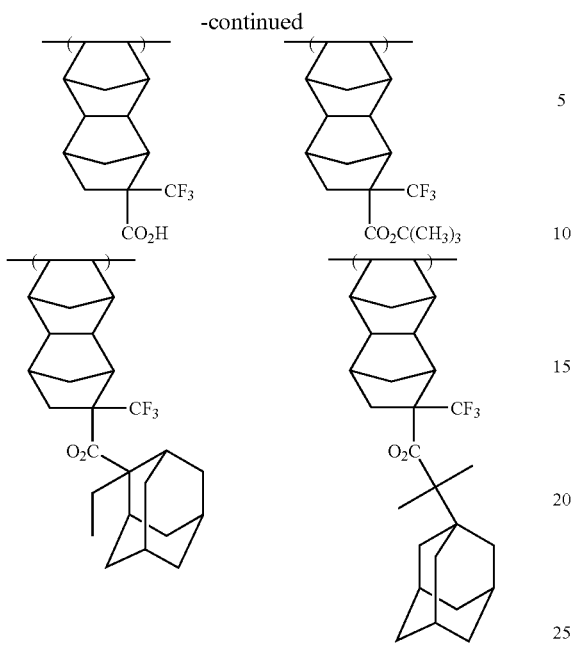

In the formula (IV), $R_{1a}$ represents a hydrogen atom, a fluorine atom, a chlorine atom, a bromine atom, a cyano group or a trifluoromethyl group. $R_{41}$ to $R_{46}$ each independently represents a hydrogen atom, a fluorine atom or a fluorinated alkyl group, provided that at least one of $R_{41}$ to $R_{46}$ is not a hydrogen atom. $X_2$ represents a hydrogen atom or a group decomposable by the action of an acid. n represents an integer of 2 to 5. $R_{41}$ to $R_{46}$ and $X_2$ may be the same or different when they exist in a number of 2 or more.

The fluorinated alkyl group as $R_{41}$ to $R_{46}$ includes the same fluorinated alkyl groups as Ra in the formula (I).

The group decomposable by the action of an acid as $X_2$ includes the same group decomposable by the action of an acid as $X_1$ in the formula (II').

Specific preferable examples of the repeating unit represented by the formula (IV) are described below. However, the invention is not limited to them.

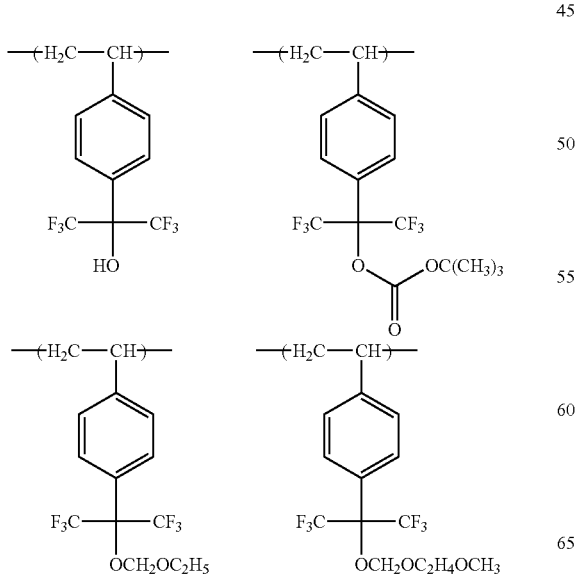

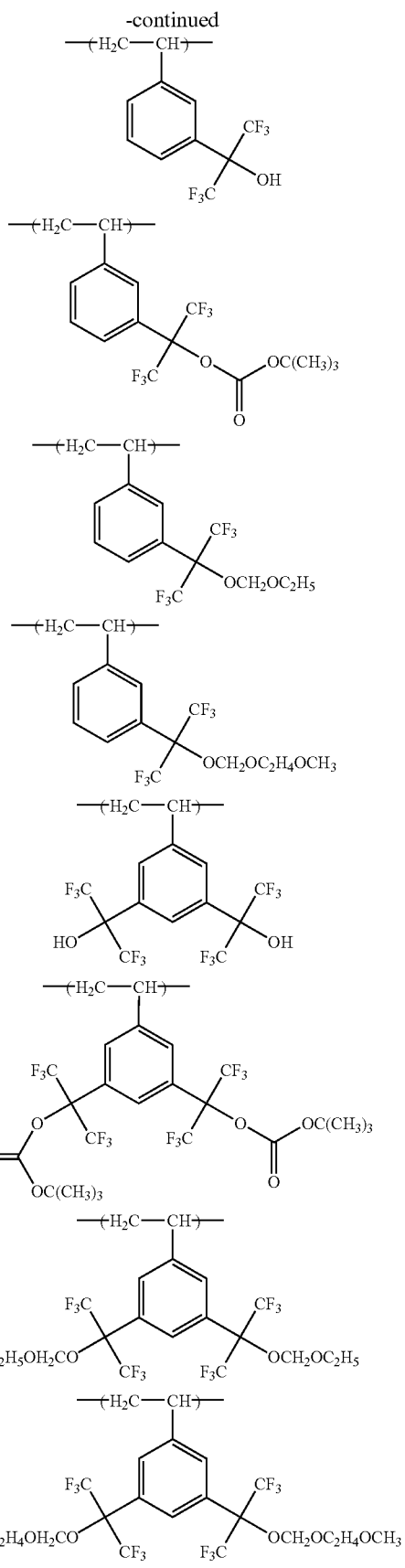

The resin (A2) preferably contains at least one type of repeating unit formed with a α-halogenated acrylate ester or a α-trihalogenated methacrylate ester.

Specific preferable examples of the repeating unit formed with a α-halogenated acrylate ester include a repeating unit represented by the following formula (HA-I).

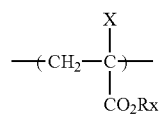

(HA-I)

Specific preferable examples of the repeating unit formed with a α-trihalogenated methacrylate ester include a repeating unit represented by the following formula (HA-II).

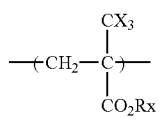

(HA-II)

In the formulae (HA-I) and (HA-II), X represents a fluorine atom, a chlorine atom or a bromine atom. X is preferably a fluorine atom. Rx represents a linear, branched, cyclic or alicyclic alkyl group.

The repeat unit formed with a α-halogenated acrylate ester or with a α-trihalogenated methacrylate ester preferably contains a cyclic carbon structure and/or a structure containing a group decomposable by the action of an acid to generate a carboxylic acid.

The cyclic carbon structure includes for example a cycloalkane structure and an alicyclic structure, having 3 to 30 carbon atoms. Specifically, examples thereof include an adamantane ring, a noradamantane ring, a decalin residue, a tricyclodecan ring, a norbornane ring, a cedrol ring, a cyclopropane ring, a cyclopentane ring, a cyclohexane ring, a cycloheptane ring, a cyclooctane ring, a cyclodecan ring, and a cyclododecan ring, and preferably an adamantane ring, a norbornane ring and a cyclohexane ring. By preparing Rx into a cyclic carbon structure, the repeat units represented by the formulae (HA-I) and (HA-II) can get a cyclic carbon structure.

The group decomposable by the action of an acid to generate an carboxylic acid includes the same group as —COOR$_{3a}$ group (provided that R$_{3a}$ represents a group decomposable by the action of an acid) in the formula (III). In the repeating units represented by the formulas (HA-I) and (HA-II), a group wherein —CO$_2$ is bonded to the group Rx may be a group decomposable by the action of an acid to generate a carboxylic acid.

Specific examples of the repeating unit formed with a α-halogenated acrylate ester or with a α-trihalogenated methacrylate ester are shown below, with no specific limitation.

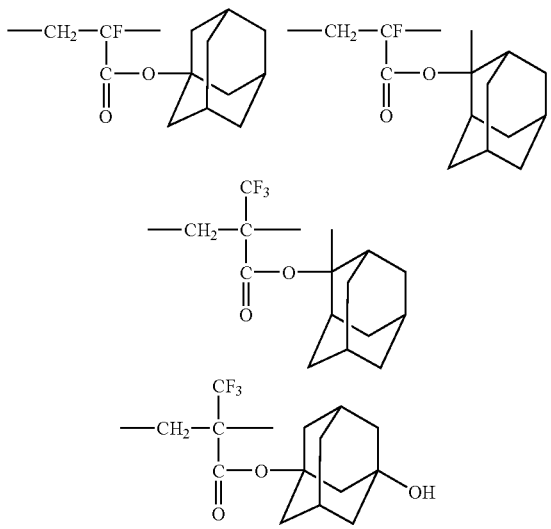

The resin (A2) preferably contains at least one type of repeating unit formed with a vinyl ether compound.

Specific preferable examples of the repeating unit formed with a vinyl ether compound include a repeating unit represented by the following formula (VE-I).

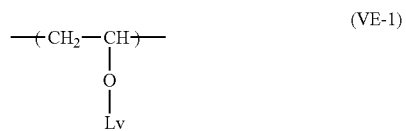

(VE-1)

In the formula (VE-I), Lv represents a linear, branched, cyclic or alicyclic alkyl group which may optionally have a substituent, a group prepared by binding these groups together, or a group prepared by further binding these groups, using an ether group, an ester group, and a carbonate group as a binding group. The examples of a substituent include a hydroxyl group, a halogen atom, a halogenated alkyl group, a cyano group, and a nitro group, preferably a hydroxyl group, a fluorine atom and a trifluoromethyl group.

The vinyl ether compounds, which is not limited, preferably include a vinyl ether compound having an alkyl group or a cyclic carbon structure, which may optionally have a substituent (preferably, a hydroxyl group, a halogen atom and a carboxyl group). Further, a vinyl ether compound having a structure decomposable by the action of an acid to generate a hydroxyl group or a carboxylic acid is preferable.

The alkyl group preferably includes a linear or branched alkyl group having one to 8 carbon atoms, for example a methyl group, an ethyl group, a propyl group, a n-butyl group, a sec-butyl group, a hexyl group, a 2-ethylhexyl group and an octyl group.

The cyclic carbon structure includes a cycloalkane structure, an alicyclic structure and an aromatic ring structure, having 3 to 30 carbon atoms. Specifically, the examples thereof includes an adamantane ring, a noradamantane ring, a decalin residue, a tricyclodecan ring, a norbornane ring, a cedrol ring, a cyclopropane ring, a cyclopentane ring, a cyclohexane ring, a cycloheptane ring, a cyclooctane ring, a cyclodecan ring, a cyclododecan ring, a benzene ring and a naphthalene ring, preferably an adamantane ring, a norbornane ring and a cyclohexane ring. By preparing Lv into an alkyl group or a cyclic carbon structure, the repeating unit represented by the formula (BE-I) can have the alkyl group or the cyclic carbon structure.

The group decomposable by the action of an acid to generate a hydroxyl group or a carboxylic acid includes for example the group —$OX_1$ (provided that $X_1$ represents a group decomposable by the action of an acid) in the formula (II') and the group —$CO_2R_{3a}$ (provided that $R_{3a}$ represents a group decomposable by the action of an acid) in the formula (III).

In the formula (BE-I), a group decomposable by the action of an acid to generate a hydroxyl group or a carboxylic acid can be the substituent for Lv.

Specific preferable examples of the vinyl ether compounds are listed below. The invention is never limited to them.

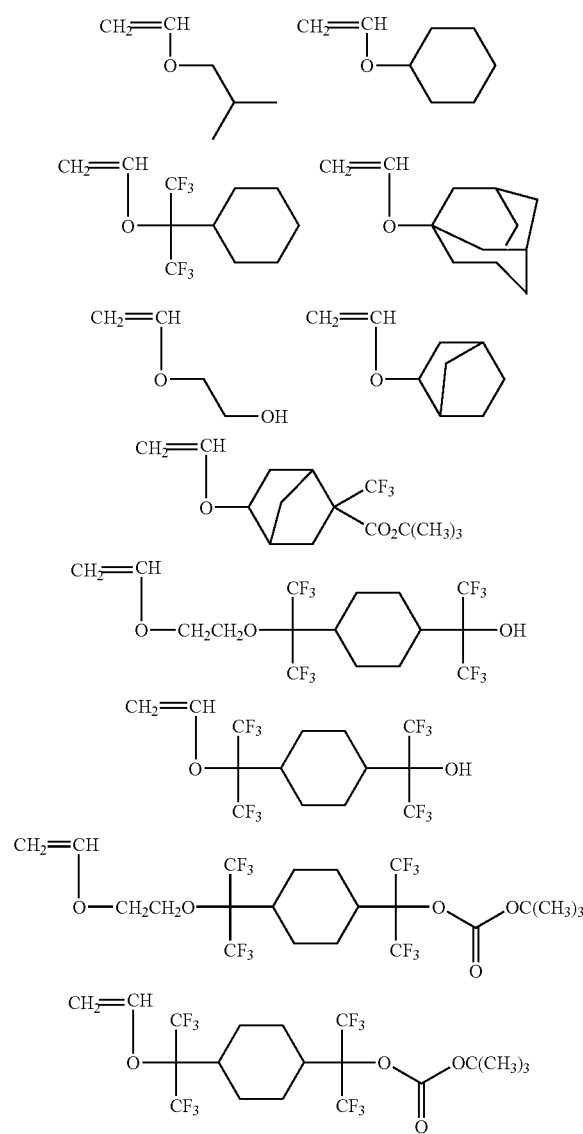

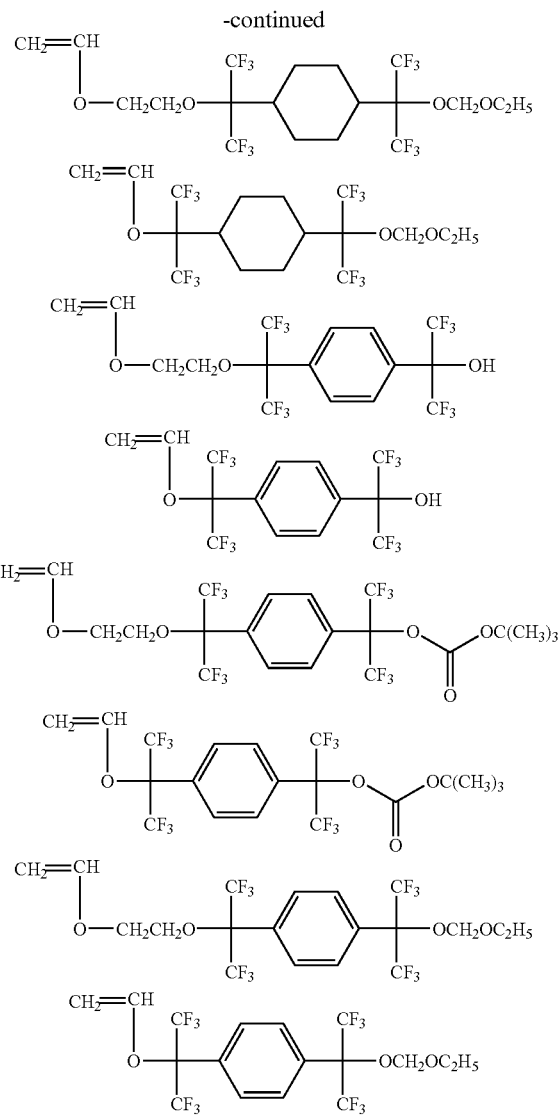

The resin (A2) may be polymerized with other polymerizable monomer, other than the repeating unit as above.

The copolymerizable monomer for use in combination includes for example acrylate esters, acrylamides, methacrylate esters, methacrylamides, allyl compounds, vinyl esters, styrenes, crotonate esters, maleate or fumarate dialkyl esters, norbornenes, maleic anhydride, maleimides, acrylonitrile, methacrylonitrile, maleilonitrile, $C(R_{101a})(R_{102a})=C(R_{103a})(R_{104a})$ (in the formula, $R_{101a}$ to $R_{104a}$ may be the same or different and represent a hydrogen atom, a halogen atom or an alkyl group (preferably having one to 10 carbon atoms) which may be substituted with a halogen atom), particularly preferably including acrylonitrile, methacrylonitrile, norbornenes, maleic anhydride, maleimide, N-hydroxymaleimide, N-(t-butoxycarbonyloxy)-maleimide, and $C(R_{101a})(R_{102a})=C(R_{103a})(R_{104a})$ Besides, addition-polymerizable unsaturated compounds, which are generally copolymerizable, are satisfactory.

Specific preferable examples of the resin (A2) are listed below. The invention is never limited to them.

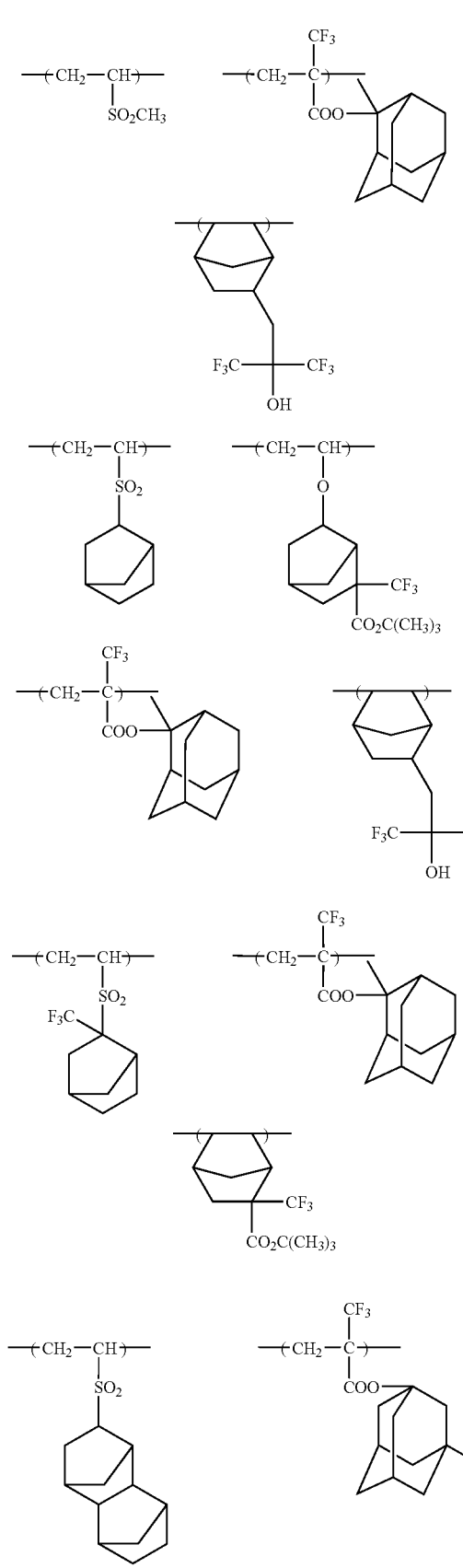
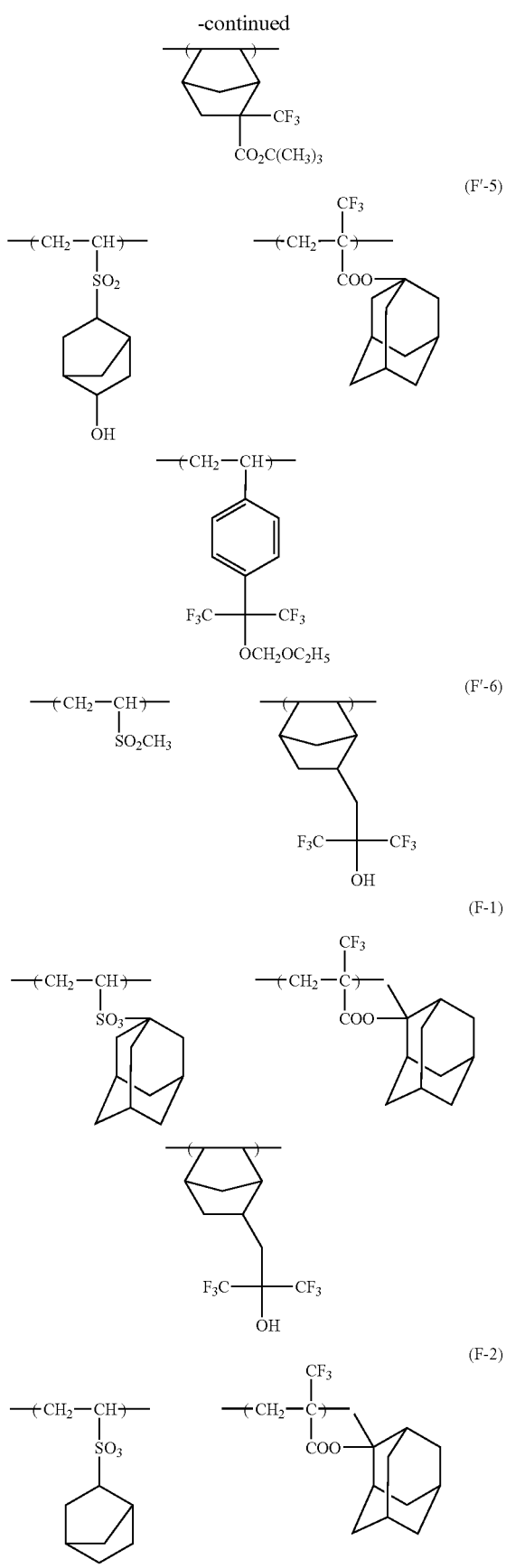

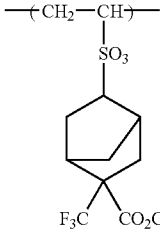

(F-3)

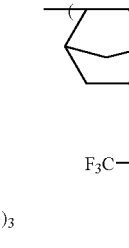

(F-4)

(F-5)

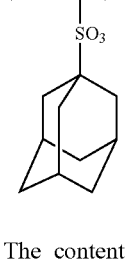

(F-6)

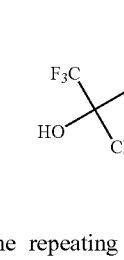

(F-7)

The content of the repeating unit represented by the formula (I') in the resin (A2) is preferably 10 to 70 mol %, more preferably 20 to 50 mol %.

The content of the repeating unit represented by the formula (I'a) in the resin (A2) is preferably 10 to 70 mol %, more preferably 20 to 50 mol %.

The content of the repeating unit represented by the formula (I'b) in the resin (A2) is preferably 10 to 70 mol %, more preferably 20 to 50 mol %.

The content of the repeating units represented by the formulae (II') to (IV) in the resin (A2) is preferably 10 to 70 mol %, more preferably 20 to 60 mol %.

The content of the repeating unit formed with the vinyl ether compound in the resin (A2) is preferably 10 to 60 mol %, more preferably 20 to 50 mol %.

The content of the repeating unit formed with a α-halogenated acrylate ester or a α-trihalogenated methacrylate ester in the resin (A2) is preferably 10 to 40 mol %, more preferably 20 to 30 mol %.

When the resin (A2) contains a repeating unit represented by the formula (I'a), the content of the repeat unit having a group decomposable by the action of an acid in the resin (A2) is preferably 15 to 90 mol %, more preferably 20 to 80 mol %.

When the resin (A2) contains a repeating unit represented by the formula (I'b), the content of the repeat unit having a group decomposable by the action of an acid in the resin (A2) is preferably 5 to 70 mol %, more preferably 10 to 50 mol %.

The solubility of the resin (A2) in alkali developing solution increases, when the group decomposable by the action of an acid is decomposed by the action of an acid, to form a hydrophilic group such as a hydroxyl group and a carboxyl group.

The molecular weight of the resin (A2) is preferably 2,000 to 50,000, more preferably 3,000 to 30,000 based on a weight average molecular weight. When the resin has a molecular weight too low, the thermal resistance of the resulting resist is reduced. When the resin has a molecular weight too high, the solubility thereof in a developing solution is poor, leading to the deterioration of the sensitivity and resolution.

The molecular weight distribution (the molecular weight dispersion degree) (Mw/Mn) of the resin (A2) is preferably 1.0 to 3.0, more preferably 1.1 to 2.0 and particularly preferably 1.1 to 1.5. The method for reducing the molecular weight dispersion degree includes a process of dissolving a polymer recovered from general radical polymerization in a good solvent, adding then a poor solvent to remove compounds with low molecular weights, or a process according to the living polymerization method such as living radical polymerization. Any of the processes can be preferably used.

The living radical polymerization method includes the George, et al.'s process using nitroxide and the processes of Sawamoto and Machaufsky, et al., using metal complexes. Any of the processes can be sued.

From the standpoint of improving pattern roughness, preferably, additional monomers are continuously or intermittently added to monomers in the course of radical polymerization in the presence of a radical polymerization initiator according to the general radical polymerization method. In that case, the types and compositions of monomers to be charged initially in a reactor and the types and compositions of monomers to be subsequently added in the course of radical polymerization under progress may be the same or different. Further, preferably, a process of additionally adding the polymerization initiator together with the monomers to be subsequently added is used, to reduce the residual unreactive monomers.

The amount of the resin (A2) to be added is from 50 to 99.5% by weight, preferably 80 to 99% by weight, and more preferably 90 to 98% by weight based on a total solid content in the composition.

[3] (B) Compound which is Capable of Generating an Acid by Irradiation of Actinic Ray or Radiation (Sometimes Referred to as "Compound (B)")

The positive resist composition of the invention contains a compound which is capable of generating an acid by irradiation of actinic ray or radiation, particularly by irradiation of $F_2$ excimer laser beam.

The compound which is capable of generating an acid by irradiation of actinic ray or radiation can be selected from compounds for use as compounds capable of generating an acid by irradiation of actinic ray or radiation.

In other words, the compound which is capable of generating an acid by irradiation of actinic ray or radiation can be selected appropriately from compounds capable of generating an acid in known ray (400 to 200 nm ultraviolet ray and far ultraviolet ray, particularly preferably the g beam, the h beam, the i beam, and KrF excimer laser beam) to be used for photo-initiators of cation photopolymerization, photoinitiators for optical radical polymerization, photo-quenchers of dyes, optical discoloring agents, or micro resists, ArF excimer laser beam, $F_2$ excimer laser beam, electron beam, X ray, molecular ray or ion beam, and mixtures thereof. The selected compound is then used.

Such compounds include for example diazonium salts described in S. I. Schlesinger, Photogr. Sci. Eng., 18, 387 (1974), T. S. Bal et al., Polymer, 21, 423(1980) and the like; ammonium salts described in U.S. Pat. Nos. 4,069,055, 4,069,056, and Re 27,992, JP-A-3-140140, and the like; phosphonium salts described in D. C. Necker et al., Macromolecules, 17, 2468(1984), C. S. Wen et al., Teh, Proc. Conf. Rad. Curing ASIA, p. 478, Tokyo, October (1988), U.S. Pat. Nos. 4,069,055 and 4,069,056; iodonium salts described in J. V. Cruvello et al., Macromolecules, 10(6), 1307 (1977), Chem. & Eng. News, November 28, p. 31 (1988), EP 104,143, EP 339,049, EP 410,201, JP-A-2-150848, JP-A-2-296514 and the like; sulfonium salts described in J. V. Crivello et al., Polymer J., 17, 73(1985), J. V. Crivello et al., J. Org. Chem, 43, 3055(1978), W. R. Watt et al., J. Polymer Sci., Polymer Chem. Ed., 22, 1789 (1984), J. V. Crivello et al., Polymer Bull., 14, 279(1985), J. V. Crivello et al., Macromolecules, 14 (5), 1141(1981), J. V. Crivello et al., J. Polymer Sci., Polymer Chem. Ed., 17, 2877(1979), EP 370,693, EP 161,811, EP 410,201, EP 339,049, EP 233,567, EP 297,443, EP 297,442, U.S. Pat. Nos. 4,933,377, 3,902,114, 4,760,013, 4,734,444 and 2,833,827, German Patent Nos. 2,904,626, 3,604,580 and 3,604,581 and the like; selenonium salts described in J. V. Crivello et al., Macromolecules, 10(6), 1307(1977), J. V. Crivello et al., J. Polymer Sci., Polymer Chem. Ed., 17, 1047 (1979) and the like; onium salts such as arthonium salts described in C. S. Wen et al., Teh, Proc. Conf. Rad. Curing ASIA, p. 478, Tokyo, October (1988) and the like; organic halogen compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, JP-A-63-298339 and the like; organic metal/organic halogen compounds described in K. Heier et al., J. Rad. Curing, 13(4), 26(1986), T. P. Gill et al., Inorg. Chem., 19, 3007(1980), D. Astruc, Acc. Chem. Res., 19 (12), 377(1896), JP-A-2-161445 and the like; optical acid generators with o-nitrobenzyl type protective groups, as described in S. Hayase et al., J. Polymer Sci., 25, 753(1987), E. Reichmanis et al., J. Polymer Sci., Polymer Chem. Ed., 23, 1(1985), Q. Q. Zhu et al., J. Photochem., 36, 85, 39, 317(1987), B. Amit et al., Tetrahedron Lett., (24) 2205 (1973), D. H. R. Barton et al., J. Chem. Soc., 3571(1965), P. H. Collins et al., J. Chem. Soc., Perkin I, 1695(1975), M. Rudinstein et al., Tetrahedron Lett., (17), 1445(1975), J. W. Walker et al., J. Am. Chem. Soc., 110, 7170(1988), S. C. Busman et al., J. Imaging Technol., 11(4), 191 (1985), H. M. Houlihan et al., Macromolecules, 21, 2001(1988), P. M. Collins et al., J. Chem. Soc., Chem. Commun., 532(1972), S. Hayase et al., Macromolecules, 18, 1799(1985), E. Reichmanis et al., J. Electrochem. Soc., Solid State Sci. Technol., 130(6), F. M. Houlihan et al., Macromolecules, 21, 2001 (1988), EP 0 290 750, EP 046 083, EP 156 535, EP 271 851, EP 0 388 343, U.S. Pat. Nos. 3,901,710 and 4,181,531, JP-A-60-198538, JP-A-53-133022 and the like; compounds optically decomposable to generate sulfonic acid, typically including iminosulfonates described in M. TUNOOKA et al., Polymer Preprints, Japan, 35(8), G. Berner et al., J. Rad. Curing, 13(4), W. J. Mijs et al., Coating Technol., 55(697), 45(1983), Akzo, H. Adachi et al., Polymer Preprints, Japan, 37(3), EP 0 199 672, EP 84 515, EP 044 115, EP 618 564, EP 0 101 122, U.S. Pat. Nos. 4,371,605 and 4,431,774, JP-A-64-18143, JP-A-2-245756, JP-A-3-140109 and the like; disulfonated compounds described in JP-A-61-166544; and the like.

In accordance with the invention, the compound which is capable of generating an acid by irradiation of actinic ray or radiation preferably includes the compound (B1) capable of generating an organic sulfonic acid by irradiation of actinic ray or radiation (sometimes referred to as "compound (B1)").

The compound (B1) capable of generating an organic sulfonic acid by irradiation of actinic ray or radiation includes a compound (B1a) capable of generating an organic sulfonic acid by irradiation of actinic ray or radiation, in which the organic sulfonic acid is substituted with at least one fluorine atom, and a compound (B1b) capable of generating an organic sulfonic acid by irradiation of actinic ray or radiation, in which the organic sulfonic acid is not substituted with a fluorine atom.

As the compound (B1), preferably, a compound (B1a) capable of generating an organic sulfonic acid by irradiation of actinic ray or radiation, in which the organic sulfonic acid is substituted with at least one fluorine atom, and a compound (B1b) capable of generating an organic sulfonic acid by irradiation of actinic ray or radiation, in which the organic sulfonic acid is not substituted with a fluorine atom, is used in combination.

In accordance with the invention, a compound (B2) capable of generating a carboxylic acid by irradiation of actinic ray or radiation is used together with the compound (B1).

The compound (B2) decomposed under irradiation of actinic ray or radiation to generate carboxylic acid includes a compound (B2a) decomposed under irradiation of actinic ray or radiation to generate fluorine-containing carboxylic acid and a compound (B2b) decomposed under irradiation of actinic ray or radiation to generate no fluorine-containing carboxylic acid.

(B1a) Compound Capable of Generating an Organic Sulfonic Acid by Irradiation of Actinic Ray or Radiation, in which the Organic Sulfonic Acid is Substituted with at Least One Fluorine Atom (Sometimes Referred to as "Compound Generating Fluorine-Containing Sulfonic Acid under Irradiation of Actinic Ray or Radiation" or "Compound (B1a)")

The compound generating fluorine-containing sulfonic acid under irradiation of actinic ray or radiation includes for example an iodonium salt represented by the following formula (PAG3) or a sulfonium salt represented by the following formula (PAG4).

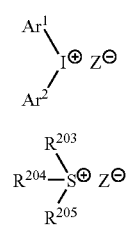

(PAG3)

(PAG4)

In the formulae, $Ar^1$ and $Ar^2$ each independently represents an aryl group which may be substituted, and $R^{203}$, $R^{204}$ and $R^{205}$ each independently represents an alkyl group or an aryl group, which may be substituted.

$Z^-$ represents a sulfonate anion containing at least one fluorine atom.

Additionally, two of $R^{203}$, $R^{204}$ and $R^{205}$, and $Ar^1$ and $Ar^2$ may be bonded via their individual single bonds or substituents.

The aryl group as $Ar^1$, $Ar^2$, $R^{203}$, $R^{204}$ and $R^{205}$ preferably includes aryl groups having 6 to 14 carbon atoms, while the alkyl group preferably includes alkyl groups having one to 8 carbon atoms.

For the aryl groups, preferable substituents include alkoxyl groups having one to 8 carbon atoms, alkyl groups having one to 8 carbon atoms, alkoxycarbonyl groups having 2 to 9 carbon atoms, alkylcarbonylamino groups having 2 to 9 carbon atoms, a nitro group, a carboxyl group, a hydroxyl group, a halogen atom and a phenylthio group. For the alkyl groups, preferable substituents include alkoxyl groups having one to 8 carbon atoms, aryl groups having 5 to 14 carbon atoms, arylcarbonyl groups having 6 to 15 carbon atoms, a carboxyl group and a halogen atom.

The sulfonate anion as $Z^-$ preferably includes at least one fluorine atom-containing aliphatic hydrocarbons having one to 20 carbon atoms and aromatic hydrocarbons having 5 to 20 carbon atoms. These may have substituents, satisfactorily. The substituents include for example alkoxyl groups having one to 10 carbon atoms, which may be substituted with a fluorine atom, alkoxycarbonyl groups having 2 to 11 carbon atoms, which may be substituted with a fluorine atom, a phenylamino group, a phenylcarbonyl group, a halogen atom and a hydroxyl group. For the aromatic hydrocarbons, substituents further include alkyl groups having one to 15 carbon atoms.

Concerning the aliphatic sulfonate anion, such anion having a fluorine atom on the α-carbon atom of sulfonic acid has high acidity. Further, a perfluoro-aliphatic sulfonic acid has higher acidity.

Specific preferable examples are listed below. The invention is never limited to them.

(VI-1)

(VI-2)

(VI-3)

-continued

| Structure | Counterion | Label |
|---|---|---|
| (diphenyl-I⁺ with alkyl), ₂ | CF₃(CF₂)₃SO₃⁻ | (VI-4) |
| (diphenyl-I⁺ with alkyl), ₂ | CF₃(CF₂)₇SO₃⁻ | (VI-5) |
| (diphenyl-I⁺ with alkyl), ₂ | pentafluorophenyl-SO₃⁻ | (VI-6) |
| (diphenyl-I⁺ with alkyl), ₂ | 4-F-C₆H₃-SO₃⁻ | (VI-7) |
| (diphenyl-I⁺ with alkyl), ₂ | 4-Br-2,5-difluorophenyl-SO₃⁻ | (VI-8) |
| (diphenyl-I⁺ with alkyl), ₂ | 2-CH₃-5-F-phenyl-SO₃⁻ | (VI-9) |
| (diphenyl-I⁺ with alkyl), ₂ | 2-F-phenyl-SO₃⁻ | (VI-10) |
| (diphenyl-I⁺ with alkyl), ₂ | CF₂HSO₃⁻ | (VI-11) |
| (diphenyl-I⁺ with alkyl), ₂ | CF₂ClSO₃⁻ | (VI-12) |
| (di-tert-butylphenyl-I⁺), ₂ | CF₃(CF₂)₃SO₃⁻ | (VI-13) |
| (di-tert-butylphenyl-I⁺), ₂ | pentafluorophenyl-SO₃⁻ | (VI-14) |

-continued
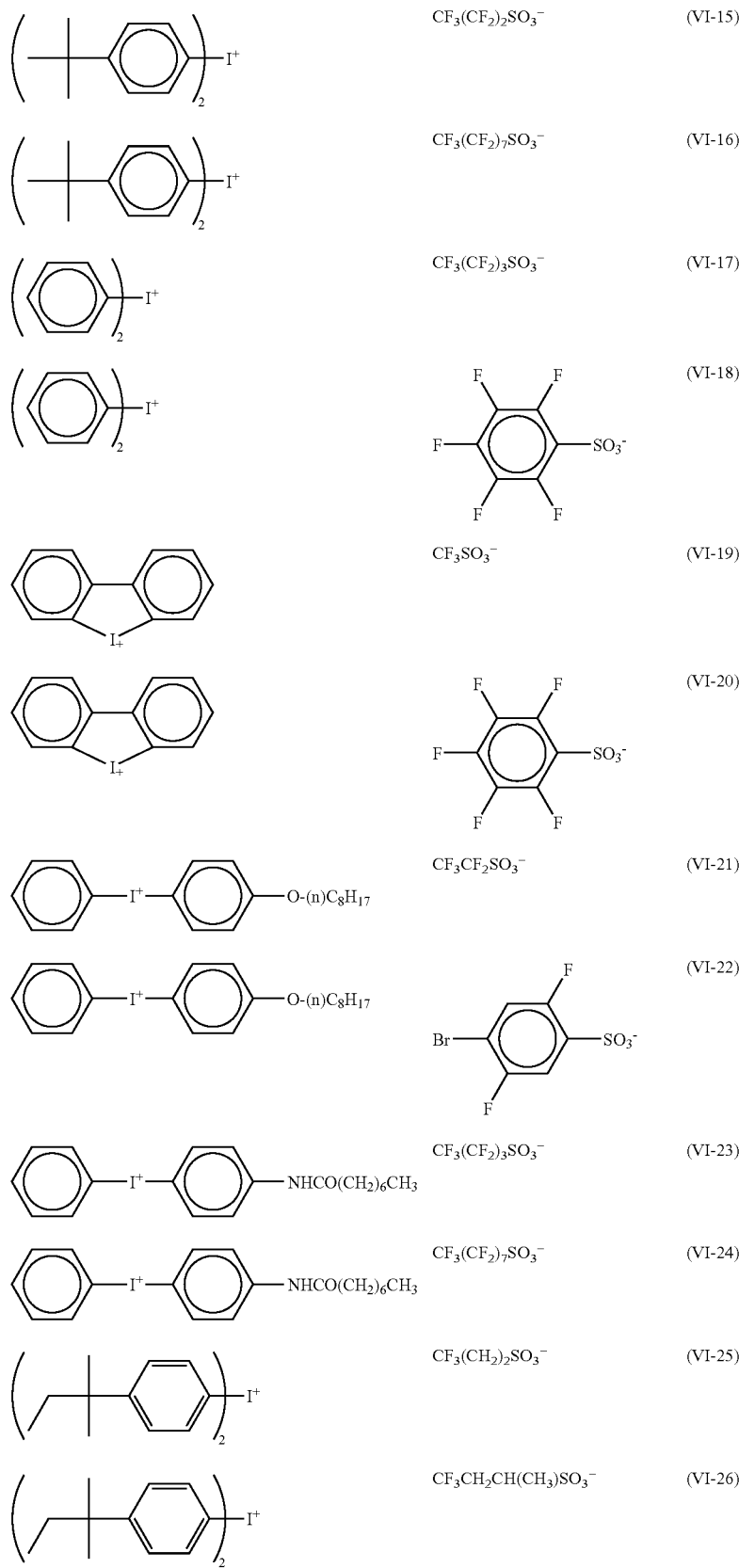

-continued
| | | |
|---|---|---|
| 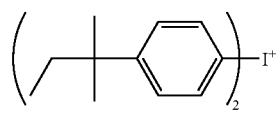 | $CF_3CH_2CH(CF_3)SO_3^-$ | (VI-27) |
| 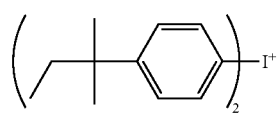 | $CH_3(CF_2)_7SO_3^-$ | (VI-28) |
| 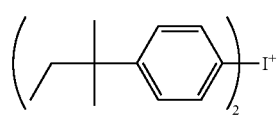 | $CF_3(CF_2)_2O(CF_2)_2SO_3^-$ | (VI-29) |
| 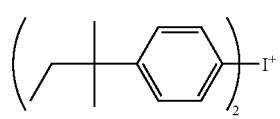 | $CF_3(CF_2)_2OCF(CF_3)SO_3^-$ | (VI-30) |
| 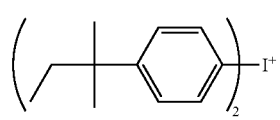 | $F[CF(CH_3)CF_2O]_2CF(CF_3)SO_3^-$ | (VI-31) |
| 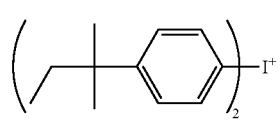 | $F[CF(CF_3)CF_2O]_2CF(CF_3)SO_3^-$ | (VI-32) |
| 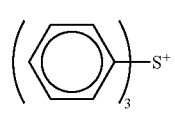 | $CF_3SO_3^-$ | (VII-1) |
| 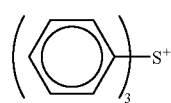 | $CF_3CF_2SO_3^-$ | (VII-2) |
| 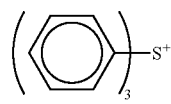 | $CF_3(CF_2)_2SO_3^-$ | (VII-3) |
| 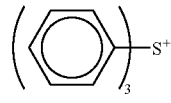 | $CF_3(CF_2)_3SO_3^-$ | (VII-4) |
| 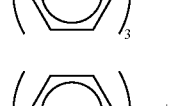 | $CF_3(CF_2)_7SO_3^-$ | (VII-5) |
| 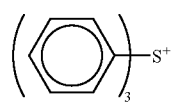 | 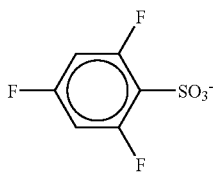 | (VII-6) |
| 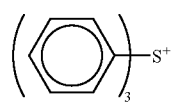 |  | (VII-7) |

-continued
| | | |
|---|---|---|
| 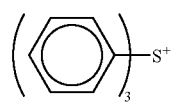 | 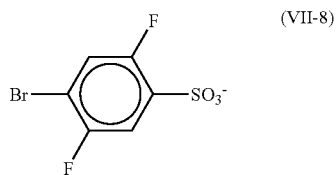 | (VII-8) |
| 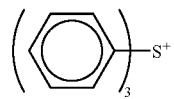 | 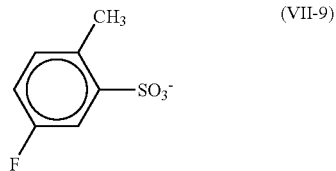 | (VII-9) |
| 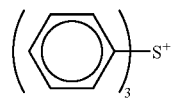 | 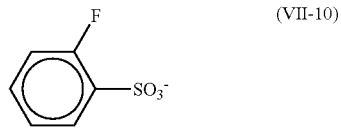 | (VII-10) |
| 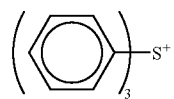 | $CF_2HSO_3^-$ | (VII-11) |
| 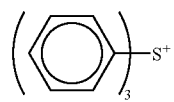 | $CF_2ClSO_3^-$ | (VII-12) |
| 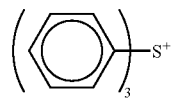 | 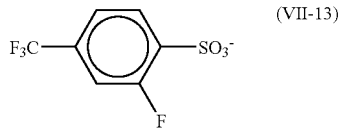 | (VII-13) |
| 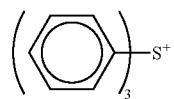 | 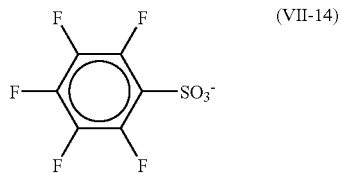 | (VII-14) |
| 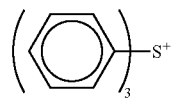 | $CF_3CH(OH)SO_3^-$ | (VII-15) |
| 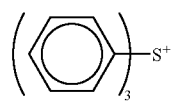 | $(CF_3)_2C(OH)SO_3^-$ | (VII-16) |
| 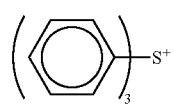 | 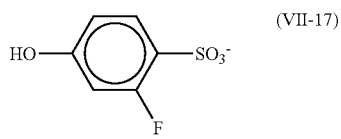 | (VII-17) |
| 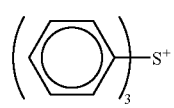 | $CF_3(CF_2)_{16}SO_3^-$ | (VII-18) |

-continued
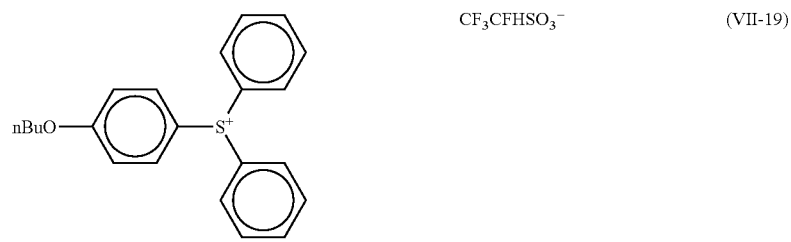
(VII-19) CF$_3$CFHSO$_3^-$
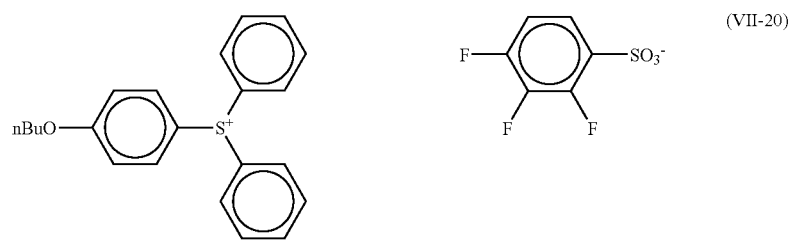
(VII-20)
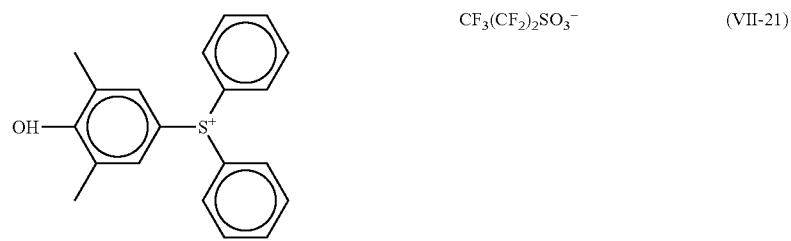
(VII-21) CF$_3$(CF$_2$)$_2$SO$_3^-$
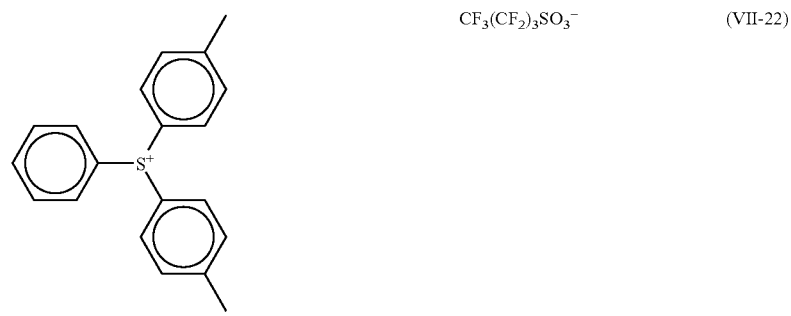
(VII-22) CF$_3$(CF$_2$)$_3$SO$_3^-$
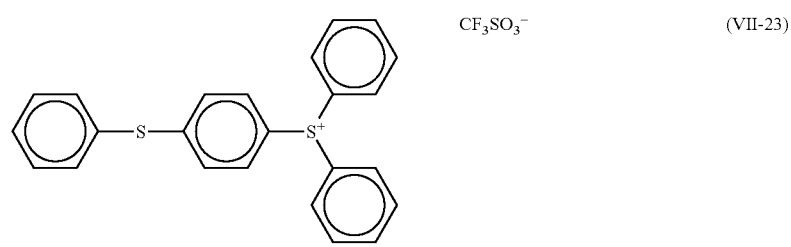
(VII-23) CF$_3$SO$_3^-$
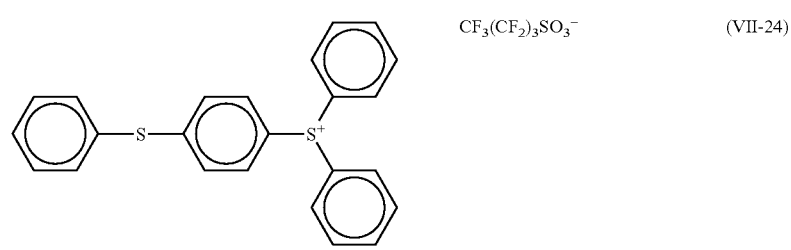
(VII-24) CF$_3$(CF$_2$)$_3$SO$_3^-$ -continued
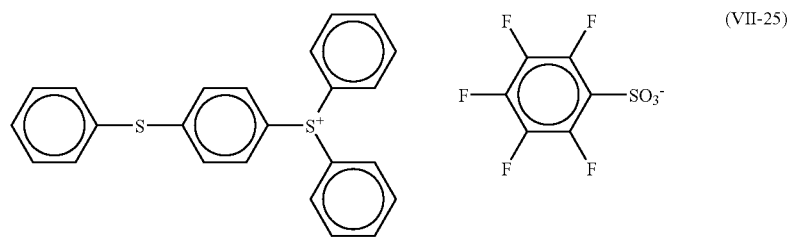
(VII-25)
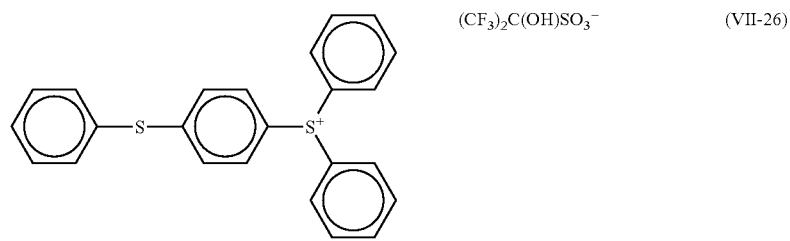
$(CF_3)_2C(OH)SO_3^-$ (VII-26)
$CF_3(CF_2)_7SO_3^-$ (VII-27)
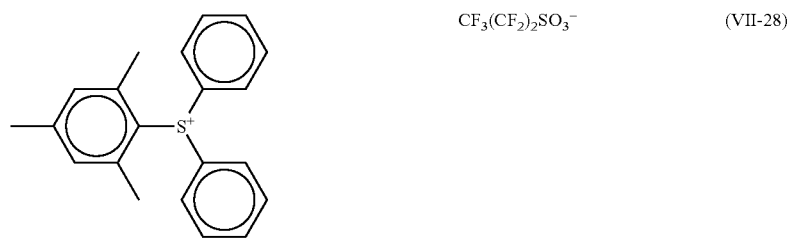
$CF_3(CF_2)_2SO_3^-$ (VII-28)
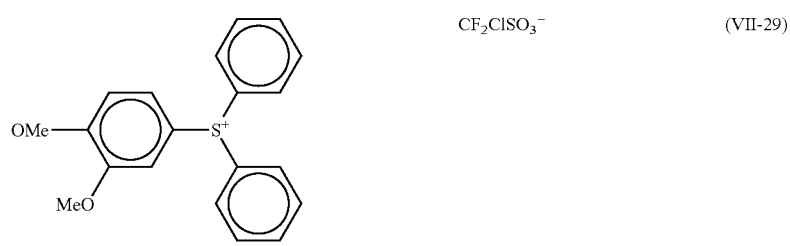
$CF_2ClSO_3^-$ (VII-29)
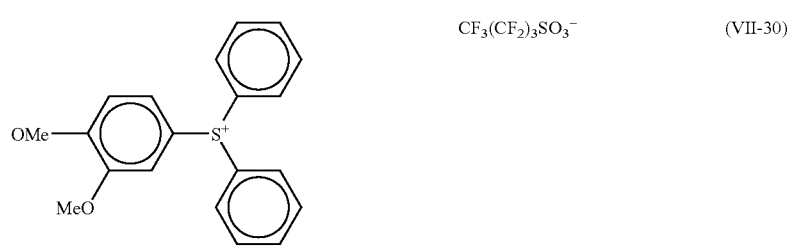
$CF_3(CF_2)_3SO_3^-$ (VII-30)

-continued
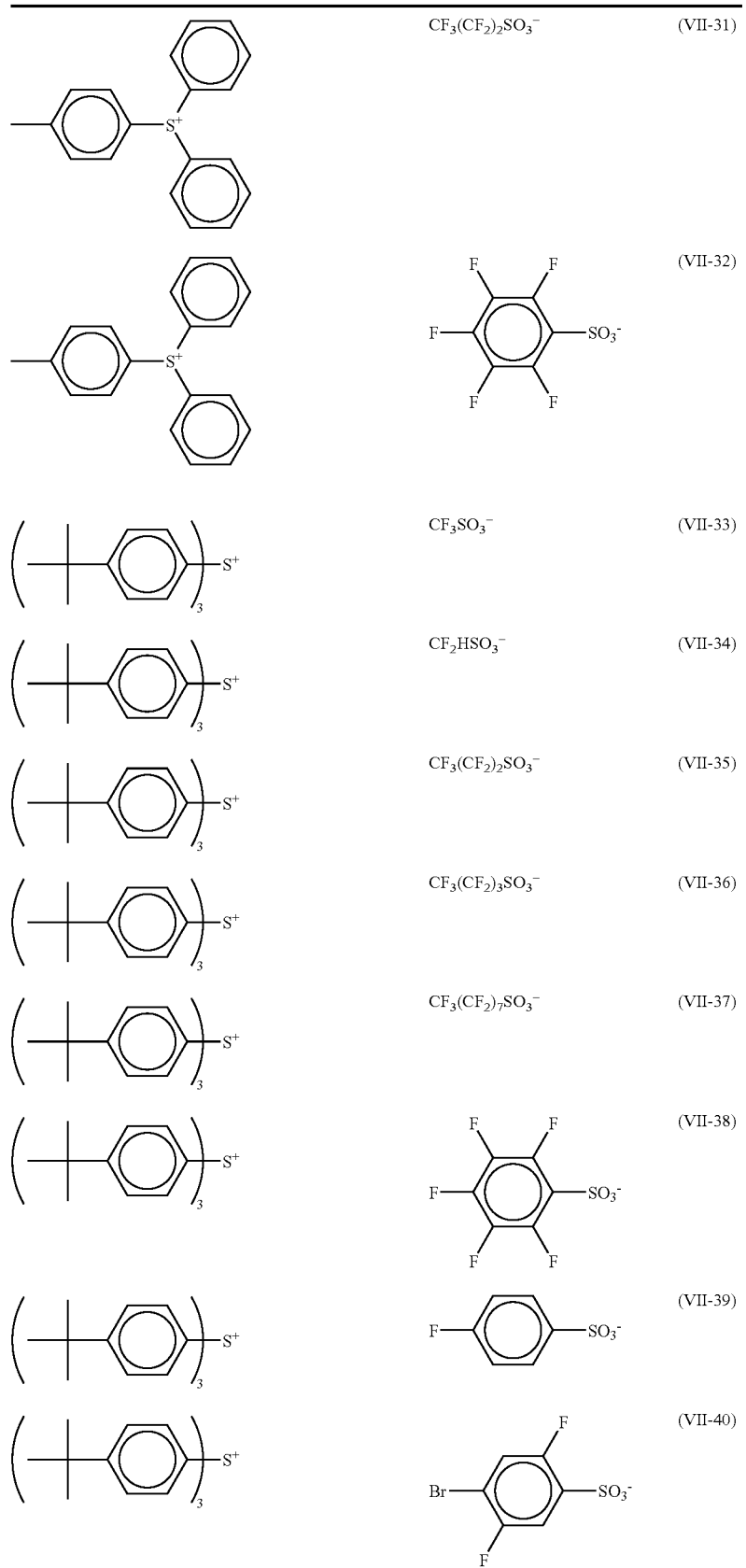

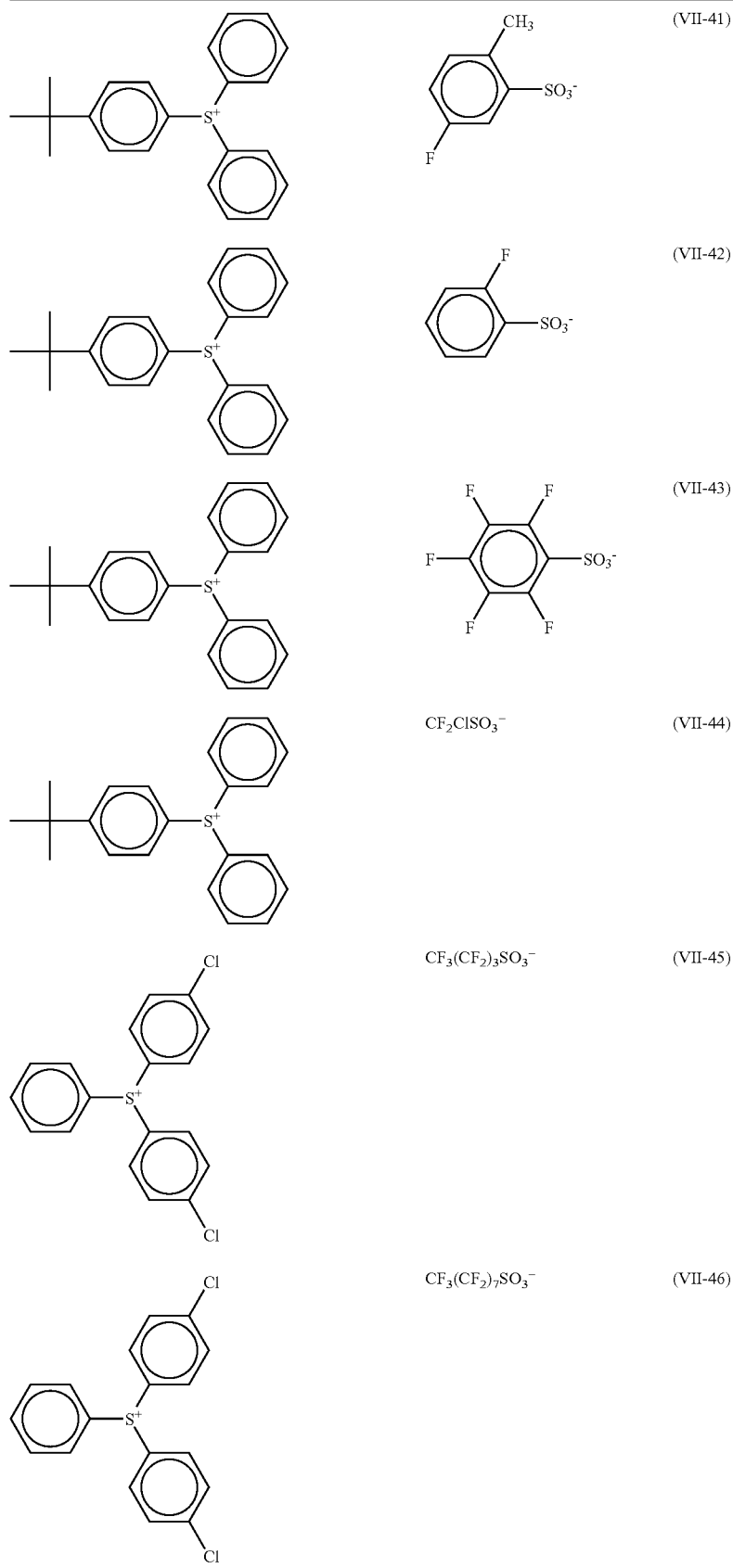

-continued

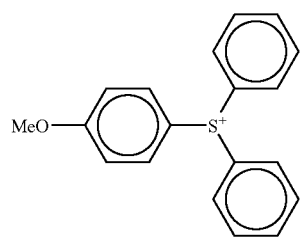 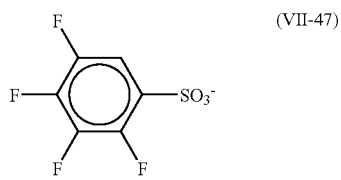 (VII-47)

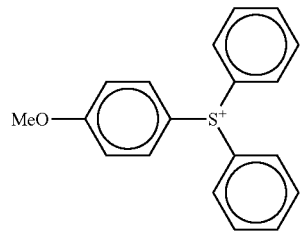 CF$_3$(CF$_2$)$_2$SO$_3^-$ (VII-48)

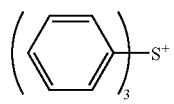 CF$_3$(CH$_2$)$_2$SO$_3^-$ (VII-49)

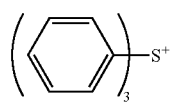 CF$_3$CH$_2$CH(CH$_3$)SO$_3^-$ (VII-50)

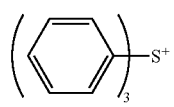 CF$_3$CH$_2$CH(CF$_3$)SO$_3^-$ (VII-51)

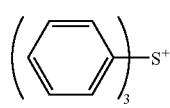 CH$_3$(CF$_2$)$_7$SO$_3^-$ (VII-52)

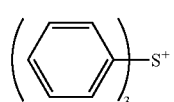 CF$_3$(CF$_2$)$_2$O(CF$_2$)$_2$SO$_3^-$ (VII-53)

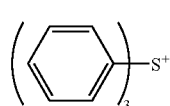 CF$_3$(CF$_2$)$_2$OCF(CF$_3$)SO$_3^-$ (VII-54)

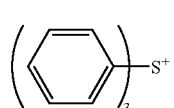 F[CF(CH$_3$)CF$_2$O]$_2$CF(CF$_3$)SO$_3^-$ (VII-55)

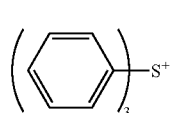 F[CF(CF$_3$)CF$_2$O]$_2$CF(CF$_3$)SO$_3^-$ (VII-56)

(B1b) Compound Capable of Generating an Organic Sulfonic Acid by Irradiation of Actinic Ray or Radiation, in Which the Organic Sulfonic Acid is Not Substituted with a Fluorine Atom (Sometimes Referred to as "Compound Generating no Fluorine-Containing Sulfonic Acid under Irradiation of Actinic Ray or Radiation" or "Compound (B1b)")

The compound generating no fluorine-containing sulfonic acid under irradiation of actinic ray or radiation includes for example the iodonium salt represented by the following formula (PAG3) or the sulfonium salt represented by the following formula (PAG4), wherein Z$^-$ is sulfonate anion containing no fluorine atom.

Specific examples thereof include compounds listed below, but are not limited to them.
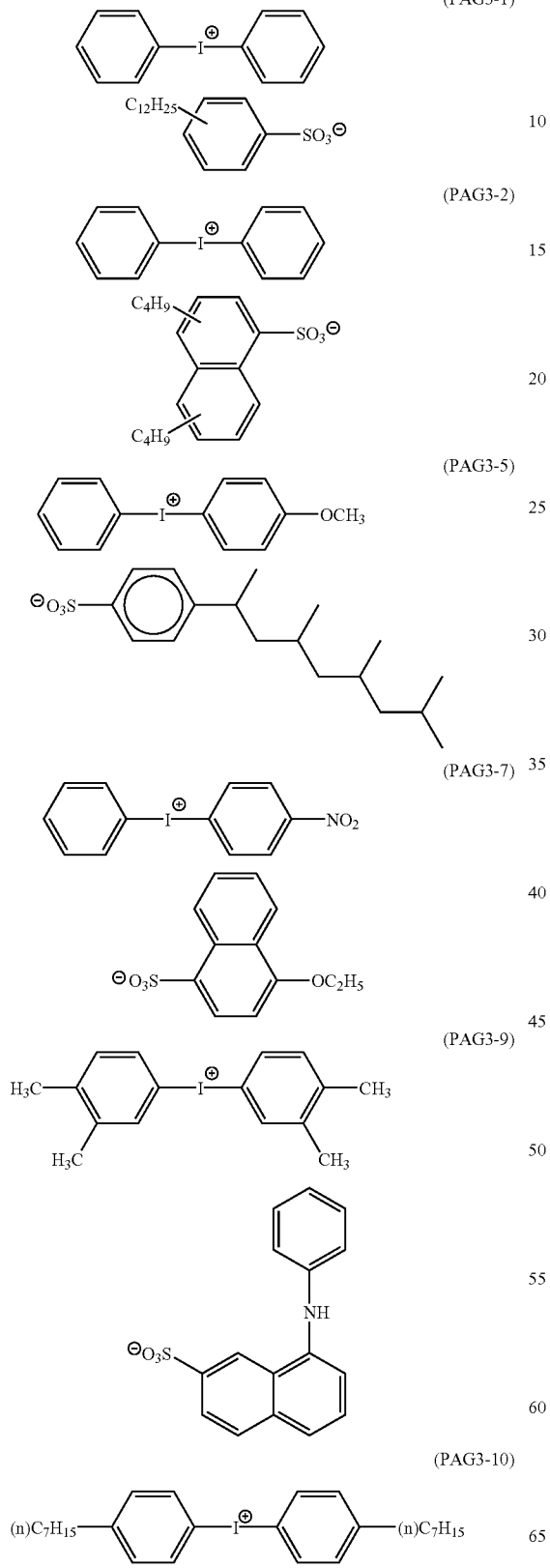
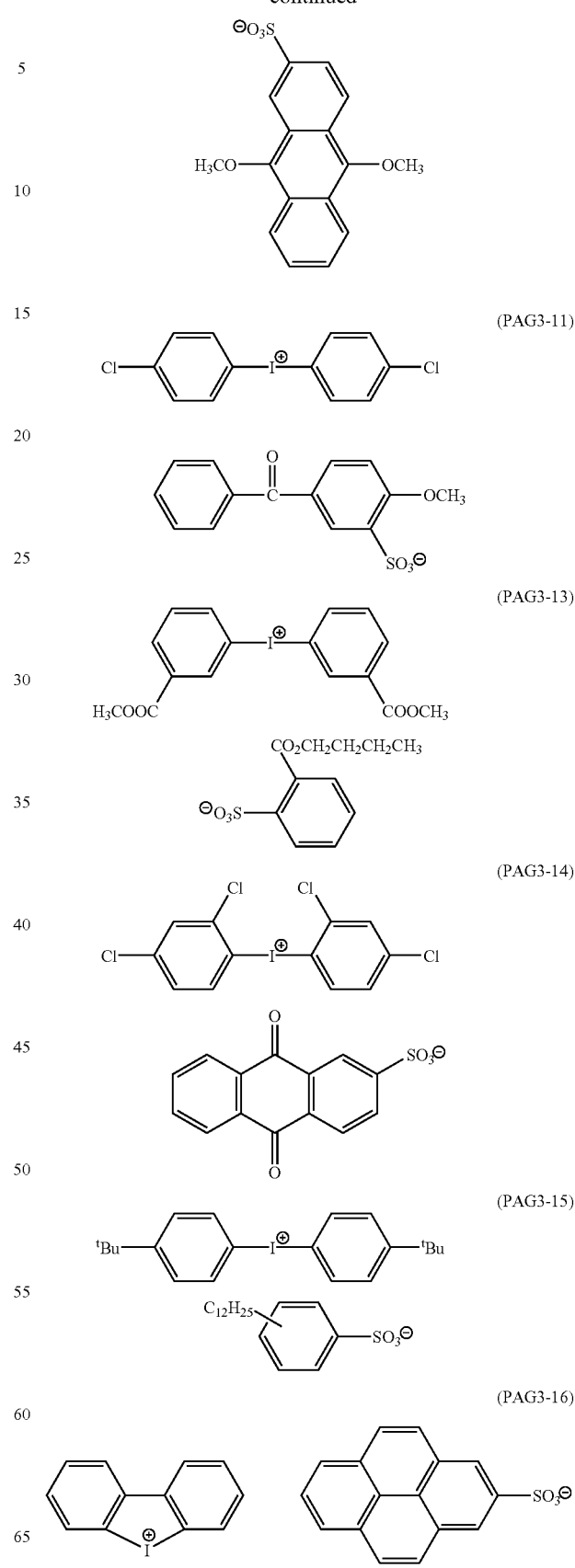

-continued
(PAG3-18)
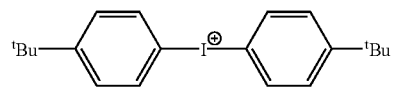
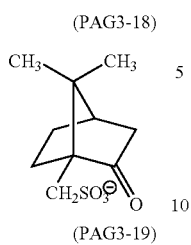
(PAG3-19)
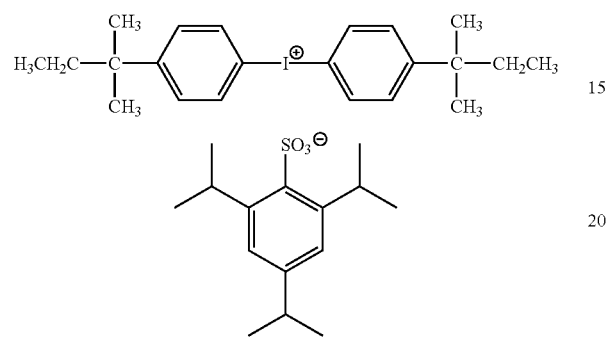
(PAG3-24)
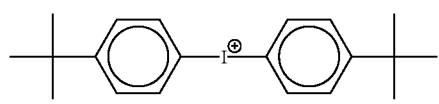
(PAG3-25)
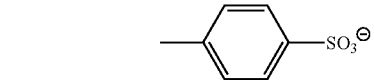
(PAG3-26)
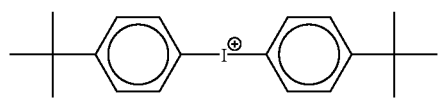 CH₃(CH₂)₅SO₃⁻
(PAG3-27)
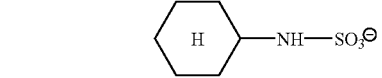 CH₃(CH₂)₇SO₃⁻
(PAG3-28)
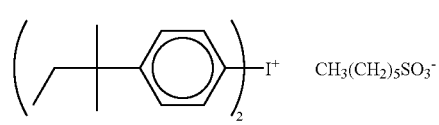 CH₃(CH₂)₁₀SO₃⁻
(PAG3-29)
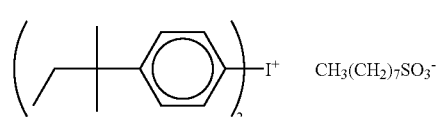 CH₃(CH₂)₁₂SO₃⁻
(PAG3-30)
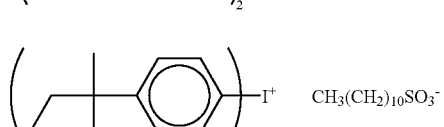 CH₃(CH₂)₁₄SO₃⁻
-continued
(PAG3-31)
 CH₃(CH₂)₁₈SO₃⁻
(PAG4-1)
(PAG4-2)
(PAG4-4)
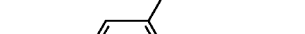
(PAG4-12)
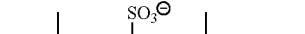
(PAG4-16)
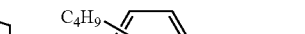
(PAG4-20)
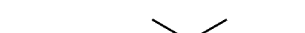
(PAG4-22)
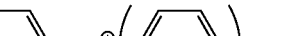

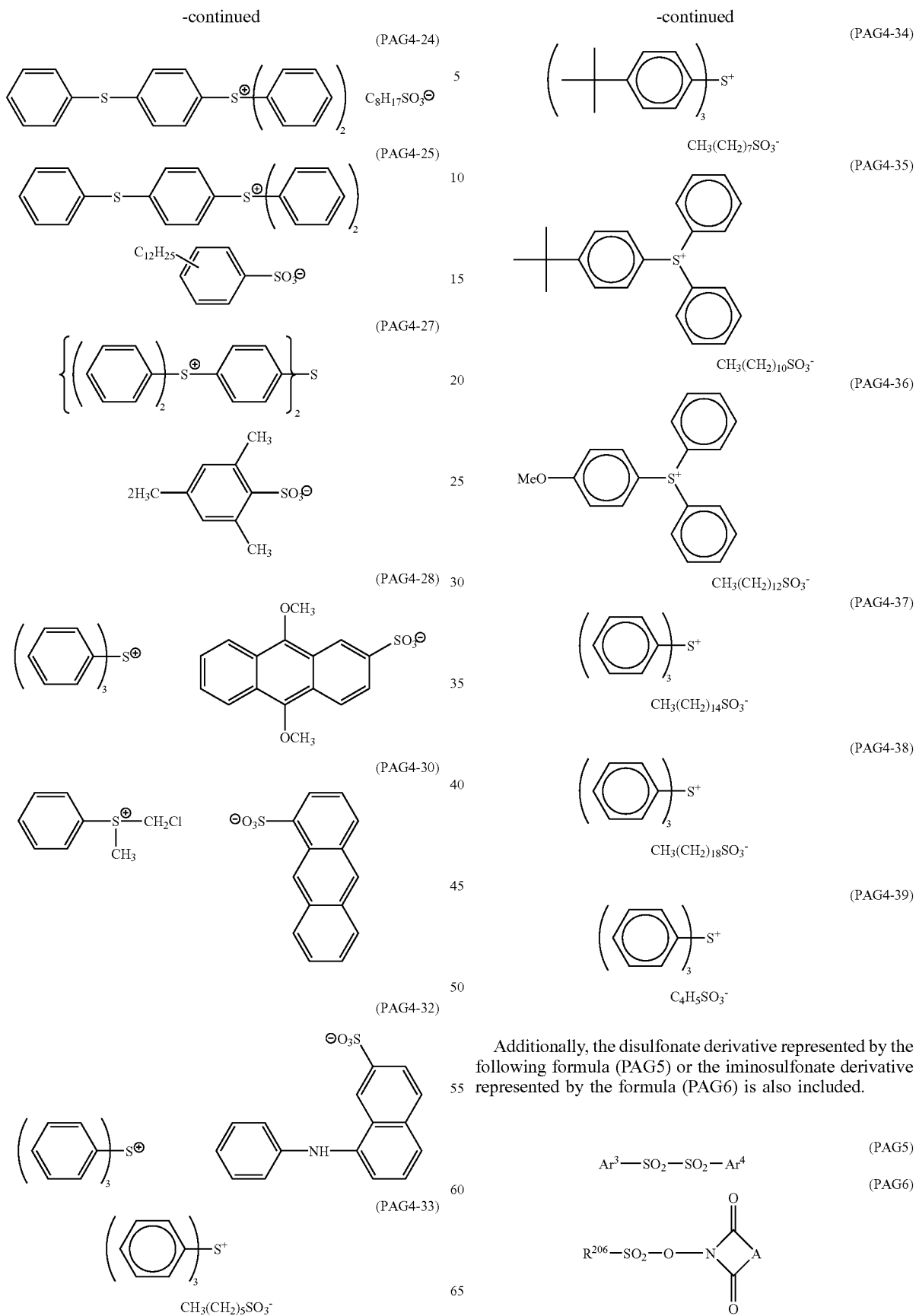
Additionally, the disulfonate derivative represented by the following formula (PAG5) or the iminosulfonate derivative represented by the formula (PAG6) is also included.
 (PAG5)
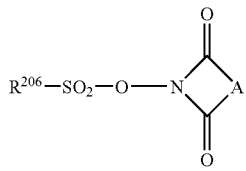 (PAG6)

In the formulae, Ar³ and Ar⁴ each independently represents an aryl group which may be substituted. $R^{206}$ represents an alkyl group or an aryl group, which may be substituted. A represents an alkylene group, an alkenylene group or an arylene group, which may be substituted.

Specific examples thereof include the following compounds but are not limited to them.

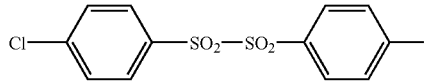
(PAG5-1)

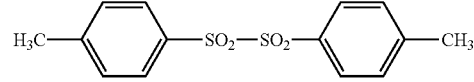
(PAG5-2)

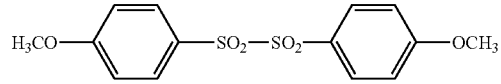
(PAG5-3)

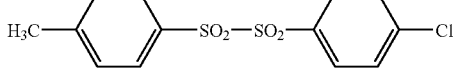
(PAG5-4)

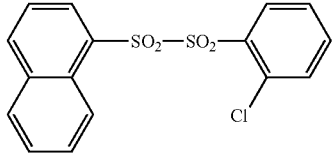
(PAG5-6)

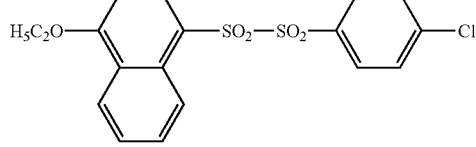
(PAG5-7)

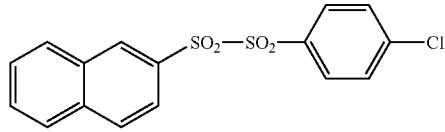
(PAG5-8)

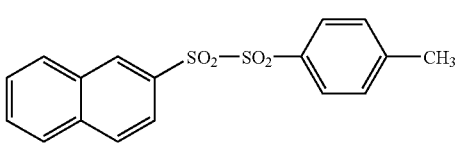
(PAG5-9)

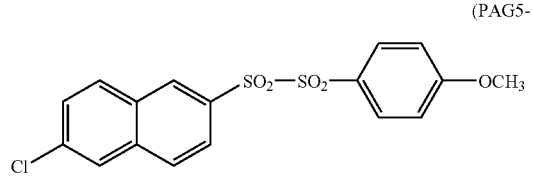
(PAG5-10)

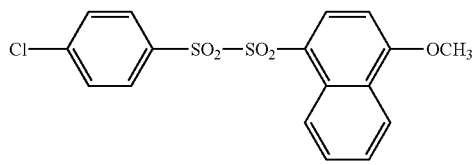
(PAG5-11)

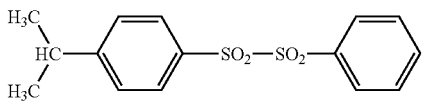
(PAG5-12)

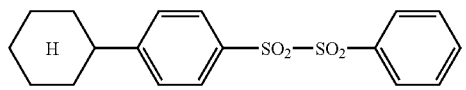
(PAG5-14)

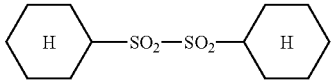
(PAG5-15)

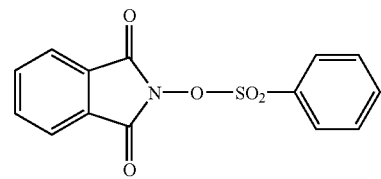
(PAG6-1)

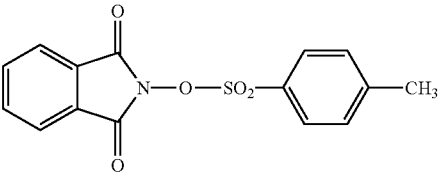
(PAG6-2)

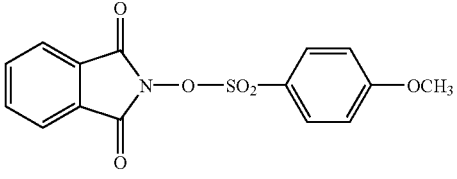
(PAG6-3)

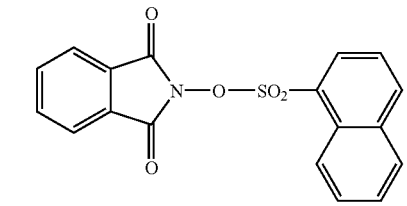
(PAG6-5)

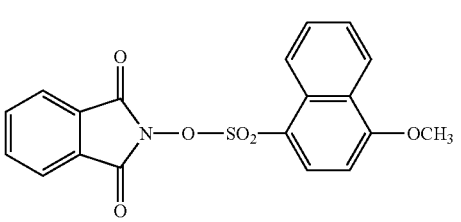
(PAG6-6)

-continued

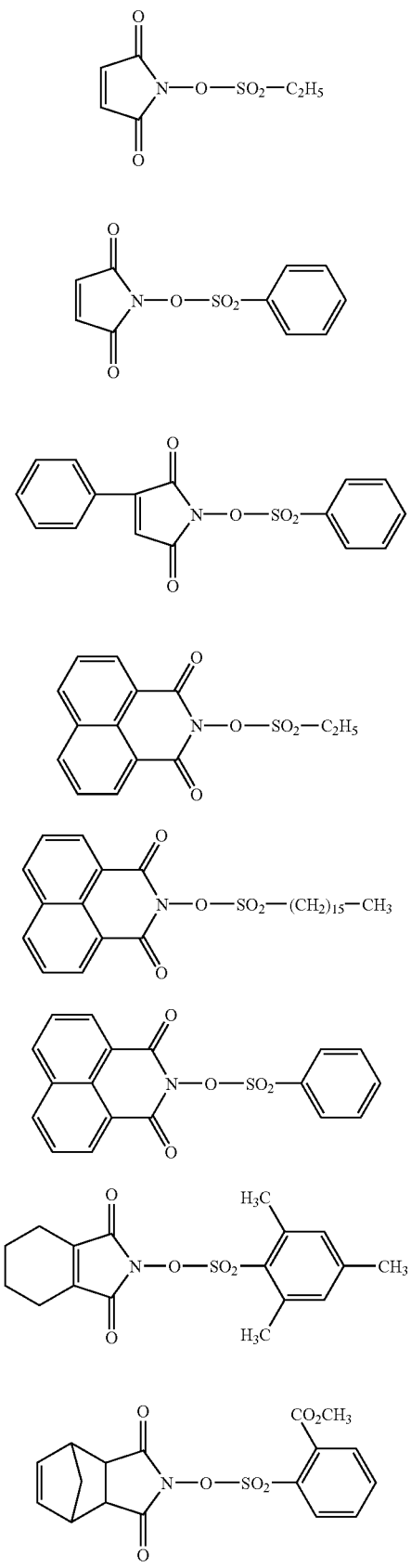

(PAG6-7)
(PAG6-8)
(PAG6-9)
(PAG6-10)
(PAG6-11)
(PAG6-12)
(PAG6-17)
(PAG6-20)

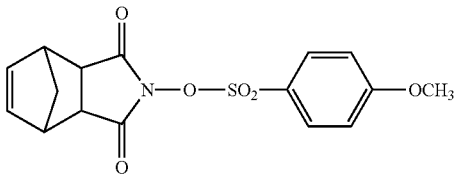

(PAG6-22)

Further, the diazodisulfonate derivative represented by the following formula (PAG7) is also included.

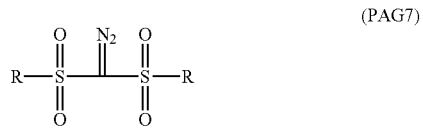

(PAG7)

In the formula, R represents a linear, branched or cyclic alkyl group or an aryl group, which may be substituted.

Specific examples thereof include the following compounds but are not limited to them.

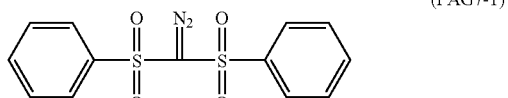

(PAG7-1)

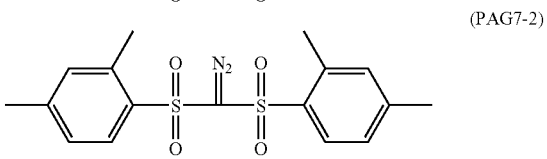

(PAG7-2)

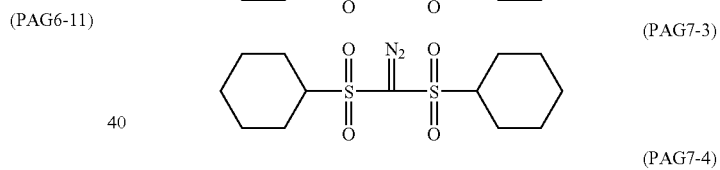

(PAG7-3)

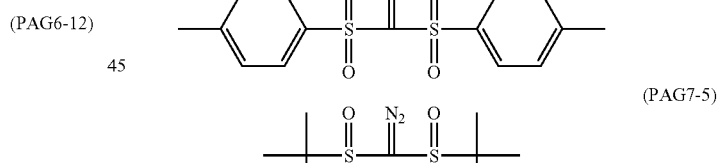

(PAG7-4)

(PAG7-5)

The compounds (B1a) and (B1b) can be synthetically prepared by reaction of aromatic compounds using periodate salt and subjecting the resulting iodonium salt to salt exchange reaction to recover the corresponding sulfonic acid.

Furthermore, the compounds (B1a) and (B1b) can be synthetically prepared by allowing substituted or unsubstituted phenylsulfoxide with aryl Grignard reagent such as aryl magnesium bromide and subjecting the resulting triaryl sulfonium halide to salt exchange reaction with the corresponding sulfonic acid. Still additionally, the compounds (B1a) and (B1b) can be synthetically prepared by a process including a step of the condensation of substituted or unsubstituted phenylsulfoxide with the corresponding aromatic compound, using acid catalysts such as methanesulfonic acid/diphosphorus pentaoxide or aluminium chloride and subsequent salt exchange reaction, or by a process including the condensation of diaryl iodonium salt with diaryl sulfide using catalysts such as copper acetate and a step of salt exchange.

The salt exchange may also be done by a process including a step of once introducing the resulting product into a halide salt and modifying the halide salt into sulfonate salt, using silver reagents such as silver oxide, or by using ion exchange resin for salt exchange. Further, commercially available sulfonic acid or sulfonate salt can be used as the sulfonic acid or sulfonate salt for the salt exchange. Otherwise, the sulfonic acid or sulfonate salt can be recovered by the hydrolysis of commercially available sulfonate halide.

(B2a) Compound Generating Fluorine-Containing Carboxylic Acid by Irradiation of Actinic Ray or Radiation The fluorine-containing carboxylic acid includes aliphatic carboxylic acids substituted with a fluorine atom or aromatic carboxylic acids substituted with a fluorine atom.

The aliphatic carboxylic acids substituted with a fluorine atom include fluorine-substituted aliphatic carboxylic acids such as a fluorine-substituted acetic acid, a propionic acid, a n-butyric acid, an isobutyric acid, a valeric acid, a trimethyl acetate, a caproic acid, a heptanoic acid, a caprylic acid, a pelargonic acid, a capric acid, a lauric acid, a myristic acid, a palmitic acid, a stearic acid, a undecanoic acid, a dodecanoic acid, and a tridecanoic acid. These may or may not have a hydroxyl group, an alkoxyl group and a halogen atom as a substituent. Additionally, the fluorine-substituted aliphatic carboxylic acids preferably contain binding groups such as an oxygen atom, a sulfur atom, a carbonyl group, a carboxyl group and a sulfonyl group.

Preferable fluorine-substituted aliphatic carboxylic acids include those represented by the following formula.

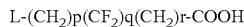

L-(CH$_2$)p(CF$_2$)q(CH$_2$)r-COOH

In the formula, L represents a hydrogen atom or a fluorine atom. p and r each independently represents an integer of 0 to 15. q represents an integer of 1 to 15. The hydrogen atom or fluorine atom in the alkyl chain in the formula may be substituted with an alkyl group (preferably having one to 5 carbon atoms) which may or may not be substituted with fluorine atom, an alkoxyl group which may be substituted with a fluorine atom, or a hydroxyl group.

The fluorine-substituted aliphatic carboxylic acids are preferably fluorine-substituted saturated aliphatic carboxylic acids having preferably 2 to 20, more preferably 4 to 20 carbon atoms. When the carbon number is set at 4 or more, the dispersibility of generated carboxylic acid can be reduced, to suppress more highly the change of the line width over time from exposure to post-heating. Among them, fluorine-substituted linear or branched saturated aliphatic carboxylic acids having 4 to 18 carbon atoms are preferable.

The fluorine-substituted aromatic carboxylic acids are preferably fluorine-substituted aromatic carboxylic acids having 7 to 20, preferably 7 to 15, more preferably 7 to 11 carbon atoms, specifically including fluorine-substituted aromatic carboxylic acids such as fluorine-substituted benzoic acid, substituted benzoic acids, naphthoic acid, substituted naphthoic acids, anthracenecarboxylic acid, and substituted anthracenecarboxylic acids (herein, the substituents include an alkyl group, an alkoxyl group, a hydroxyl group, a halogen atom, an aryl group, an acyl group, an acyloxy group, a nitro group, an alkylthio group, and an arylthio group).

Among them, fluorine-substituted benzoic acid and substituted benzoic acids are preferable.

In these fluorine-substituted aliphatic or aromatic carboxylic acids, one or more hydrogen atoms in the backbone except for a carboxyl group are substituted with a fluorine atom. Particularly preferable are aliphatic or aromatic carboxylic acids wherein all the hydrogen atoms in the backbone except for a carboxyl group are substituted with a fluorine atom (a perfluoro-saturated aliphatic carboxylic acid or a perfluoro-aromatic carboxylic acid) Accordingly, the sensitivity can be greatly improved.

Herein, the aliphatic carboxylate anion, particularly such anion with fluorine atom at the α-carbon atom of carboxylic acid has strong acidity. Additionally, perfluoro-aliphatic carboxylic acid has stronger acidity.

The compound generating fluorine-containing carboxylic acid under irradiation of actinic ray or radiation includes onium compounds (sulfonium salt, iodonium salt and the like), containing the anion of the fluorine-substituted aliphatic or aromatic carboxylic acid as the counter anion, imidocarboxylate compounds having carboxylate ester, or nitrobenzyl ester compounds or the like.

More preferably, the compound generating fluorine-containing carboxylic acid under irradiation of actinic ray or radiation includes those represented by the following formulas (I) to (III). These can improve the sensitivity, resolution and exposure margin more greatly.

The compound is decomposed by irradiation of actinic ray or radiation, to generate a saturated aliphatic or aromatic carboxylic acid wherein the carboxylic acid is substituted with at least one fluorine atom, which corresponds to X$^-$ in the formulas (I) to (III).

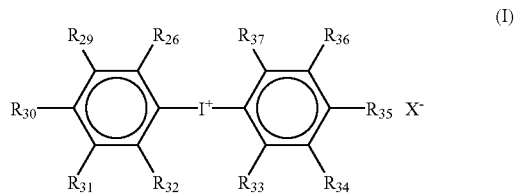

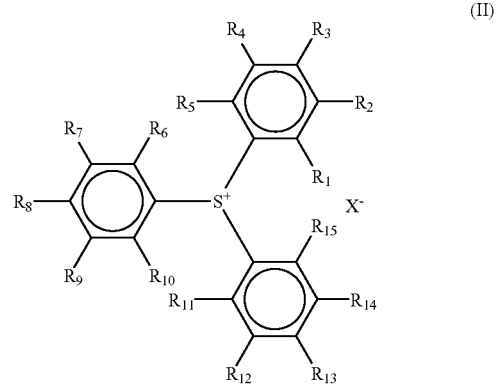

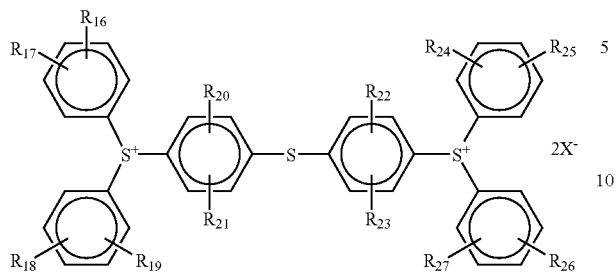

(III)

In the formulae, $R_1$ to $R_{37}$ each independently represents a hydrogen atom, a linear, branched or cyclic alkyl group, a linear, branched or cyclic alkoxyl group, a hydroxyl group, a halogen atom or —S—$R_{38}$ group. Herein, $R_{38}$ represents a linear, branched or cyclic alkyl group or an aryl group. $X^-$ is the anion of aliphatic or aromatic carboxylic acid substituted with at least one fluorine atom.

$X^-$ is preferably the anion of a perfluoro-aliphatic carboxylic acid or a perfluoro-aromatic carboxylic acid, particularly preferably the anion of a fluorine-substituted alkylcarboxylic acid having 4 or more carbon atoms.

The linear or branched alkyl group as $R_1$ to $R_{38}$ in the general formula (I) to (III) includes alkyl groups having one to 4 carbon atoms, which may be substituted, and includes for example a methyl group, an ethyl group, a propyl group, a n-butyl group, a sec-butyl group and a t-butyl group. The cyclic alkyl group includes a cyclic alkyl groups having 3 to 8 carbon atoms, which may be substituted, such as a cyclopropyl group, a cyclopentyl group, and a cyclohexyl group.

The alkoxyl group as $R_1$ to $R_{37}$ includes alkoxyl groups having one to 4 carbon atoms, such as a methoxy group, an ethoxy group, a hydroxyethoxy group, a propoxy group, a n-butoxy group, an isobutoxy group, a sec-butoxy group and a t-butoxy group.

The halogen atom as $R_1$ to $R_{37}$ includes a fluorine atom, a chlorine atom, a bromine atom and an iodine atom.

The aryl group as $R_{38}$ includes aryl groups having 6 to 14 carbon atoms, such as a phenyl group, a tolyl group, a methoxyphenyl group, and a naphthyl group. The aryl group may have a substituent.

These substituents preferably include an alkoxyl group having one to 4 carbon atoms, a halogen atom (a fluorine atom, a chlorine atom, an iodine atom), an aryl group having 6 to 10 carbon atoms, an alkenyl group having 2 to 6 carbon atoms, a cyano group, a hydroxyl group, a carboxyl group, an alkoxycarbonyl group and a nitro group.

The iodonium compound or sulfonium compound represented by the formulae (I) to (III) for use in accordance with the invention has the anion of at least one fluorine-substituted saturated aliphatic or aromatic carboxylic acid as the paired anion $X^-$. Such anion is the anion (—COO$^-$) derived from a carboxyl group (—COOH), as prepared by eliminating a hydrogen atom from a carboxyl group.

Specific examples are shown below. The invention is not limited to these examples.

Specific examples (I-1f) to (I-36f) of the optical acid generator represented by the formula (I).

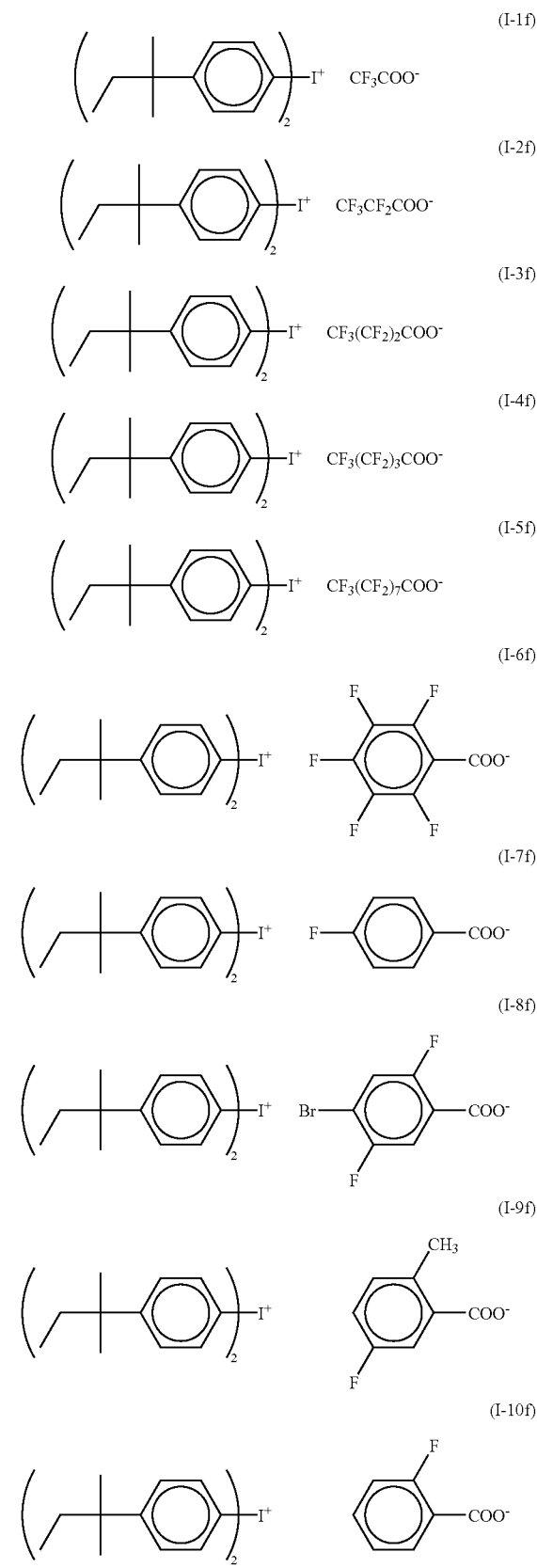

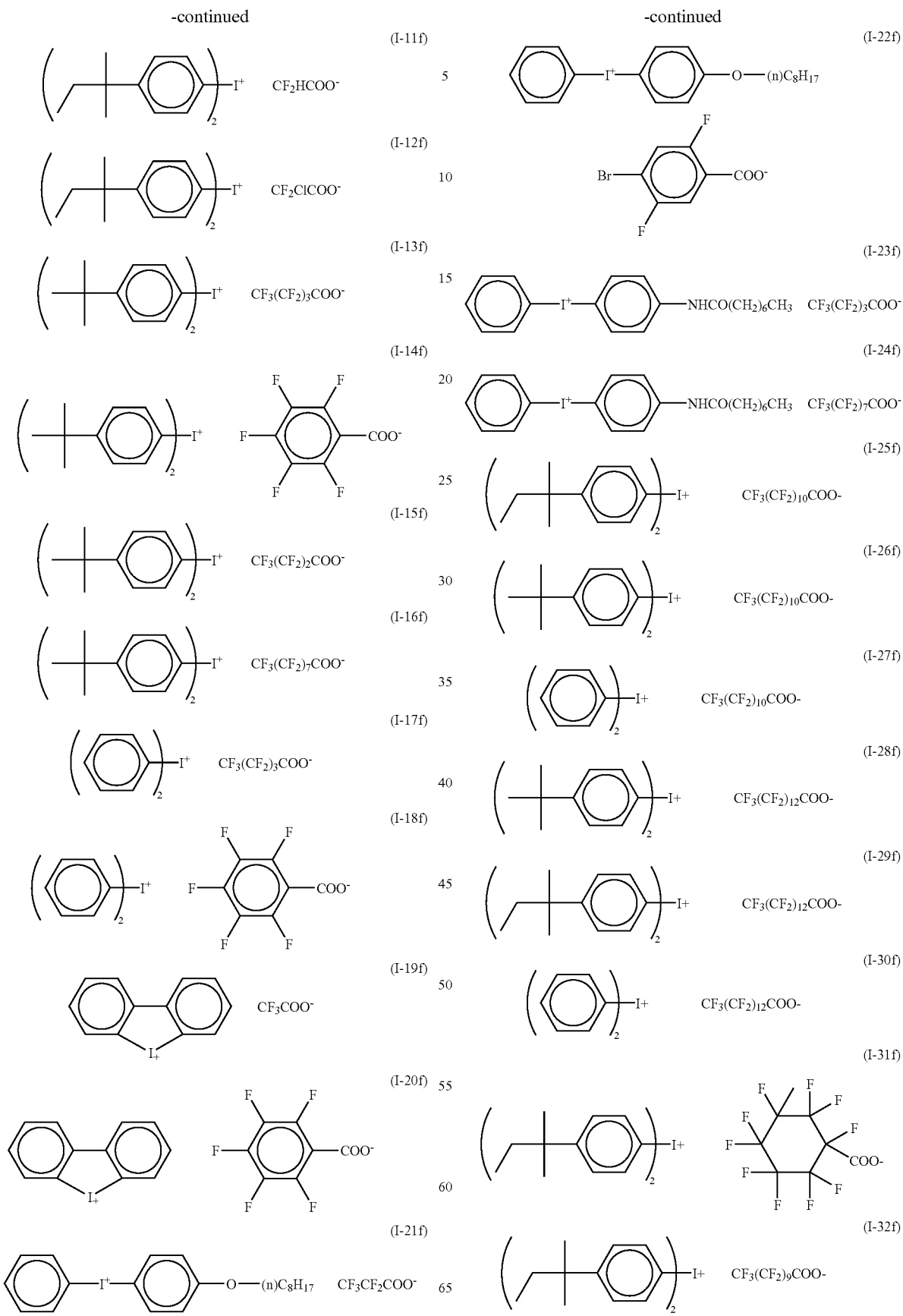

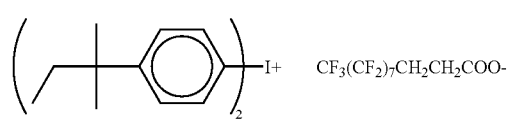 (I-33f)
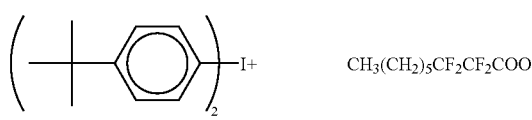 (I-34f)
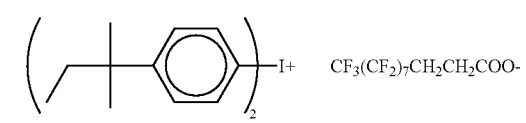 (I-35f)
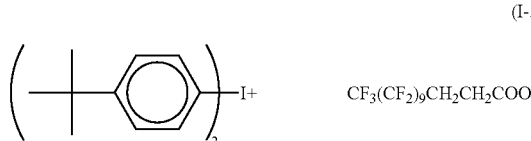 (I-36f)
Specific examples (II-1f) to (II-67f) of the optical acid generator represented by the formula (II).
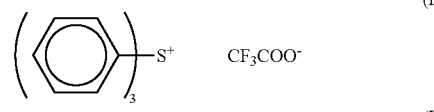 (II-1f)
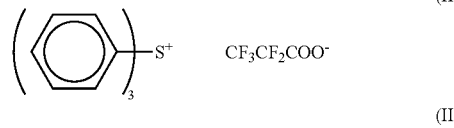 (II-2f)
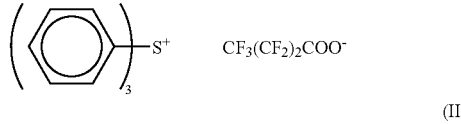 (II-3f)
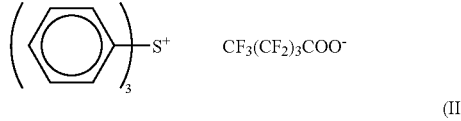 (II-4f)
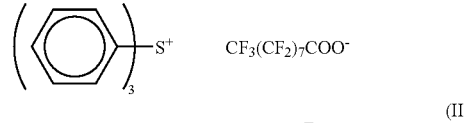 (II-5f)
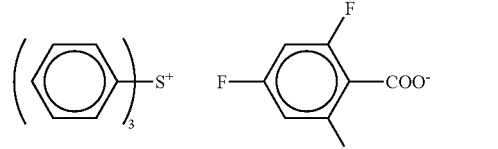 (II-6f)
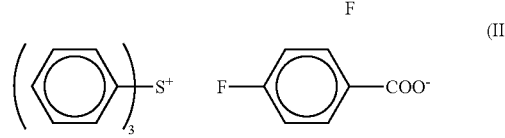 (II-7f)
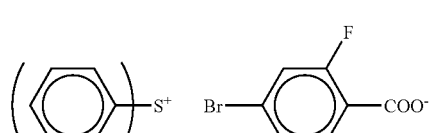 (II-8f)
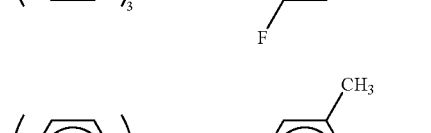 (II-9f)
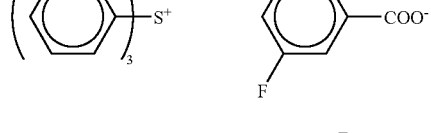 (II-10f)
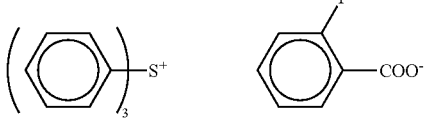 (II-11f)
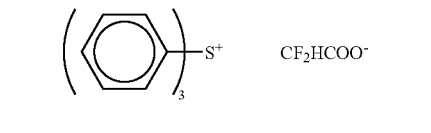 (II-12f)
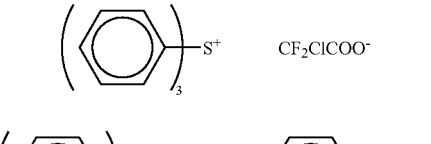 (II-13f)
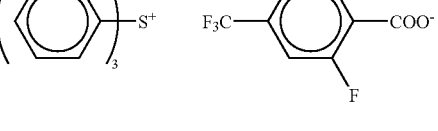 (II-14f)
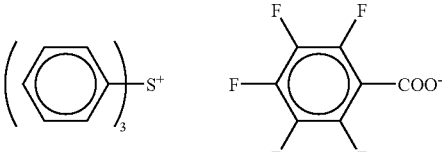 (II-15f)
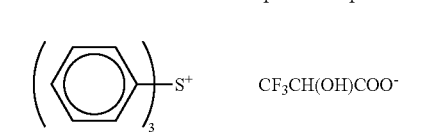 (II-16f)
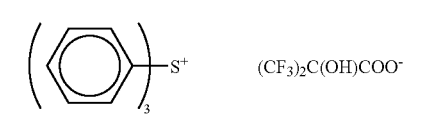 (II-17f)
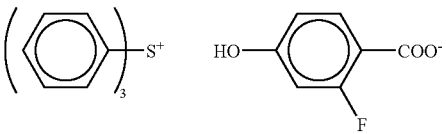 (II-18f)

-continued
(II-19f) 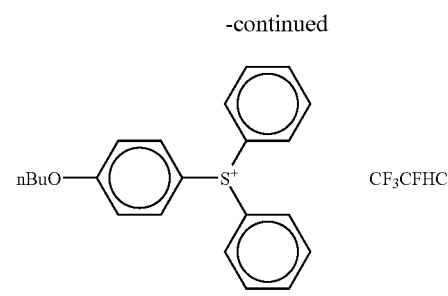 CF₃CFHCOO⁻
(II-20f) nBuO-C₆H₄-S⁺(Ph)₂  2,3,4-trifluorobenzoate
(II-21f) 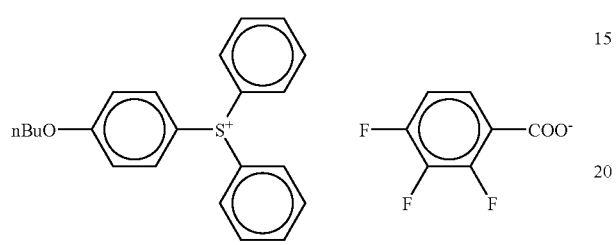 CF₃(CF₂)₂COO⁻
(II-22f) 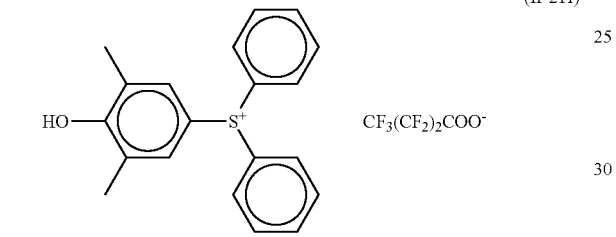 CF₃(CF₂)₃COO⁻
(II-23f) 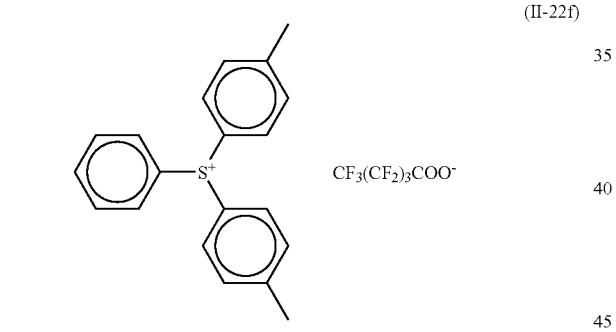 CF₃COO⁻
(II-24f) 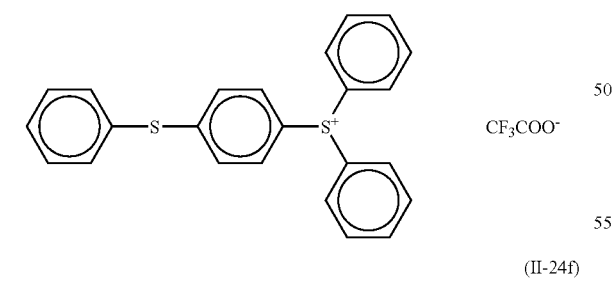 CF₃(CF₂)₃COO⁻
-continued
(II-25f) 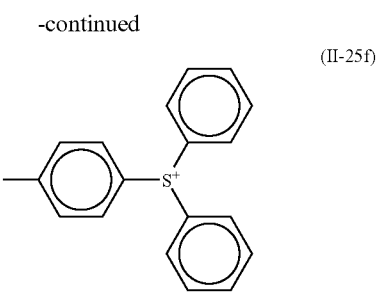
(II-26f) pentafluorobenzoate
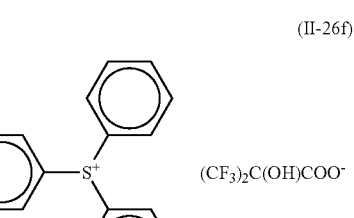 (CF₃)₂C(OH)COO⁻
(II-27f) CF₃(CF₂)₇COO⁻
(II-28f) CF₃(CF₂)₂COO⁻
(II-29f) MeO/MeO-C₆H₃-S⁺(Ph)₂  CF₂ClCOO⁻

-continued
(II-30f) 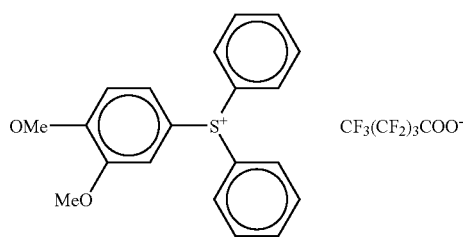
(II-31f) 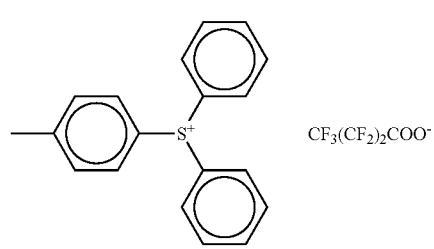
(II-32f) 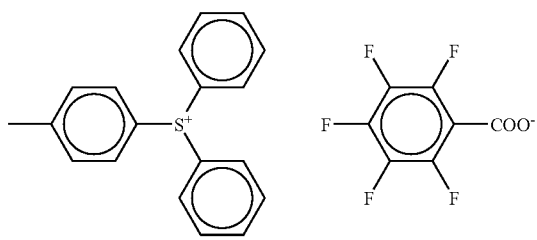
(II-33f) 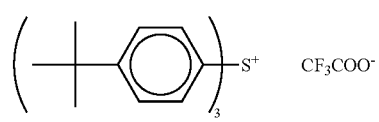
(II-34f) 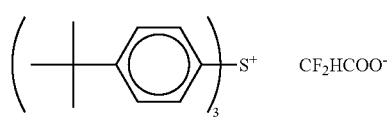
(II-35f) 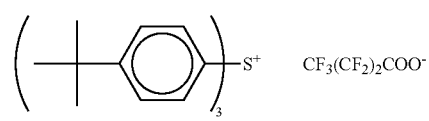
(II-36f) 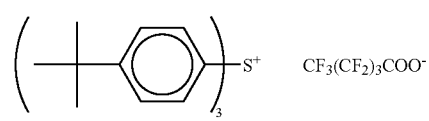
(II-37f) 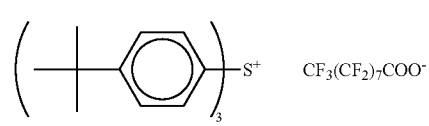
(II-38f) 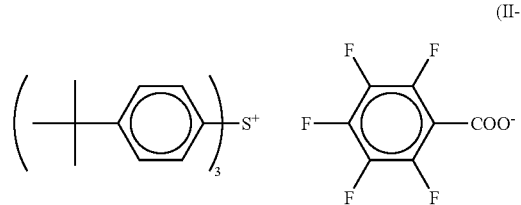
(II-39f) 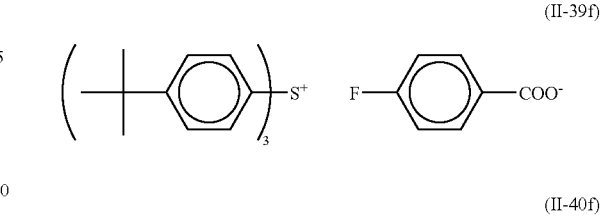
(II-40f) 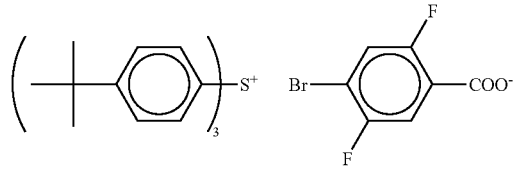
(II-41f) 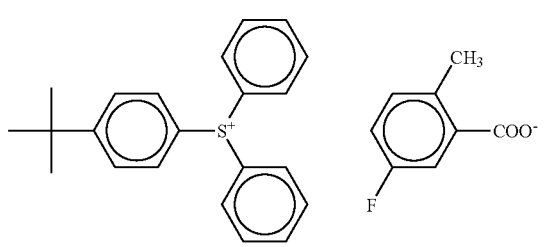
(II-42f) 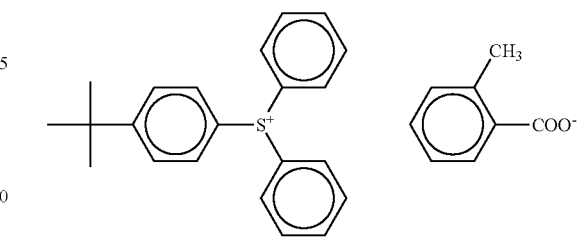
(II-43f) 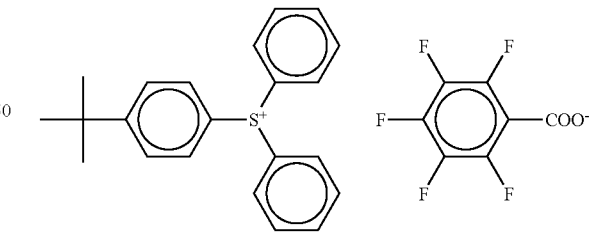
(II-44f) 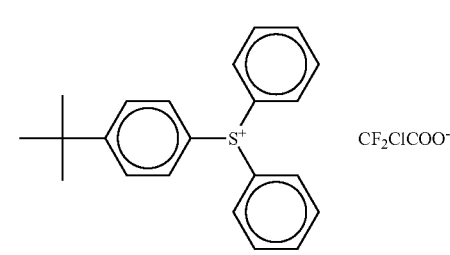

(II-45f)
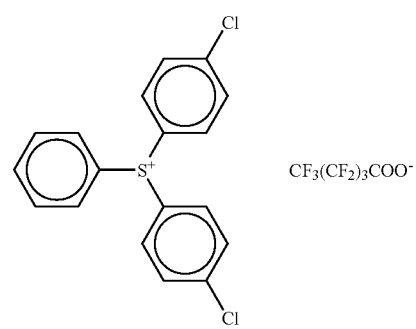
CF$_3$(CF$_2$)$_3$COO$^-$
(II-46f)
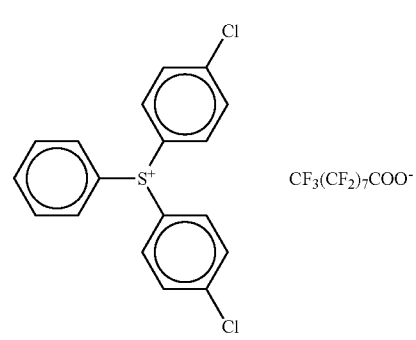
CF$_3$(CF$_2$)$_7$COO$^-$
(II-47f)
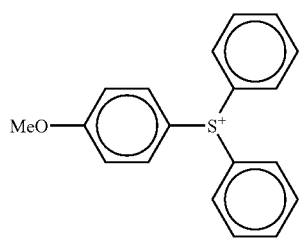 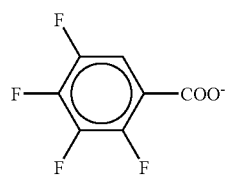
(II-48f)
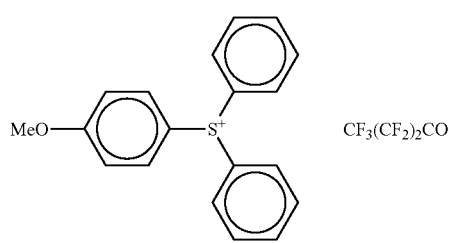
CF$_3$(CF$_2$)$_2$COO$^-$
(II-49f)
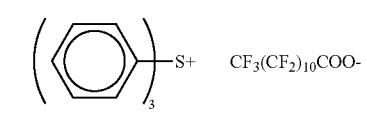 CF$_3$(CF$_2$)$_{10}$COO-
(II-50f)
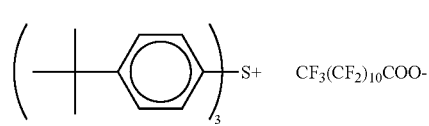 CF$_3$(CF$_2$)$_{10}$COO-
(II-51f)
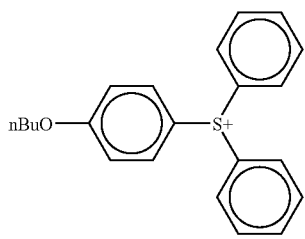 CF$_3$(CF$_2$)$_{10}$COO-
(II-52f)
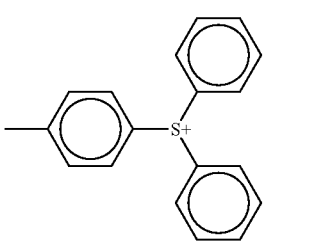 CF$_3$(CF$_2$)$_{10}$COO-
(II-53f)
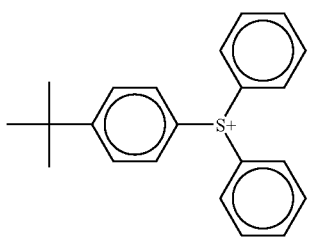 CF$_3$(CF$_2$)$_{10}$COO-
(II-54f)
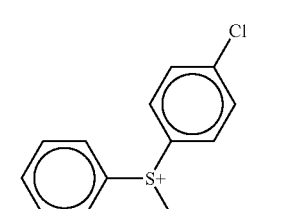 CF$_3$(CF$_2$)$_{10}$COO-
(II-55f)
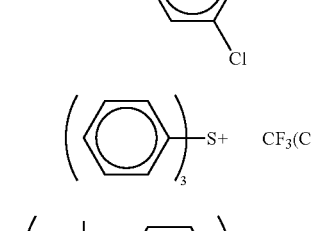 CF$_3$(CF$_2$)$_{12}$COO-
(II-56f)
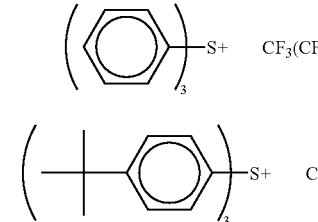 CF$_3$(CF$_2$)$_{12}$COO-
(II-57f)
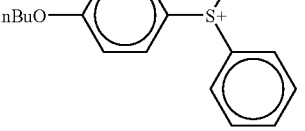 CF$_3$(CF$_2$)$_{12}$COO- (II-58f)
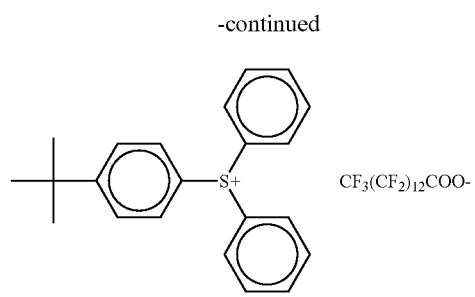
(II-59f)
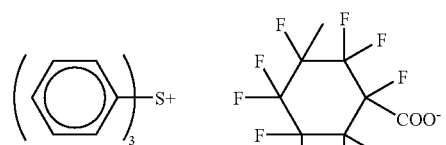
(II-60f)
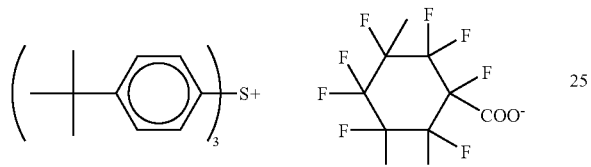
(II-61f)
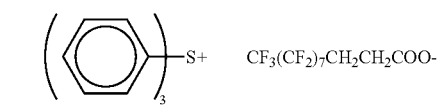
(II-62f)
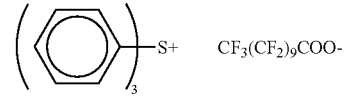
(II-63f)
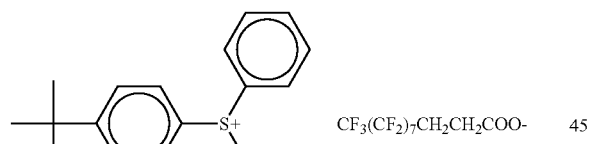
(II-64f)
(II-65f)
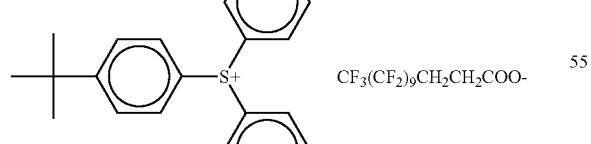
(II-66f)
(II-67f)
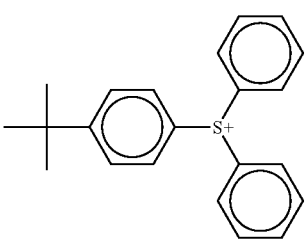
Specific examples (III-1f) to (III-4f) of the photo acid generator represented by the formula (III).
(III-1f)
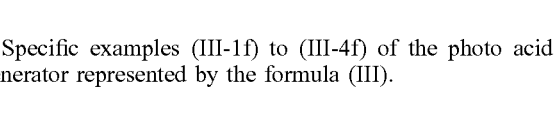
(III-2f)
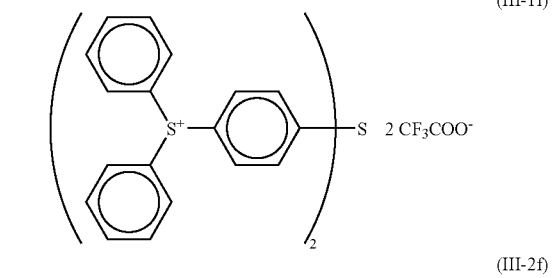
(III-3f)
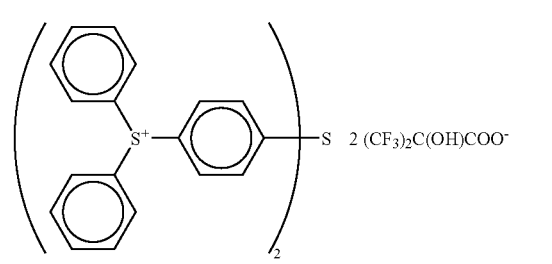
(III-4f)
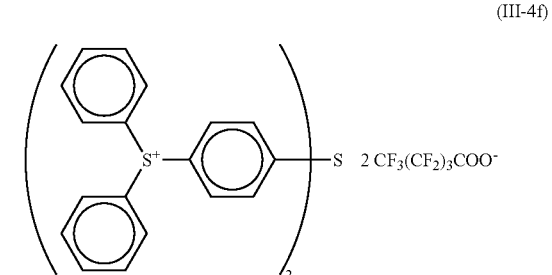

Specific examples (IV-1f) to (V-4f) of other photo acid generators.

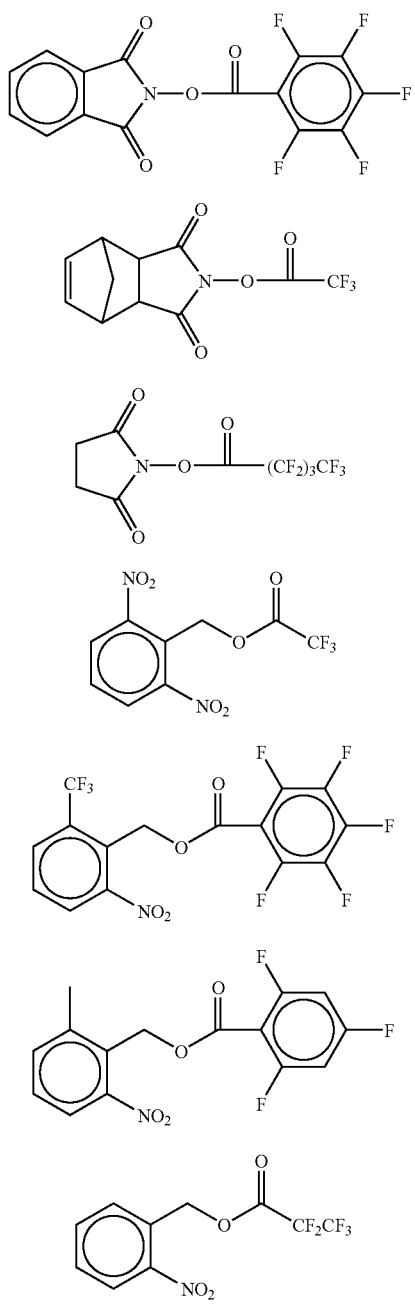

The compound represented by the formula (I) can be synthetically prepared by reaction of aromatic compounds using periodate salt and subjecting the resulting iodonium salt to salt exchange reaction to recover the corresponding carboxylic acid.

The compounds represented by the formulae (II) and (III) can be synthetically prepared by allowing substituted or unsubstituted phenylsulfoxide to react with aryl Grignard reagent such as aryl magnesium bromide and subjecting the resulting triaryl sulfonium halide to salt exchange reaction with the corresponding carboxylic acid. Still additionally, the compounds can be synthetically prepared by a method including a step of the condensation of substituted or unsubstituted phenylsulfoxide with the corresponding aromatic compound, using acid catalysts such as methanesulfonic acid/diphosphorus pentaoxide or aluminium chloride and a subsequent step of salt exchange reaction, or by a method including a step of the condensation of diaryl iodonium salt with diaryl sulfide using catalysts such as copper acetate and a subsequent step of salt exchange.

The salt exchange may also be done by a method including a step of once introducing the resulting product into a halide salt and modifying the halide salt into sulfonate salt, using silver reagents such as silver oxide, or by a method using ion exchange resin. Further, commercially available carboxylic acid or carboxylate salt can be used as the carboxylic acid or carboxylate salt for the salt exchange. Otherwise, the carboxylic acid or carboxylate salt can be recovered by the hydrolysis of commercially available carboxylic acid halide.

As the fluorine-substituted carboxylic acid as the anion moiety, fluorine-substituted carboxylic acid introduced from fluoro-aliphatic compounds produced by telomerization method (also called telomer method) or oligomerization method (also called oligomer method) is also preferably used. The method for producing these fluoro-aliphatic compounds is described in for example, "Synthesis and Function of Fluorine Compounds", (edited by Nobuo Ishikawa; issued by CMC K. K., 1987), p. 117 to 118 and "Chemistry of Organic Fluorine Compounds II" (Monograph 187; edited by Milos Hudlicky and Attila E. Pavlath, American Chemical Society, 1995), p. 747 to 752. The telomerization method is a method for synthetically preparing telomer, including a step of the radical polymerization of fluorine-containing vinyl compounds such as tetrafluoroethylene, using an alkyl halide with a large chain transfer constant such as iodide as the telogen (Scheme-1 shows one example). The synthesis by the telomer method produces plural compounds with different carbon chain lengths in mixture. The mixture may be used as it is or may be used after purification.

(B2b) Compound Generating no Fluorine-Containing Carboxylic Acid by Irradiation of Actinic Ray or Radiation The compound generating no fluorine-containing carboxylic acid by irradiation of actinic ray or radiation includes for example compounds represented by the following formulae (AI) to (AV).

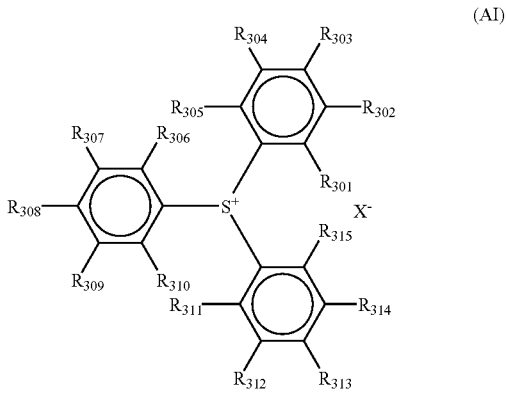

-continued

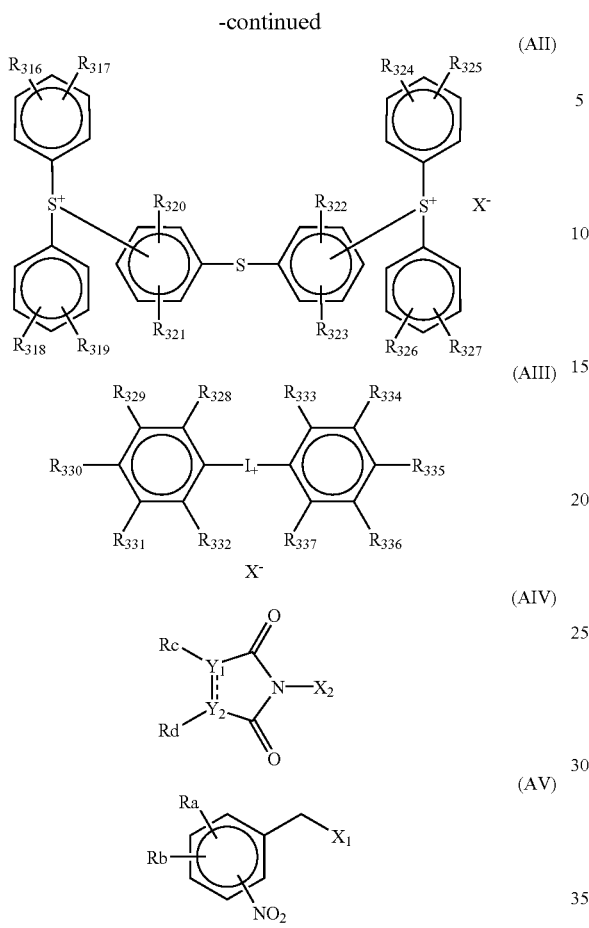

(AII)

(AIII)

(AIV)

(AV)

In the general formulae, $R_{301}$ to $R_{337}$ each independently represents a hydrogen atom, a linear, branched or cyclic alkyl group, a linear, branched or cyclic alkoxyl group, a hydroxyl group, a halogen atom, or —S—$R_0$ group. $R_0$ represents a linear, branched or cyclic alkyl group or an aryl group.

Ra and Rb each independently represents a hydrogen atom, a nitro group, a halogen atom, an alkyl group or an alkoxyl group, which may have a substituent. Rc and Rd each independently represents a halogen atom, an alkyl group or an alkoxyl group, which may have a substituent. Rc and Rd may be bonded each other to form an aromatic, monocyclic or polycyclic hydrocarbon (which may contain an oxygen atom or a nitrogen atom in these rings). $Y_1$ and $Y_2$ represent a carbon atom and the $Y_1$—$Y_2$ bond may be a single bond or a double bond. $X^-$ represents the anion form of carboxylate compounds represented by the following formulae. $X_1$ and $X_2$ each independently represents the carboxylate compounds represented by the formulae, as modified at their carboxyl groups into ester group.

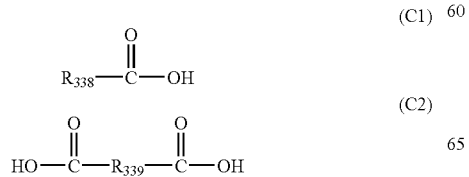

(C1)

(C2)

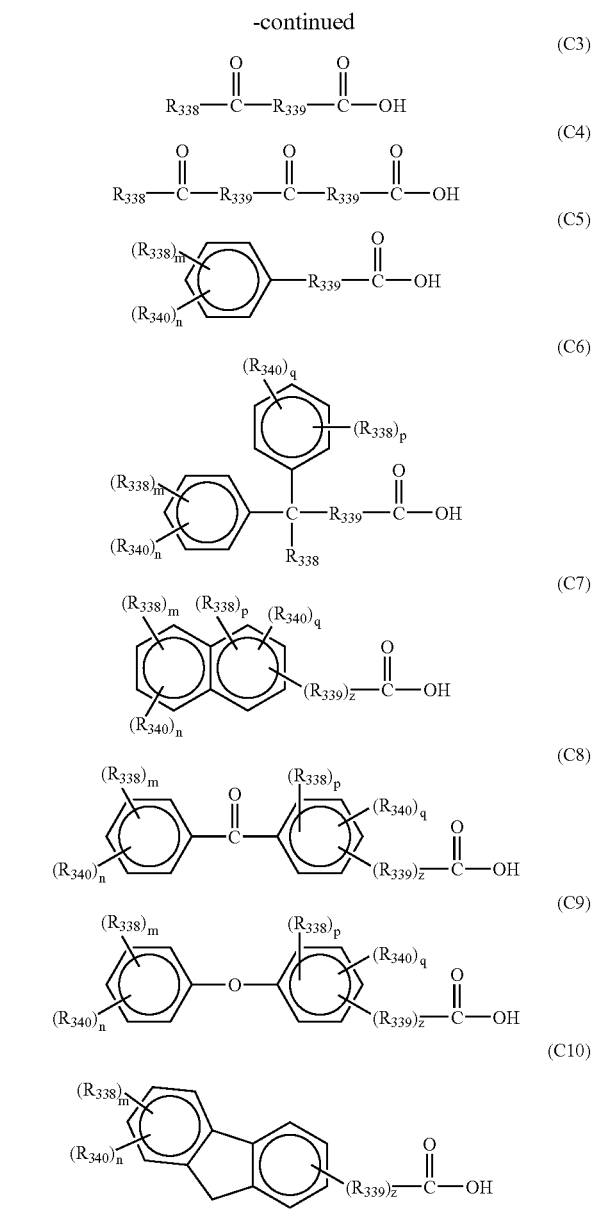

(C3)

(C4)

(C5)

(C6)

(C7)

(C8)

(C9)

(C10)

In the formulae, $R_{338}$ represents a linear, branched or cyclic alkyl group having one to 30 carbon atoms (herein, the alkyl group may contain an oxygen atom and a nitrogen atom in the chains of the alkyl group), a linear, branched or cyclic alkenyl group having one to 20 carbon atoms, a linear, branched or cyclic alkynyl group having one to 20 carbon atoms, a linear, branched or cyclic alkoxyl group having one to 20 carbon atoms, the aforementioned alkyl group in which at least a part of the hydrogen atoms in the alkyl group is substituted with a halogen atom and/or a hydroxyl group, the aforementioned alkenyl group in which at least a part of the hydrogen atoms in the alkenyl group is substituted with a halogen atom and/or hydroxyl group, or an aryl group having 6 to 20 carbon atoms, which may be substituted. Herein, the substituents for the aryl group include an alkyl group, a nitro group, a hydroxyl group, an alkoxyl group, an acyl group, an alkoxycarbonyl group, and a halogen atom.

$R_{339}$ represents a single bond, a linear, branched or cyclic alkylene group having one to 20 carbon atoms (herein, the alkylene group may contain an oxygen atom and a nitrogen atom in the chains of the alkylene group), a linear, branched or cyclic alkenylene group having one to 20 carbon atoms, the aforementioned alkylene group in which at least a part of the hydrogen atoms in the alkylene group is substituted with a halogen atom and/or a hydroxyl group, the aforementioned alkenylene group in which at least a part of the hydrogen atoms in the alkenylene group is substituted with a halogen atom, or an alkoxyalkylene group having 2 to 20 carbon atoms. $R_{338}$ and $R_{339}$ may be the same or different when they exist plurally.

$R_{340}$ represents a hydroxyl group or a halogen atom. $R_{340}$ may be the same or different when they exist plurally. m, n, p and q each independently represents an integer of 0 to 3, provided that $m+n \leq 5$ and $p+q \leq 5$. z is 0 or 1.

The linear and branched alkyl group as $R_{301}$ to $R_{337}$, Ra, Rb, Rc, Rd and Ro in the formulae (AI) to (AV) includes alkyl groups having one to 4 carbon atoms, such as a methyl group, an ethyl group, a propyl group, a n-butyl group, a sec-butyl group, and a t-butyl group, which may be substituted. The cyclic alkyl group includes cyclic alkyl groups having 3 to 8 carbon atoms, such as a cyclopropyl group, a cyclopentyl group and a cyclohexyl group, which may be substituted.

The alkoxyl group as $R_{301}$ to $R_{337}$, Ra and Rb includes alkoxyl groups having one to 4 carbon atoms, such as a methoxy group, an ethoxy group, a hydroxyethoxy group, a propoxy group, a n-butoxy group, an isobutoxy group, a sec-butoxy group, and a t-butoxy group.

The halogen atom as $R_{301}$ to $R_{337}$, Ra, Rb, Rc, Rd and $R_0$ includes a fluorine atom, a chlorine atom, a bromine atom and an iodine atom.

The aryl group as $R_0$, Rc and Rd includes aryl groups having 6 to 14 carbon atoms, such as a phenyl group, a tolyl group, a methoxyphenyl group and a naphthyl group, which may be substituted.

Preferably, these substituents include for example alkoxyl groups having one to 4 carbon atoms, a halogen atom (a fluorine atom, a chlorine atom, an iodine atom), aryl groups having 6 to 10 carbon atoms, alkenyl groups having 2 to 6 carbon atoms, a cyano group, a hydroxyl group, a carboxyl group, an alkoxycarbonyl group, and a nitro group.

The aromatic, monocyclic or polycyclic hydrocarbons (which may contain an oxygen atom and a nitrogen atom in these rings) formed by bonding Rc and Rd include for example benzene structure, naphthalene structure, cyclohexane structure, norbornene structure and oxabicyclo structure.

The sulfonium and iodonium compounds represented by the formulae (AI) to (AIII) for use in accordance with the invention include as the paired anion $X^-$ the carboxylate compounds represented by the formulae (C1) to (C10), wherein the carboxyl group in at least one of the compounds is modified as anion (—COO$^-$).

The compounds represented by the formulae (AIV) to (AV) for use in accordance with the invention include as the substituents $X_1$ and $X_2$ the ester group (—COO$^-$) modified from the carboxyl group (—COOH) in at least one of the compounds among the carboxylate compounds represented by the formulae (C1) to (C10).

The linear, branched or cyclic alkyl group having one to 30 carbon atoms (which may or may not contain oxygen atom and nitrogen atom in the chains of the alkyl group) as $R_{338}$ includes for example methyl, ethyl, propyl, butyl, pentyl, hexyl, cyclohexyl, dodecyl, 1-ethoxyethyl and adamantyl.

The linear, branched or cyclic alkenyl group with one to 20 carbon atoms includes for example ethenyl, propenyl, isopropenyl and cyclohexenyl.

The linear, branched or cyclic alkynyl group having one to 20 carbon atoms includes for example an acetylene and a propenylene.

The linear, branched or cyclic alkoxyl group having one to 20 carbon atoms includes for example methoxy, ethoxy, propyloxy, butoxy, cyclohexyloxy, isobutoxy, and dodecyloxy.

The linear, branched or cyclic aryl group having 6 to 20 carbon atoms, which may be substituted, includes for example phenyl, naphthyl and anthryl. The substituents for the aryl group include for example an alkyl group, a nitro group, a hydroxyl group, an alkoxyl group, an acyl group, an alkoxycarbonyl group and a halogen atom.

The linear, branched or cyclic alkylene group having one to 20 carbon atoms (which may contain an oxygen atom and a nitrogen atom in the chains of the alkylene group) as $R_{339}$ includes for example methylene, ethylene, propylene, butylene, isobutylene, ethoxyethylene, and cyclohexylene.

The linear, branched or cyclic alkenylene group having one to 20 carbon atoms includes for example vinylene and arylene.

Specific examples are now described below. The invention is never limited to the examples.

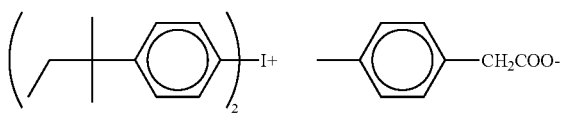

(I-1)

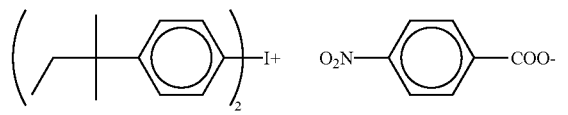

(I-2)

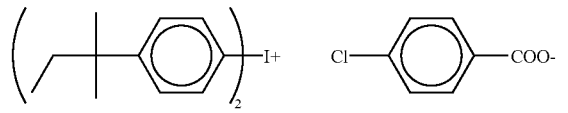

(I-3)

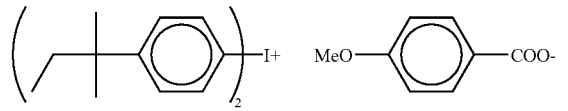

(I-4)

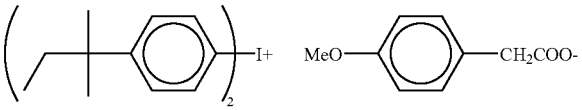

(I-5)

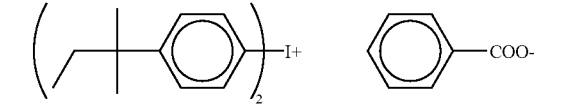

(I-6)

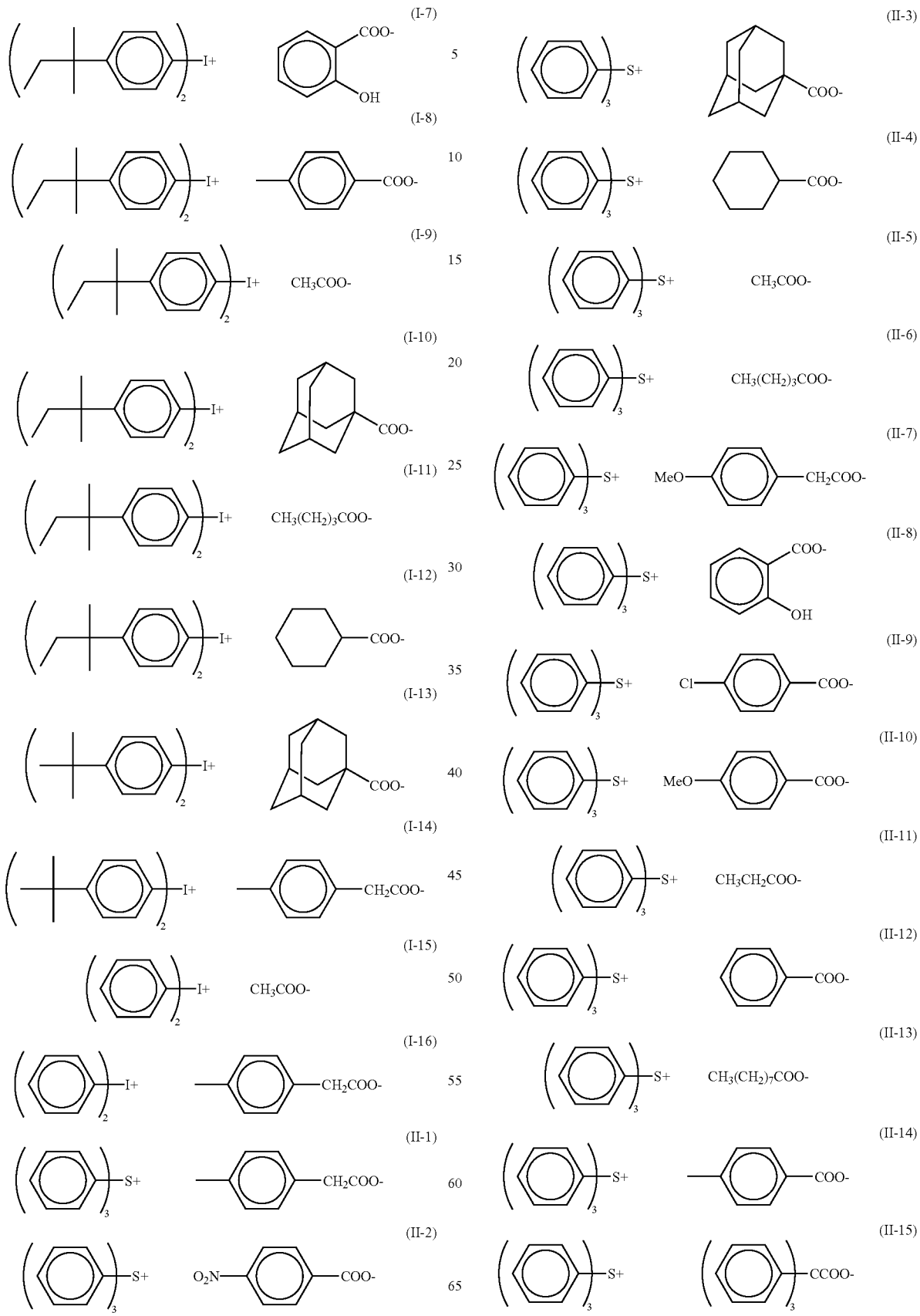

(II-16) 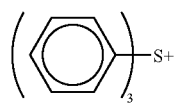 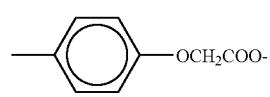
(II-17) 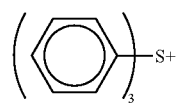 
(II-18) 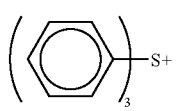 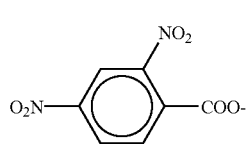
(II-19) 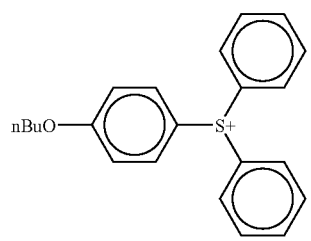 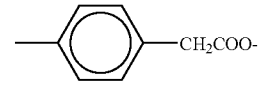
(II-20) 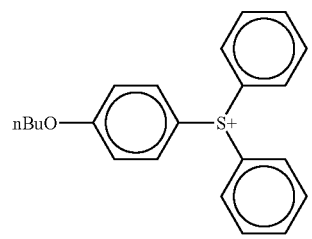 
(II-21) 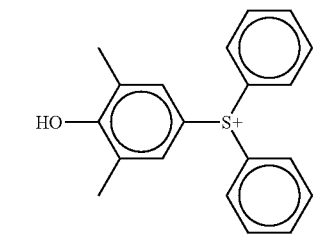 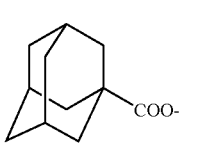
(II-22) 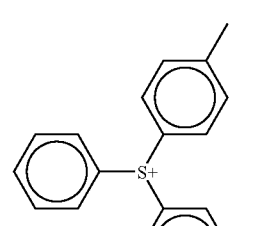 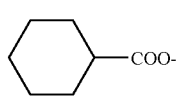
(II-23) 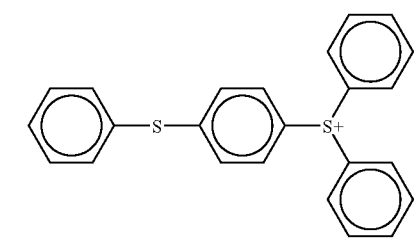 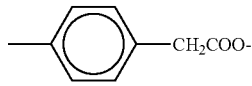
(II-24) 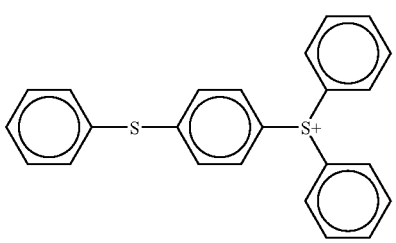 
(II-25) 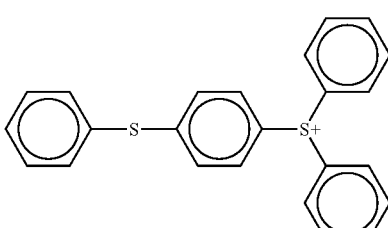 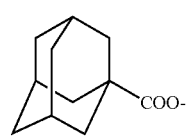
(II-26) 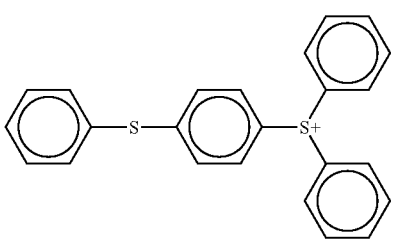 
(II-27) 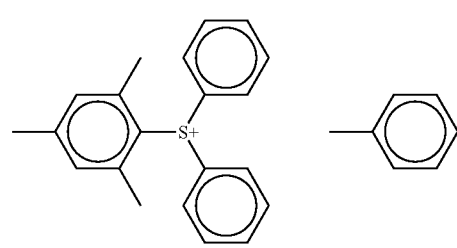 

-continued
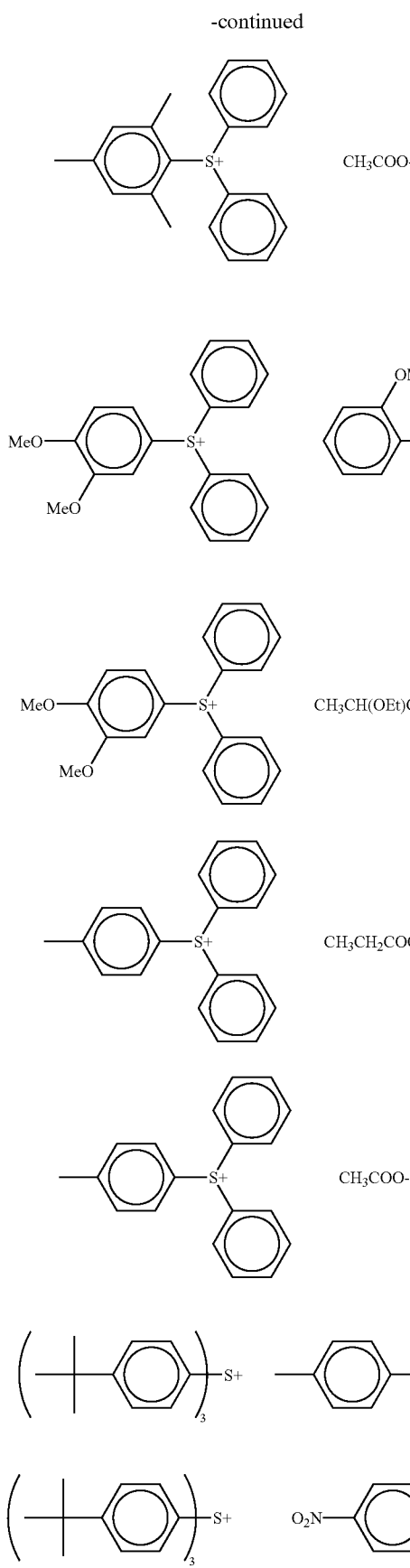
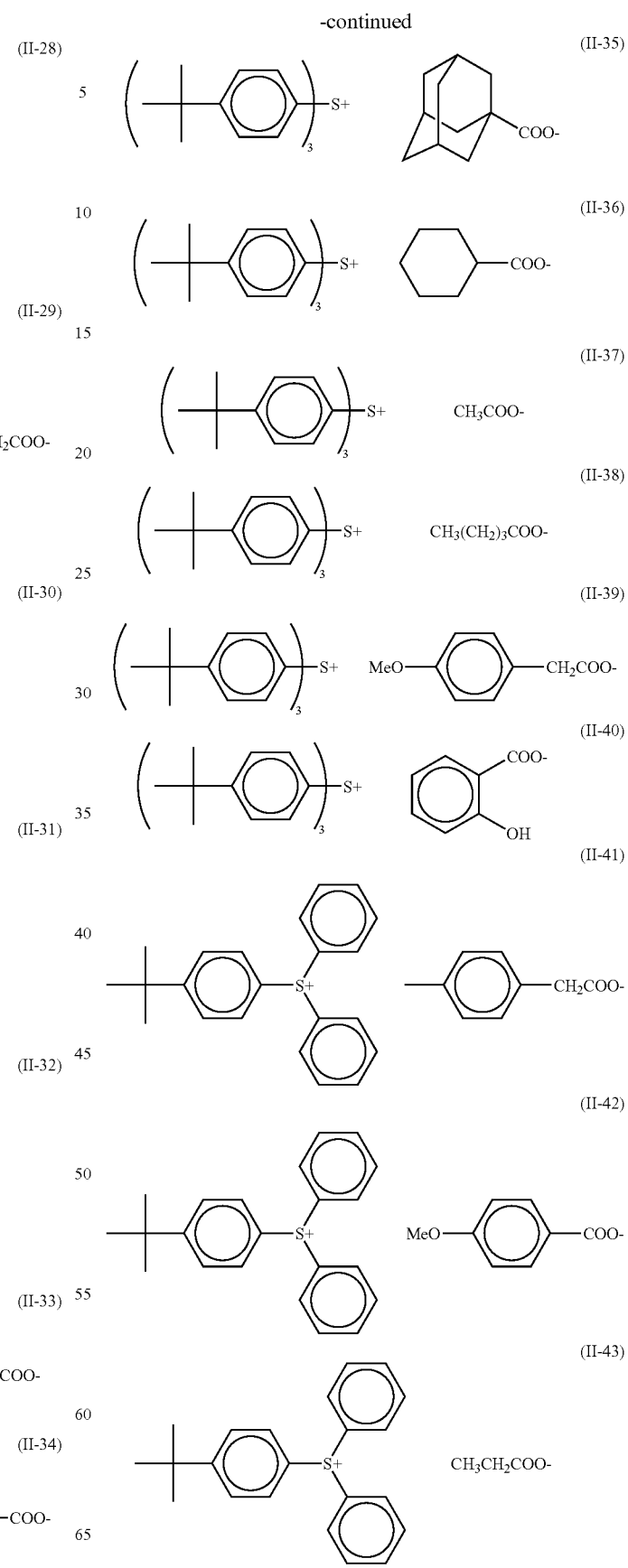

(II-44)
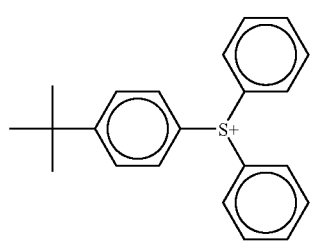 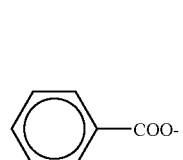
(II-45)
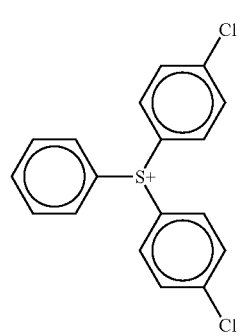 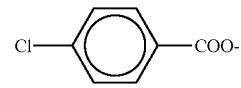
(II-46)
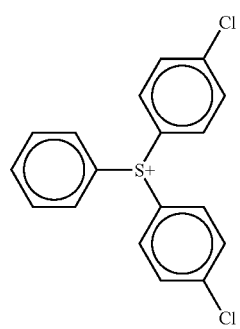 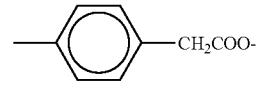
(II-47)
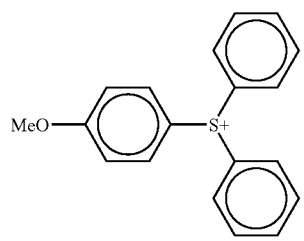 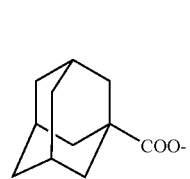
(II-48)
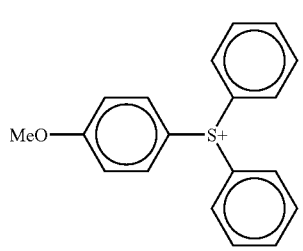 CH₃COO- 
(III-1)
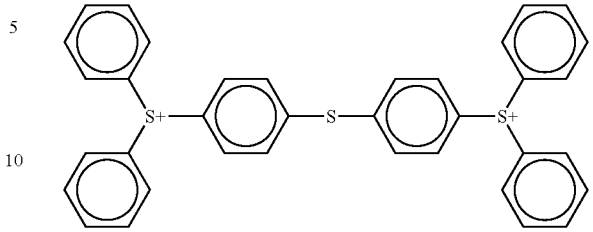
$$2\left(\text{}\right)$$
(III-2)
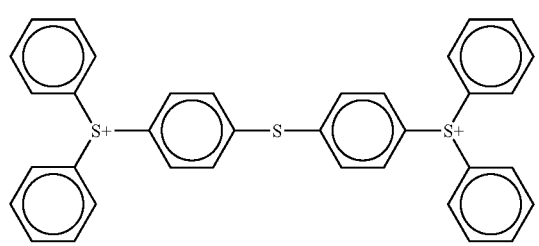
2CH₃COO-
(IV-1)
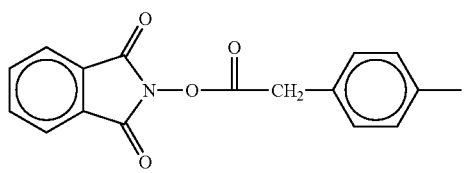
(IV-2)
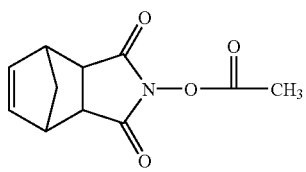
(IV-3)
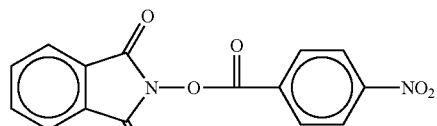
(IV-4)
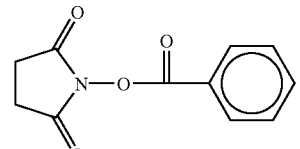
(V-1)
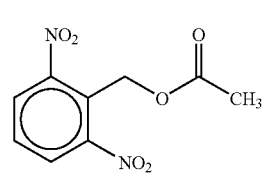

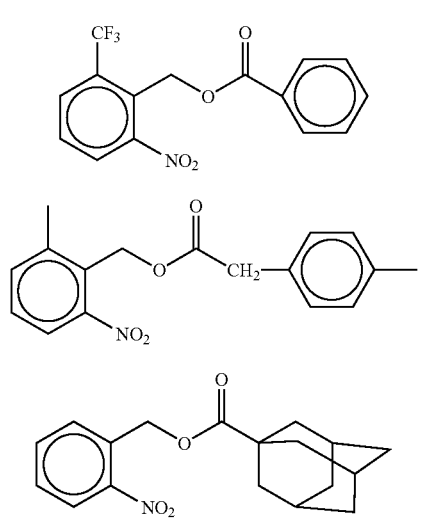

(V-2)
(V-3)
(V-4)

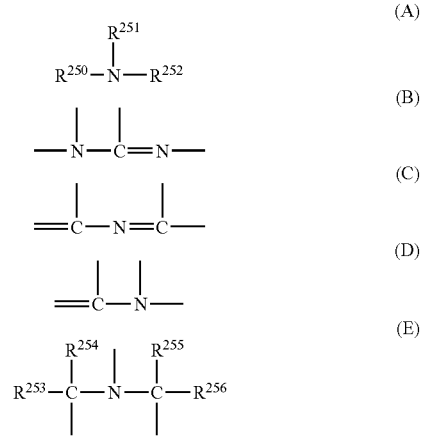

(A)
(B)
(C)
(D)
(E)

Using the method described in the specification of U.S. Pat. No. 3,734,928, the method described in Macromolecules, vol. 10, 1307 (1977), the method described in Journal of Organic Chemistry, vol. 55, 4222 (1990), the method described in J. Radiat. Curing, vol. 5(1), 2 (1978) and the like, the compounds represented by the formulae (AI), (AII), and (AIII) can be synthetically prepared via the exchange of counter anion. The compounds represented by the formulae (AIV) and (AV) can be obtained by the reaction between N-hydroxyimide compound and carboxylic acid chloride under basic conditions or by the reaction between nitrobenzyl alcohol and carboxylic acid chloride under basic conditions.

In accordance with the invention, the use of the components (B1) and (B2) in combination can enhance the contrast of the concentration distribution of strong acid generated under irradiation of actinic ray or radiation in the vicinity of the interface (the zone irradiated at low energy) between irradiated parts and non-irradiated parts with actinic ray or radiation.

The weight ratio of the components (B1) and (B2) to be added (component (B1)/component (B2)) is generally 100/100 to 100/0, preferably 100/100 to 100/10, particularly preferably 100/50 to 100/20.

The total amount of the components (B1) and (B2) is generally 0.5 to 20% by weight, preferably 0.75 to 15% by weight, more preferably 1 to 10% by weight based on the total solid content in the composition.

The component (B1) may include plural types, while the component (B2) may include plural types, individually.

[4] Organic Basic Compound

For the purpose of preventing the variation of the performance (such as the formation of T-top shape pattern, sensitivity variation, the variation of pattern line width) over time from the time of the irradiation of actinic ray or radiation up to the heating treatment, the variation of the performance post-coating over time, and excess dispersion of acids (deterioration of resolution) during the heating treatment after the irradiation of actinic ray or radiation, preferably, organic basic compounds are added to the composition of the invention. The organic basic compounds include for example organic basic compounds containing basic nitrogen. Organic basic compounds with pKa 4 or more of the conjugated acids are preferably used.

Specifically, the structures of the formulas (A) to (E) are listed.

Herein, $R^{250}$, $R^{251}$ and $R^{252}$ may be the same or different and represent a hydrogen atom, an alkyl group having one to 6 carbon atoms, an aminoalkyl group having one to 6 carbon atoms, a hydroxyalkyl group having one to 6 carbon atoms or an aryl group having 6 to 20 carbon atoms, which may be substituted. Herein, $R^{251}$ and $R^{252}$ may be bonded to each other to form a ring.

$R^{253}$, $R^{254}$, $R^{255}$ and $R^{256}$ may be the same or different and represents an alkyl group having one to 6 carbon atoms.

More preferable compounds are nitrogen-containing basic compounds having two or more nitrogen atoms in different chemical environment within one molecule. Particularly preferably, the organic basic compounds are compounds containing both of a ring structure containing amino group, which may be substituted and a ring structure containing nitrogen atom, or compounds having alkylamino group.

Preferable specific examples include guanidine which may or may not be substituted, aminopyridine which may or may not be substituted, aminoalkylpyridine which may or may not be substituted, aminopyrrolidine which may or may not be substituted, indazole which may or may not be substituted, imidazole which may or may not be substituted, pyrazole which may or may not be substituted, pyrazine which may or may not be substituted, pyrimidine which may or may not be substituted, purine which may or may not be substituted, imidazoline which may or may not be substituted, pyrazoline which may or may not be substituted, piperazine which may or may not be substituted, aminomorpholine which may or may not be substituted, and aminoalkylmorpholine which may or may not be substituted.

Preferable substituents are an amino group, an aminoalkyl group, an alkylamino group, an aminoaryl group, an arylamino group, an alkyl group, an alkoxyl group, an acyl group, an acyloxy group, an aryl group, an aryloxy group, a nitro group, a hydroxyl group and a cyano group.

Particularly preferable compounds are guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl) pyridine, 2-amino-3-methylpyridine, 2-amino-4-methylpyridine, 2-amno-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2, 6,6-tetramethylpiperidine, 4-piperidinopiperidine, 2-iminopiperidine, 1-(2-aminoethyl)pyrrolidine, pyrazole, 3-amino-5-ethylpyrazole, 5-amino-3-methyl-1-p-tolylpyrazole, pyrazine, 2-aminomethyl-5-methylpyrazine, pyrimidine, 2,4-diaminopyrimidine, 4,6-dihydroxypyrimidine, 2-pyrrazoline, 3-pyrrazoline, N-aminomorpholine, and N-(2-aminoethyl)morpholine. However, the compounds are not limited to them.

These nitrogen-containing basic compounds are used alone or in combination of two or more thereof.

The ratio (molar ratio) of the acid generator and the organic basic compound to be used in the composition is preferably 2.5 to 300 (acid generator/organic basic compound). When the molar ratio is below 2.5, the resulting composition is at low sensitivity, leading to the deterioration of the resolution in some case. When the molar ratio is above 300, the resist pattern gets broader over time from exposure up to heating treatment, leading to the deterioration of the resolution in some case. The molar ratio of the acid generator to the organic basic compound is preferably 5.0 to 200, more preferably 7.0 to 150.

[5] Fluorine-Series and/or Silicon-Series Surfactants

Preferably, the positive resist composition of the invention additionally contains any one or two or more types of fluorine-series and/or silicon-series surfactants (fluorine-series surfactants and silicon-series surfactants, surfactants containing both fluorine atom and silicon atom).

The positive resist composition of the invention when it contains fluorine-series and/or silicon-series surfactants can give resist patterns at great sensitivity and resolution and with less adhesion and development defects, during the use of an exposure light source of 250 nm or less, particularly 220 nm or less.

These fluorine-series and/or silicon-series surfactants include for example surfactants described in the specifications of JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. No. 5,405,720, U.S. Pat. No. 5,360,692, U.S. Pat. No. 5,529,881, U.S. Pat. No. 5,296,330, U.S. Pat. No. 5,436,098, U.S. Pat. No. 5,576,143, U.S. Pat. No. 5,294,511, and U.S. Pat. No. 5,824,451. The following commercially available surfactants can be used as they are.

Commercially available fluorine-series and/or silicon-series surfactants to be possibly used include for example Eftop EF301 and EF303 (manufactured by Shin-Akita Kasei K. K.), Florad FC430 and FC431 (manufactured by Sumitomo 3M, Inc.), Megafac F171, F173, F176, F189 and R08 (manufactured by Dainippon Ink & Chemicals, Inc.), Surflon S382, SC101, SC102, SC103, SC104, SC105, SC106 (manufactured by Asahi Glass Co., Ltd.), and Troyzol S-366 (manufactured by Troy Chemical Co., Ltd.). Further, polysiloxane polymer KP-341 (manufactured by Shin-Etsu Chemical Industry Co., Ltd.) can also be used as a silicon-series surfactant.

As the fluorine-series and/or silicon-series surfactants, surfactants prepared by using polymers with fluoro-aliphatic groups introduced from fluoro-aliphatic compounds produced by the telomerization method (also called telomer method) or the oligomerization method (also called oligomer method) can be used, other than such known surfactants described above. Fluoro-aliphatic compounds can be synthetically prepared by the method described in the specification of JP-A-2002-90991.

The polymers with fluoro-aliphatic groups are preferably copolymers of monomers with fluoro-aliphatic groups with (poly(oxyalkylene))acrylate and/or (poly(oxyalkylene)) methacrylate, which may be in irregular distribution or which may be in the form of block copolymer. Further, the poly(oxyalkylene) group includes poly(oxyethylene) group, poly(oxypropylene) group, and poly(oxybutylene) group and may be units with alkylene groups of different chain lengths in one chain, such as poly(block conjugate of oxyethylene, oxypropylene and oxyethylene) group and poly(block conjugate of oxyethylene and oxypropylene) group. Further, the copolymers of monomers with fluoro-aliphatic groups and (poly(oxyalkylene)) acrylate (or methacrylate) may be not only bicopolymers but also tercopolymers or higher copolymers, prepared by simultaneously copolymerizing together monomers with two or more different types of fluoro-aliphatic groups, two or more different types of (poly(oxyalkylene))acrylate (or methacrylate).

For example, the fluorine-series and/or silicon-series surfactants include Megafac F178, F470, F473, F-475, F-476 and F-472 (manufactured by Dainippon Ink & Chemicals, Inc.). Additionally, the fluorine-series and/or silicon-series surfactants include copolymers of acrylate (or methacrylate) containing the group $C_6F_{13}$ with (poly(oxyalkylene))acrylate (or methacrylate), copolymers of acrylate (or methacrylate) containing the group $C_6F_{13}$ with (poly(oxyethylene)) acrylate (or methacrylate) and (poly(oxypropylene)) acrylate (or methacrylate), copolymers of acrylate (or methacrylate) containing the group $C_8F_{17}$ with (poly(oxyalkylene))acrylate (or methacrylate), and copolymers of acrylate (or methacrylate) containing the group C8F17 with (poly(oxyethylene))acrylate (or methacrylate) and (poly(oxypropylene)) acrylate (or methacrylate).

The amount of the fluorine-series and/or silicon-series surfactants is preferably 0.0001 to 2% by weight, more preferably 0.001 to 1% by weight based on the total amount of the positive resist composition (excluding the solvent).

[6] Solvent

The composition of the invention is dissolved in a solvent capable of dissolving the individual components and is then coated on a support. The solvent to be used herein preferably includes ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monoethyl ether acetate, toluene, ethyl acetate, methyl lactate, ethyl lactate, methoxypropionic acid methyl ester, ethoxypropionic acid ethyl ester, pyruvic acid methyl ester, pyruvic acid ethyl ester, pyruvic acid propyl ester, N,N-dimethylformamide, dimethylsulfoxide, N-methylpyrrolidone, and tetrahydrofuran. These solvents are used singly or in mixture.

In accordance with the invention, mix solvents prepared by mixing propylene glycol monoalkyl ether acetates such as propylene glycol monomethyl ether acetate, with propylene glycol monoalkyl ethers such as propylene glycol monomethyl ether and propylene glycol monoethyl ether, or with lactic acid alkyl esters such as methyl lactate and ethyl lactate are preferably used.

When the individual components are dissolved in such solvent, the concentration of the solids is preferably 3 to 15% by weight, more preferably 5 to 10% weight.

[7] Non-Polymer Type Dissolution Inhibitor (X)

Preferably, the positive resist composition of the invention additionally contains a non-polymer type dissolution inhibitor. Herein, the non-polymer type dissolution inhibitor means a compound of a molecular weight of 3,000 or less, where at least two or more acid decomposable groups are present and which can acquire the increase of the solubility in alkali developing solution by the action of an acid. Particularly, a non-polymer type dissolution inhibitor having substituents in the nucleus backbone is preferable in terms of transparency.

The amount thereof to be added is preferably 3 to 50% by weight, more preferably 5 to 40% by weight, and still more preferably 7 to 30% weight based on the polymers in the composition.

Specific examples of the component (X) are shown below. However, the invention is not limited to these specific examples.

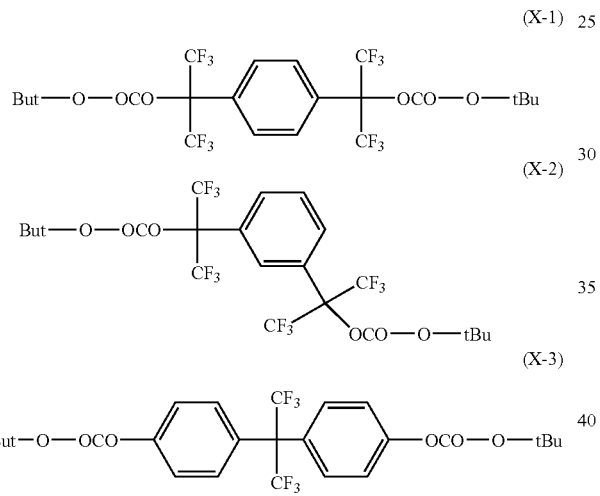

[8] Amphoteric Ionic Compound (Y)

Preferably, the positive resist composition of the invention additionally contains an amphoteric ionic compound. Herein, the amphoteric ionic compound means a compound simultaneously containing both cationic moiety and anionic moiety within one molecule. Specifically, the amphoteric ionic compound includes but is not limited to amino acids with amphoteric ions, such as alanine, phenylalanine, asparagine, glycine, and valine.

The amount thereof to be added is preferably 3 to 70 mol %, more preferably 5 to 50 mol % and still more preferably 7 to 40 mol % based on the component (B1). The component (Y) when added can improve the sensitivity and the contrast, more greatly.

For the production of precision integrated circuit device, the process of fabricating pattern on resist film includes a step of coating the composition of the invention on a substrate (for example, transparent substrates such as silicon/silicon dioxide film, glass substrate, and ITO substrate), a subsequent irradiation step using an imaging apparatus with actinic ray or radiation, and a step of heating, developing, rinsing and drying, to fabricate great resist pattern.

As the alkali developing solution for the composition of the invention, it is possible to use aqueous solutions of alkalis including inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine, and di-n-butylamine; tertiary amines such as triethylamine, and methyldiethylamine; alcohol amines such as dimethylethanolamine and triethanolamine; quaternary ammonium salts such as tetramethylammonium hydroxide, tetraethylammonium hydroxide, and choline; and cyclic amines such as pyrrole and piperidine. Further, an appropriate amount of alcohols such as isopropyl alcohol and nonionic-series surfactants may be added to the aqueous solutions of the alkalis, for use.

Among these alkali developing solutions, quaternary ammonium salts are preferable. Tetramethylammonium hydroxide and choline are more preferable.

The alkali concentration in the alkali developing solution is generally 0.1 to 20% by weight, preferably 0.2 to 15% by weight, more preferably 0.5 to 10% by weight.

pH of the alkali developing solution is generally 10.0 to 15.0, preferably 10.5 to 14.5, and more preferably 11.0 to 14.0.

EXAMPLES

The invention is now described in more detail in the following examples. However, the examples never limit the contents of the invention.

<Synthesis of Triphenylsulfonium Nonafluorobutanesulfonate (VII-4)>

20 g of triphenylsulfonium iodide was dissolved in 500 ml of methanol, to which 12.5 g of silver oxide was added, for agitation at ambient temperature for 4 hours. After the silver compound was discarded by filtration of the reaction solution, 14.9 g of nonafluorobutanesulfonic acid was added to the resulting solution and was then concentrated. 300 ml of diisopropyl ether was added to the resulting oily matter, for sufficient agitation. Thereafter, diisopropyl ether was removed by decantation. The procedure was repeated two times. The resulting oily matter was dried under reduced pressure, to recover the object compound of 18 g.

<Synthesis of Triphenylsulfonium 4-dodecylbenzenesulfonate (PAG4-1)>

10 g of triphenylsulfonium iodide was dissolved in 500 ml of methanol, to which 4.44 g of silver oxide was added, for agitation at ambient temperature for 4 hours. After the silver compound was discarded by filtration of the reaction solution, 4.67 g of 4-dodecylbenzenesulfonic acid was added to the resulting solution and was then concentrated. 300 ml of diisopropyl ether was added to the resulting oily matter, for sufficient agitation. Thereafter, diisopropyl ether was removed by decantation. The procedure was repeated two times. The resulting oily matter was dried under reduced pressure, to recover the object compound of 6 g.

<Synthesis of Polymer (A-1)>

19.63 g (0.1 mole) of p-styrenesulfonate ethyl ester and 19.62 g (0.1 mole) of α-trifluoromethyl-t-butyl acrylate were dissolved in 70 g of tetrahydrofuran. Then, the inside of the reaction system was substituted with nitrogen. Then, 0.99 g (0.009 mole) of a polymerization initiator AIBN was added to the reaction system. While allowing nitrogen to flow in the reaction system, the reaction mixture was heated at 65° C. for 8 hours. Thereafter, the reaction mixture was cooled to ambient temperature and was then dropwise added to 1.5 L of methanol. Through filtration, the powder was taken out and dried under reduced pressure at 100° C., to recover the powder of 29.05 g (yield of 74%). The weight average molecular weight of the resulting powder and the molecular weight dispersion degree thereof were determined by gel permeation chromatography (GPC), which were 8,300 and 1.56, respectively. Further, the composition ratio of p-styrenesulfonate ethyl/α-trifluoromethyl-t-butyl acrylate as determined by $^1$H and $^{13}$C-NMR was 53/47.

By the same method except for the addition of different monomers, polymers (A-2) to (A-12) were obtained.

The structures of the repeat units in the polymers (A-1) to (A-12) are shown below.

(A-1)

(I-1)
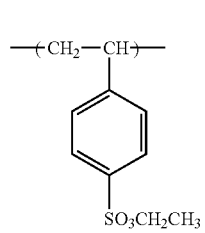

(A-2)

(IIIA-1)
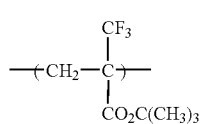

(I-3)
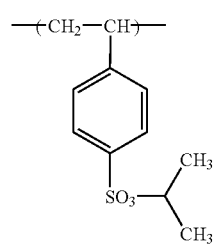

(A-3)

(IVA-1)
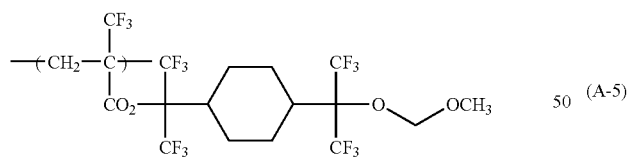

(I-7)
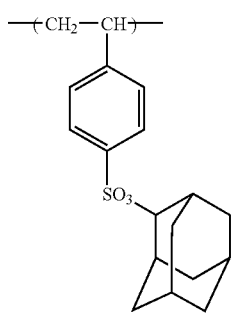

-continued (VA-3)
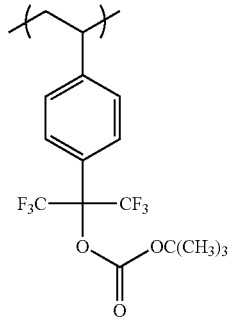

(VB-1)
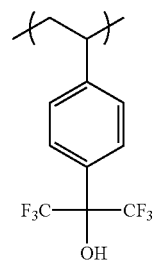

(A-4)

(I-5)
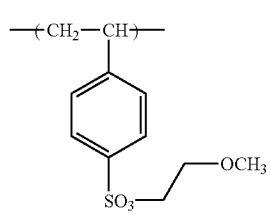

(VIA-2)
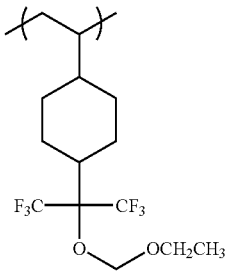

(A-5)

(I-12)
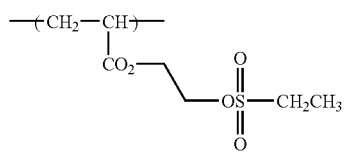

(IIIA-2)
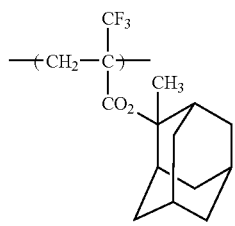

(A-6)
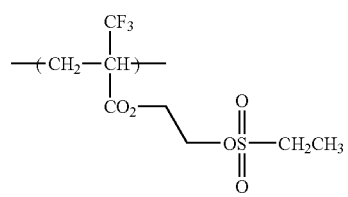
(I-14)
(IA-3)
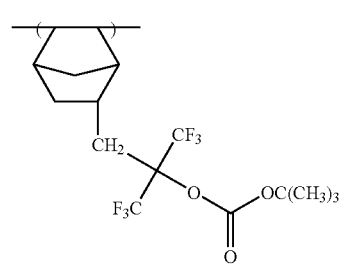
(A-7)
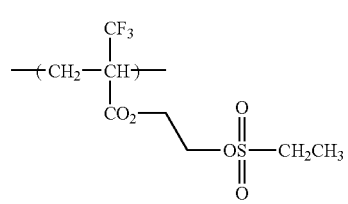
(I-14)
(IIA-1)
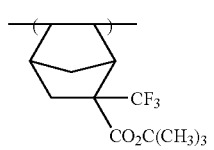
(A-8)
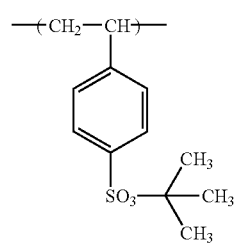
(IIIA-2)
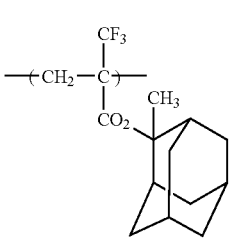
(A-9)
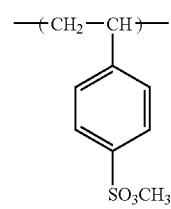
(I-2)
(IVA-3)
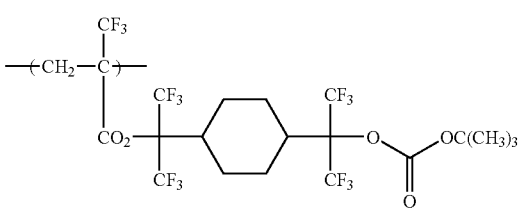
(IVB-1)
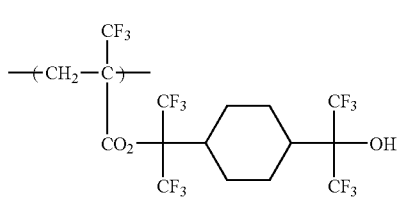
(A-10)
(I-4)
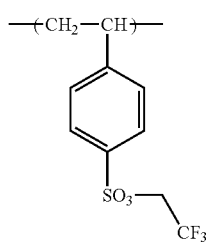
(I-10)
(VA-1)
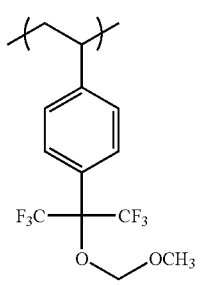

-continued (A-11)

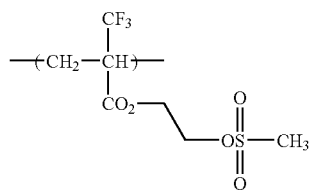

(A-12)

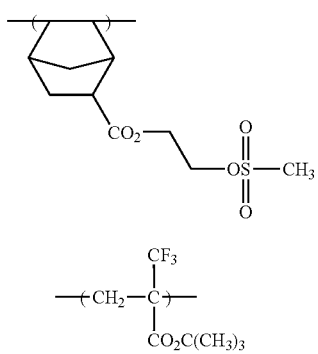

Table 1 below shows the repeating units of the polymers (A-1) to (A-12), the molar ratio of the repeating units, the weight average molecular weights of the polymers and the molecular weight dispersion degree thereof.

TABLE I-1

| Polymer | Repeating unit | Molar ratio | Weight average molecular weight | Dispersion degree |
|---------|----------------|-------------|---------------------------------|-------------------|
| (A-1) | (I-2)/(IIIA-1) | 53/47 | 8300 | 1.56 |
| (A-2) | (I-3)/(IVA-1) | 52/48 | 8700 | 1.51 |
| (A-3) | (I-7)/(VA-3)/(VB-1) | 50/33/17 | 7400 | 1.61 |
| (A-4) | (I-5)/(VIA-2) | 47/53 | 7500 | 1.53 |
| (A-5) | (I-12)/(IIIA-2) | 63/37 | 8900 | 1.53 |
| (A-6) | (I-14)/(IA-3) | 35/65 | 8600 | 1.57 |
| (A-7) | (I-14)/(IIA-1) | 33/67 | 8100 | 1.52 |
| (A-8) | (I-4)/(IIIA-2) | 55/45 | 7600 | 1.54 |
| (A-9) | (I-2)/(IVA-3)/(IVB-1) | 53/31/19 | 8400 | 1.58 |
| (A-10) | (I-10)/(VA-1) | 49/51 | 8900 | 1.56 |
| (A-11) | (I-13)/(IIA-4) | 36/64 | 8900 | 1.59 |
| (A-12) | (II-1)/(IIIA-1) | 38/62 | 7100 | 1.61 |

Examples 1 to 12 and Comparative Examples 1 to 3

<Measurement of Transmittance>

1.36 g of each of the polymers (A-1) to (A-12) or of the following comparative resin (1) was dissolved in 8.5 g of propylene glycol monomethyl ether acetate and was then filtered through a 0.1 µm fluorine resin filter. Then, the filtrate was coated on a calcium fluoride disc with a spin coater and dried under heating at 120° C. for 5 minutes, to obtain a film of a film thickness of 0.1 µm. The absorption of these films was measured with a spectrometer Acton CAMS-507, to calculate the transmittance at 157 nm.

The results are shown in Table I-2.

Comparative Resin (1) (Weight Average Molecular Weight of 8,400)

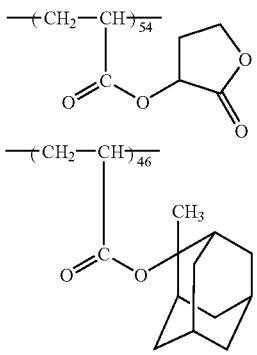

TABLE I-2

| | Polymer | Transmittance in a film thickness of 0.1 µm at 157 nm |
|---|---------|-----------------------------------------------------|
| Example 1 | (A-1) | 55 |
| Example 2 | (A-2) | 65 |
| Example 3 | (A-3) | 52 |
| Example 4 | (A-4) | 57 |
| Example 5 | (A-5) | 56 |
| Example 6 | (A-6) | 54 |
| Example 7 | (A-7) | 51 |
| Example 8 | (A-8) | 49 |
| Example 9 | (A-9) | 62 |
| Example 10 | (A-10) | 50 |
| Example 11 | (A-11) | 52 |
| Example 12 | (A-12) | 54 |
| Comparative Example 1 | Comparative resin (1) | 24 |

Table I-2 indicates on the basis of the transmittance of the films using the polymers (A-1) to (A-12) of the invention that the polymers have sufficient transparency at 157 nm.

<Assessment of Imaging>

To 1.2 g of each of the polymers (A-1) to (A-12) or the comparative resin (1) and 0.024 g of the nonafluorobutanesulfonate salt of triphenylsulfonium were added 0.24 g of the inhibitor X in some case, 0.006 g of an additional type of the component (B1) in some case and 0.006 g of an additional type of the component (B2) in some case, which were dissolved in 19.6 g of propylene glycol monomethyl ether acetate. The resulting solution was filtered through a 0.1 µm fluorine resin filter.

The resulting individual compositions were coated on silicon wafer with a spin coater, which was then dried under heating at 120° C. for 60 seconds, to form 0.1 µm resist films. The resist films were exposed to laser beam at 157 nm, using 157 nm laser exposure & dissolution performance analyzer VUVES-4500 (manufactured by Lithotech Japan), to assess the sensitivity to 157-nm exposure and the dissolution contrast between the exposed portions and the unexposed portions.

The sensitivity herein referred to is measured as follows. Post-exposure wafer was dried under heating at 130° C. for 90 seconds and was then developed at 23° C. for 60 seconds, using aqueous 2.38% by weight of tetramethylammonium hydroxide solution; and after the resulting wafer was rinsed with pure water for 30 seconds, the film thickness was measured. The minimum exposure required for the film thickness to zero is defined sensitivity.

The dissolution contrast herein referred to means the slope (tan θ) of the curve of exposure vs. dissolution rate. Table I-3 shows the results.

Comparative Resin (3) (Weight Average Molecular Weight of 9,600)

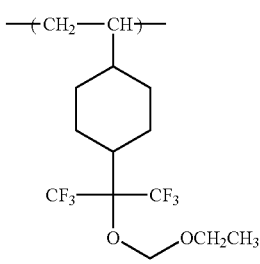

TABLE I-3

| | Polymer | Component (X) | Another component (B1) | Component (B2) | Sensitivity (mJ/cm$^2$) | Dissolution contrast |
|---|---|---|---|---|---|---|
| Example 1 | (A-1) | — | — | — | 3 | 5.8 |
| Example 2 | (A-2) | (X-1) | — | — | 2.5 | 5.6 |
| Example 3 | (A-3) | — | (PAG4-1) | — | 3 | 6.2 |
| Example 4 | (A-4) | — | — | — | 3.1 | 5.9 |
| Example 5 | (A-5) | (X-1) | — | — | 3 | 6.1 |
| Example 6 | (A-6) | — | (PAG4-34) | — | 2.8 | 6.5 |
| Example 7 | (A-7) | — | — | — | 2.5 | 5.8 |
| Example 8 | (A-8) | — | — | — | 3.5 | 5.7 |
| Example 9 | (A-9) | — | — | — | 4 | 6 |
| Example 10 | (A-10) | — | (PAG4-34) | (I-3f) | 2.5 | 6.6 |
| Example 11 | (A-11) | — | — | — | 1.5 | 5.6 |
| Example 12 | (A-12) | — | — | — | 3 | 5.8 |
| Comparative Example 1 | Comparative resin (1) | — | — | — | 8.5 | 5.2 |

Table I-3 indicates that the positive resist compositions of the invention have high sensitivity to 157 nm exposure, high dissolution contrast and high resolution.

<Measurement of Contact Angle of Developer>

1.2 g of each of the polymers (A-1) to (A-12) or the comparative resin (1) or the following comparative resin (2) or (3) and 0.024 g of the nonafluorobutanesulfonate salt of triphenylsulfonium were dissolved in 19.6 g of propylene glycol monomethyl ether acetate (PGMEA). The resulting solutions were filtered through a 0.1 μm fluorine resin filter, to prepare resist solutions. The individual resist solutions were coated on silicon wafer treated with hexamethyldisilazane, using a spin coater. The resulting wafer was dried under heating at 120° C. for 60 seconds, to form 0.1 μm resist films. The contact angle to aqueous 2.38% by weight of tetramethylammonium hydroxide solution was measured on these films.

The results are shown in Table I-4.

Comparative Resin (2) (Weight Average Molecular Weight of 4,300)

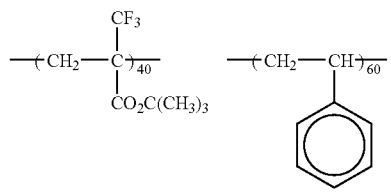

TABLE I-4

| | Polymer | Contact angle (degree) |
|---|---|---|
| Example 1 | (A-1) | 42 |
| Example 2 | (A-2) | 45 |
| Example 3 | (A-3) | 44 |
| Example 4 | (A-4) | 47 |
| Example 5 | (A-5) | 42 |
| Example 6 | (A-6) | 50 |
| Example 7 | (A-7) | 46 |
| Example 8 | (A-8) | 44 |
| Example 9 | (A-9) | 42 |
| Example 10 | (A-10) | 49 |
| Example 11 | (A-11) | 48 |
| Example 12 | (A-12) | 49 |
| Comparative Example 1 | Comparative resin (1) | 45 |
| Comparative Example 2 | Comparative resin (2) | 63 |
| Comparative Example 3 | Comparative resin (3) | 61 |

Table I-4 indicates that the positive resist compositions of the invention have great contact properties to developers and have a great developing property.

The invention can provide positive resist compositions with great transparency of 157 nm exposure, high sensitivity and high resolution and with great contact property to developers.

<Synthesis of Resins>

Synthetic Example II-1 (Synthesis of F'-1)

1.24 g of an azo-series polymerization initiator V-65 (manufactured by Wako Pure Chemical Co., Ltd) was added to 2.65 g of the monomer represented by the formula (1), 7.2 g of the monomer represented by the formula (2) and 6.85 g of the monomer represented by the formula (3), while these monomers were agitated in nitrogen atmosphere. The resulting mixture was agitated at 65° C. for one hour as it was, for reaction. 2.65 g of the monomer (1), 7.2 g of the monomer represented by the formula (2), 6.85 g of the monomer represented by the formula (3) and 2.48 g of V-65 (manufactured by Wako Pure Chemical Co., Ltd.) separately prepared were dissolved in 60 g of MEK. The resulting solution was kept at 10° C. and was then dropwise added to the polymerization reaction solution under agitation at 65° C. during reaction, over 4 hours.

500 ml of hexane was added to the reaction solution to precipitate the polymer. The upper layer was removed by decantation. The remaining viscous polymer was dissolved in 50 ml of acetone, to which 1 L of hexane was again added, to separate the polymer and remove the unreactive monomers and oligomer components. The molecular weight of the resulting polymer was measured by GPC. The weight average molecular weight was 6,500, while the dispersion degree was 1.5.

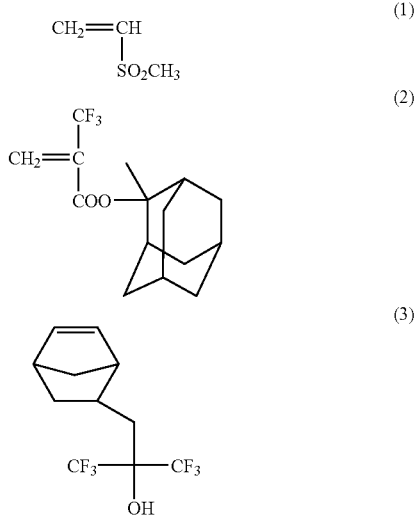

The polymers in Table II-1 were obtained in the same manner.

TABLE II-1

| Polymer | Molar composition ratio | Weight average molecular weight | Dispersion degree |
|---|---|---|---|
| (F'-1) | 25/25/50 | 6500 | 1.5 |
| (F'-2) | 25/25/25/25 | 7000 | 1.4 |
| (F'-3) | 25/25/50 | 8000 | 1.5 |
| (F'-4) | 25/25/50 | 6500 | 1.5 |
| (F'-5) | 25/25/50 | 7000 | 1.4 |
| (F'-6) | 40/60 | 5000 | 1.4 |

(Synthesis of Resin (C-1) of Comparative Example)

1.24 g of an azo-series polymerization initiator V-65 (manufactured by Wako Pure Chemical Co., Ltd) was added to 27.5 g of the monomer represented by the formula (3) and α-trifluoroacrylate t-butyl ester, while these were agitated in nitrogen atmosphere. The resulting mixture was agitated at 70° C. for 10 hours as it was, for reaction.

500 ml of hexane was added to the reaction solution to precipitate the polymer. The upper layer was removed by decantation. The remaining viscous polymer was dissolved in 50 ml of acetone, to which 1 L of hexane was again added, to separate the polymer and remove the unreactive monomers and oligomer components. The molecular weight of the resulting resin (C-1) was measured by GPC. The weight average molecular weight was 8,100, while the dispersion degree was 1.9.

Examples II-1 to II-6 and
Comparative Examples II-1

Each resin of 1.2 g, each acid generator of 0.030 g, each surfactant of 100 ppm in each polymer solution, each organic basic compound of 0.0012 g as shown in Table II-2 were dissolved in 19.6 g of each solvent. The resulting polymer solutions were filtered through a 0.1 μm polytetrafluoroethylene film, to prepare positive resist solutions.

TABLE II-2

| | Resin | Acid generator (weight ratio) | Solvent (weight ratio) | Organic basic compound | Surfactant |
|---|---|---|---|---|---|
| Example II-1 | (F'-1) | (VII-4) | S-2 | N-1 | W-1 |
| Example II-2 | (F'-2) | (VII-4) | S-2 | N-1 | W-1 |
| Example II-3 | (F'-3) | (VII-24) | S-2 | N-1 | W-1 |
| Example II-4 | (F'-4) | (VII-36)/(PAG4-1) 50/50 | S-2/S-3 (80/20) | N-2 | W-2 |
| Example II-5 | (F'-5) | (VII-53)/(II-1f) 50/50 | S-2/S-1 (80/20) | N-3 | W-1 |
| Example II-6 | (F'-6) | (VII-53)/(II-1f) 50/50 | S-2 | N-1 | W-2 |
| Comparative Example II-1 | (C-1) | (VII-4) | S-2 | N-1 | W-1 |

The symbols in Table II-2 mean those described below.
N-1: Hexamethylenetetramine
N-2: 1,5-Diazabicyclo[4.3.0]-5-nonene
N-3: 1,8-Diazabicyclo[5.4.0]-7-undecene
W-1: Megafac F176 (manufactured by Dainippon Ink & Chemicals, Inc.) (fluorine series)
W-2: Megafac R08 (manufactured by Dainippon Ink & Chemicals, Inc.) (fluorine and silicon series)
S-1: Methyl lactate
S-2: Propylene glycol monomethyl ether acetate
S-3: Propylene glycol monomethyl ether Using a spin coater, the positive resist solutions thus prepared were uniformly coated on silicon wafer preliminarily coated with an anti-reflection film (DUV42-6; manufactured by BrewerScience, Inc.), and dried under heating at 120° C. for 60 seconds, to prepare positive resist films of a film thickness of 0.1 μm. Using a KrF microstepper, a mask for line and space (line width of 150 nm; line/space=1:1) was used for pattern exposure of the resist films. Immediately after exposure, the resist films were heated on a hot plate at 110° C. for 90 seconds. Additionally, the resist films were developed in aqueous 2.38 mass % tetramethylammonium hydroxide solution at 23° C. for 30 seconds, rinsed with pure water for 30 seconds and dried. The pattern thus prepared on the silicon wafer was evaluated of its resist performance by the following method.

<Line Edge Roughness>

Over the edge zone ranging over 5 μm along the longitudinal direction of the line pattern, the distance from the base line where the edge should have been located was measured at 50 points, with a critical dimension scanning electron microscope (CD-SEM) (manufactured by Hitachi, Co., Ltd.). The standard deviation of their measured values was calculated, to calculate 3 σ. A smaller value indicates that the performance is greater.

<Development Defects>

Development defects in the resist pattern thus prepared were counted with KLA-2112 manufactured by KLA Tencol Co., Ltd. The resulting primary data values were used as measurement results.

<Scum Generation>

Scum generation was examined on the basis of the residual degree of development residue (scum) on the resist pattern of a line width of 0.15 micron. Resist pattern with no scum observed was rank A. Resist pattern with considerable scum observed was rank C. Resist pattern at the intermediate level between A and B was rank B.

The results of the assessment of the performance are shown below in Table II-3.

TABLE II-3

|  | Line edge roughness (nm) | Number of development defects | Scum generation |
|---|---|---|---|
| Example 1 | 8.5 | 25 | A |
| Example 2 | 9.6 | 28 | B |
| Example 3 | 8.6 | 22 | A |
| Example 4 | 9.5 | 23 | A |
| Example 5 | 10.2 | 28 | B |
| Example 6 | 8.9 | 31 | A |
| Comparative Example 1 | 12.5 | 69 | C |

The results in Table III-3 indicate that the compositions of the invention have got improvement in line edge roughness, development defects and scum.

The invention can provide a positive resist composition with improved line edge roughness, development defects and scum.

<Synthesis of Resin>

Synthetic Example III-1 (Synthesis of resin (F-1))

2.48 g of an azo-series polymerization initiator V-65 (manufactured by Wako Pure Chemical Co., Ltd) was added to 12.1 g of the monomer represented by the formula (1), 14.4 g of the monomer represented by the formula (2) and 13.7 g of the monomer represented by the formula (3), while these monomers were agitated in nitrogen atmosphere. The resulting mixture was agitated at 65° C. for one hour as it was, for reaction. 12.1 g of the monomer (1), 14.4 g of the monomer represented by the formula (2), 13.7 g of the monomer represented by the formula (3) and 4.96 g of the azo-series polymerization initiator V-65 (manufactured by Wako Pure Chemical Co., Ltd.) separately prepared were dissolved in 60 g of MEK. The resulting solution was kept at 10° C. and was then dropwise added to the polymerization reaction solution under agitation at 65° C. during reaction, over 4 hours.

500 ml of hexane was added to the reaction solution to precipitate the polymer. The upper layer was removed by decantation. The remaining viscous polymer was dissolved in 50 ml of acetone, to which 1 L of hexane was again added, to separate the polymer and remove the unreactive monomers and oligomer components. The molecular weight of the resulting polymer was measured by GPC. The weight average molecular weight was 8,000, while the dispersion degree was 1.5.

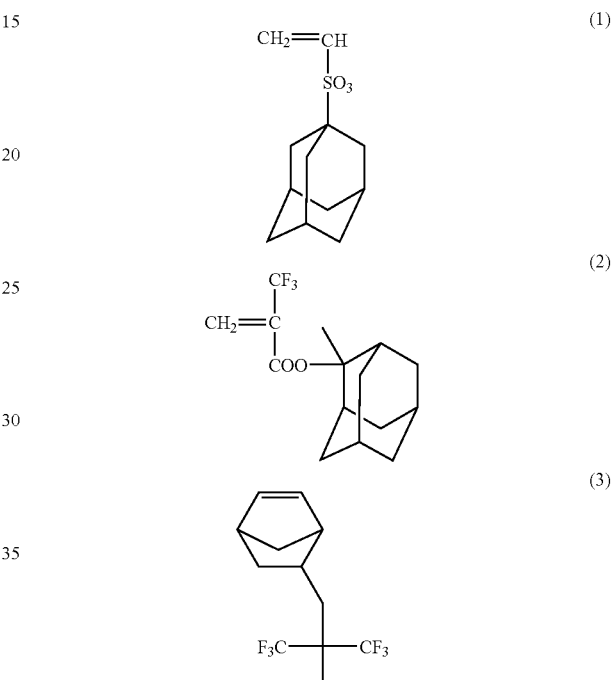

The resins (F-2) to (F-7) in Table III-1 below were obtained in the same manner.

TABLE III-1

| Resin | Molar composition ratio | Weight average molecular weight | Dispersion degree |
|---|---|---|---|
| (F-1) | 25/25/50 | 8000 | 1.5 |
| (F-2) | 25/25/50 | 9000 | 1.4 |
| (F-3) | 25/25/25/25 | 6500 | 1.4 |
| (F-4) | 25/25/50 | 7000 | 1.5 |
| (F-5) | 25/25/50 | 9000 | 1.4 |
| (F-6) | 40/30/30 | 6500 | 1.4 |
| (F-7) | 50/50 | 7500 | 1.4 |

*: Corresponding sequentially to the individual structural formulas from the left.

Synthesis Example III-2

(Synthesis of Resin (C-1) of Comparative Example)

10.6 g of the monomer represented by the following general formula (4) was added to 25 g of THF, which was then added to 12.1 g of the monomer represented by the general formula (1). 2.48 g of an azo-series polymerization initiator V-65 (manufactured by Wako Pure Chemical Co., Ltd) was added to the resulting mixture under agitation in nitrogen atmosphere. The resulting mixture was agitated at 65° C. for one hour for reaction, as it was. 500 ml of hexane was added to the reaction solution to precipitate the polymer. The upper layer was removed by decantation. The remaining viscous polymer was dissolved in 50 ml of acetone, to which 1 L of hexane was again added, to separate the polymer and remove the unreactive monomers and oligomer components. The molecular weight of the resulting polymer was measured by GPC. The weight average molecular weight was 5,000, while the dispersion degree was 1.9.

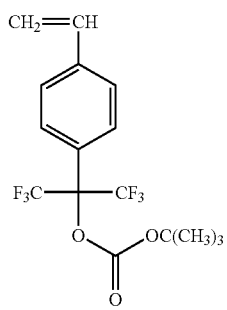
(4)

Examples III-1 to III-7 and Comparative Examples III-1

Each resin of 1.2 g, each acid generator of 0.030 g, each surfactant of 100 ppm in each polymer solution, each organic basic compound of 0.0012 g, as shown in Table III-2, were dissolved in 19.6 g of each solvent. The resulting polymer solutions were filtered through a 0.1-μm polytetrafluoroethylene film, to prepare positive resist solutions.

TABLE III-2

| | Resin | Acid generator (weight ratio) | Organic basic compound | Surfactant | Solvent (weight ratio) |
|---|---|---|---|---|---|
| Example III-1 | (F-1) | (VII-4) | N-1 | W-1 | S-2 |
| Example III-2 | (F-2) | (VII-4) | N-1 | W-1 | S-2 |
| Example III-3 | (F-3) | (VII-24) | N-1 | W-1 | S-2 |
| Example III-4 | (F-4) | (VII-36)/(PAG4-1) 50/50 | N-2 | W-2 | S-2/S-3 (80/20) |
| Example III-5 | (F-5) | (VII-53)/(II-1f) (50/50) | N-3 | W-1 | S-2/S-1 (80/20) |
| Example III-6 | (F-6) | (VII-53)/(II-1f) (50/50) | N-1 | W-2 | S-2 |
| Example III-7 | (F-7) | (VII-4) | N-1 | W-1 | S-2 |
| Comparative Example II-1 | (C-1) | (VII-4) | N-1 | W-1 | S-2 |

The symbols in Table III-2 mean those described below.
N-1: Hexamethylenetetramine
N-2: 1,5-Diazabicyclo[4.3.0]-5-nonene
N-3: 1,8-Diazabicyclo[5.4.0]-7-undecene
W-1: Megafac F176 (manufactured by Dainippon Ink & Chemicals, Inc.) (fluorine series)
W-2: Megafac R08 (manufactured by Dainippon Ink & Chemicals, Inc.) (fluorine- and silicon series)
S-1: Methyl lactate
S-2: Propylene glycol monomethyl ether acetate
S-3: Propylene glycol monomethyl ether Using a spin coater, the positive resist solutions thus prepared were uniformly coated on silicon wafer preliminarily coated with an anti-reflection film (DUV42-6; manufactured by BrewerScience, Inc.), and dried under heating at 120° C. for 60 seconds, to prepare positive resist films of a film thickness of 0.1 μm. Using a KrF microstepper, a mask for line and space (line width of 150 nm; line/space=1:1) was used for pattern exposure of the resist films. Immediately after exposure, the resist films were heated on a hot plate at 110° C. for 90 seconds. Additionally, the resist films were developed in aqueous 2.38 mass % tetramethylammonium hydroxide solution at 23° C. for 30 seconds, rinsed with pure water for 30 seconds and dried. The pattern thus prepared on the silicon wafer was evaluated of its resist performance by the following method.

<Line Edge Roughness>

Over the edge zone ranging over 5 μm along the longitudinal direction of the line pattern, the distance from the base line where the edge should have located was measured at 50 points, with a critical dimension scanning electron microscope (CD-SEM) (manufactured by Hitachi, Co., Ltd.). The standard deviation of their measured values was calculated, to calculate 3 σ. A smaller value indicates that the performance is greater.

<Test for the Assessment of Development Defects>

Development defects in the resist pattern thus prepared were counted with KLA-2112 manufactured by KLA Tencol Co., Ltd. The resulting primary data values were used as measurement results.

<Scum Generation>

Scum generation was examined on the basis of the residual degree of development residue (scum) on the resist pattern of a line width of 0.15 micron. Resist pattern with no scum observed was rank A. Resist pattern with considerable scum observed was rank C. Resist pattern at the intermediate level between A and B was rank B.

The results of the assessment of the performance are shown below in Table III-3.

TABLE III-3

| | Line edge roughness (nm) | Number of development defects | Scum generation |
|---|---|---|---|
| Example III-1 | 9.7 | 28 | A |
| Example III-2 | 9.8 | 31 | B |
| Example III-3 | 9.6 | 32 | A |
| Example III-4 | 10.8 | 33 | A |
| Example III-5 | 10.0 | 29 | B |
| Example III-6 | 9.7 | 31 | A |
| Example III-7 | 11.5 | 36 | B |
| Comparative Example III-1 | 12.5 | 69 | C |

The results in Table III-3 indicate that the compositions of the invention have got improvement in line edge roughness, development defects and scum.

The invention can provide a positive resist composition with improved line edge roughness, development defects and scum.

What is claimed is:

1. A positive resist composition comprising:
(A1) a resin containing at least one type of repeating unit represented by the following formula (I) or (II) and additionally containing at least one type of repeating unit represented by the following formulas (IA) to (VIA), which increases the solubility in an alkali developing solution by the action of an acid, and
(B) a compound which is capable of generating an acid by irradiation of actinic ray or radiation:

(I)

(II)

wherein $R_{x1}$ and $R_{y1}$ each independently represents a hydrogen atom, a halogen atom, a cyano group, or an alkyl group which may optionally have a substituent,
$L_1$ represents a divalent binding group,
$m_1$ represents 0,
$m_2$ represents 0 or 1,
$R_{a1}$ and $R_{b1}$ represents an alkyl group which may optionally have a substituent, an aryl group which may optionally have a substituent, or an aralkyl group which may optionally have a substituent,
$Q_1$ represents an alicyclic hydrocarbon group,
Rb' represents a hydrogen atom, an organic group or a halogen atom,
l represents an integer of 0 to 3,
$L_2$ represents single bond or a divalent binding group):

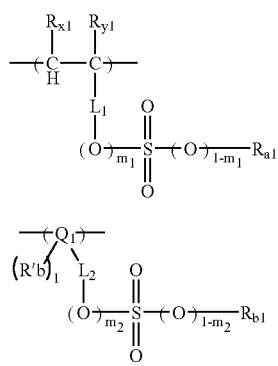

(IA)

(IIA)

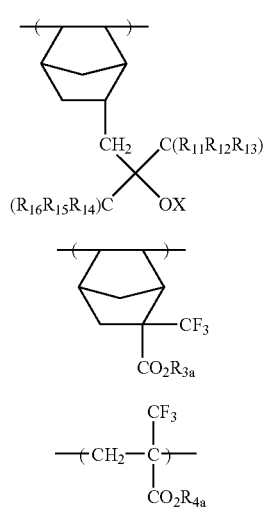

(IIIA)

(IVA)

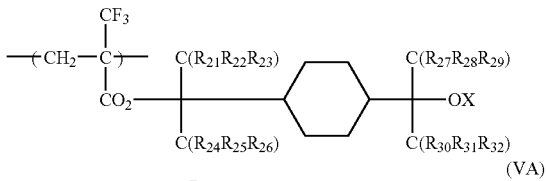

(VA)

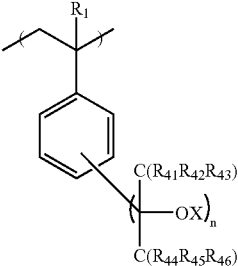

(VIA)

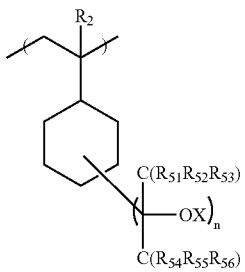

wherein $R_1$ and $R_2$ represent a hydrogen atom, a halogen atom, a cyano group or a trifluoromethyl group,
X represents a group decomposable by the action of an acid,
$R_{3a}$ and $R_{4a}$ represent a group decomposable by the action of an acid,
$R_{11}$ to $R_{16}$, $R_{21}$ to $R_{32}$, $R_{41}$ to $R_{46}$, and $R_{51}$ to $R_{56}$ each independently represents a hydrogen atom, a fluorine atom, or an alkyl group which may optionally have a substituent, provided that at least one of $R_{11}$ to $R_{16}$, at least one of $R_{21}$ to $R_{32}$, at least one of $R_{41}$ to $R_{46}$, or at least one of $R_{51}$ to $R_{56}$ is a fluorine atom,
n represents an integer of 1 to 5.

2. The positive resist composition according to claim 1, wherein $L_1$ in the formula (I) is a phenylene group.

3. The positive resist composition according to claim 1, wherein $Q_1$ in the formula (II) is a norbornene residue.

4. The positive resist composition according to claim 1, wherein $L_1$ in the formula (I) or $L_2$ in the formula (II) has a carbonyl group.

5. The positive resist composition according to claim 1, wherein the resin ($A_1$) has at least one type of repeating unit selected from the group consisting of repeating units represented by the following formulae (IB), (IVB), (VB) and (VIB):

(IB)

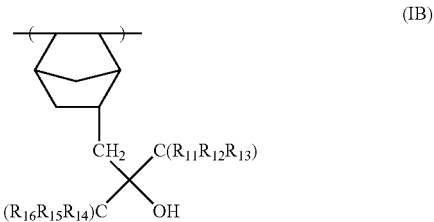

-continued

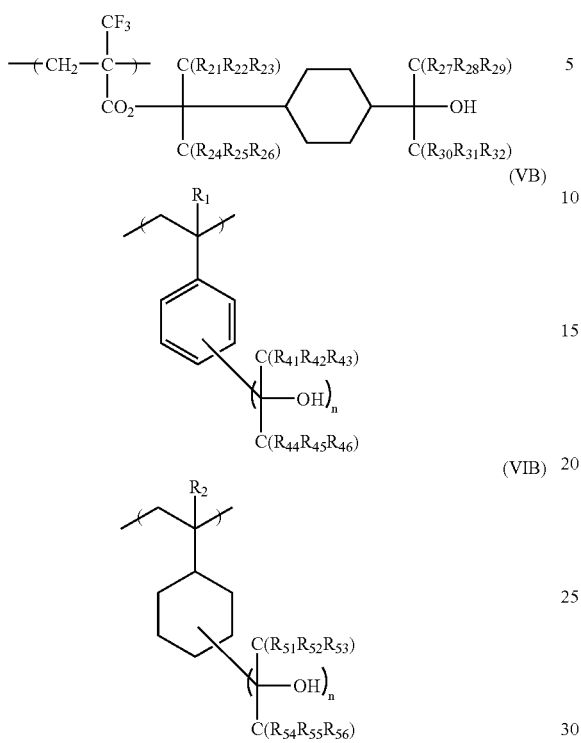

(IVB)

(VB)

(VIB)

wherein $R_1$ and $R_2$ represent a hydrogen atom, a halogen atom, a cyano group or a trifluoromethyl group, $R_{11}$ to $R_{16}$, $R_{21}$ to $R_{32}$, $R_{41}$ to $R_{46}$, and $R_{51}$ to $R_{56}$ each independently represents a hydrogen atom, a fluoride atom, or an alkyl group which may optionally have a substituent, provided that at least one of $R_{11}$ to $R_{16}$, at least one of $R_{21}$ to $R_{32}$, at least one of $R_{41}$ to $R_{46}$, or at least one of $R_{51}$ to $R_{56}$ is a fluorine atom, n represents an integer of 1 to 5.

6. The positive resist composition comprising:

(A2) a resin containing a repeating unit represented by the following formula (I'b) and additionally containing at least one type of repeating unit selected from the group consisting of repeating units represented by the formulae (II') to (IV), which increases the solubility in an alkali developing solution by the action of an acid, and (B) a compound which is capable of generating an acid by irradiation of actinic ray or radiation:

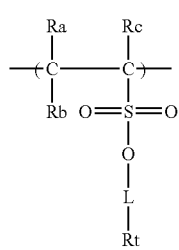

(I'b)

wherein Ra, Rb and Rc each independently represents a hydrogen atom, a fluorine atom or a fluorinated alkyl group, L represents a single bond or a binding group, and Rt represents an alkyl group, an alicyclic alkyl group, an aryl group or an aralkyl group,

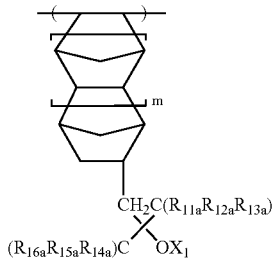

(II')

wherein $R_{11a}$ to $R_{16a}$ each independently represents a hydrogen atom, a fluorine atom or a fluorinated alkyl group, provided that at least one of $R_{11a}$ to $R_{16a}$ is not a hydrogen atom, $X_1$ represents a hydrogen atom or a group decomposable by the action of an acid, and m represents 0 or 1,

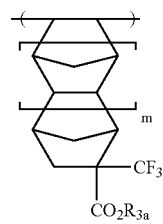

(III)

wherein $R_{3a}$ represents a hydrogen atom or a group decomposable by the action of an acid, and m represents 0 or 1,

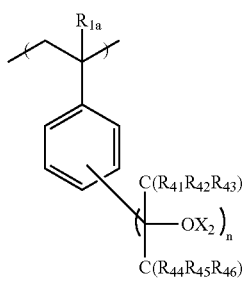

(IV)

wherein $R_{1a}$ represents a hydrogen atom, a fluorine atom, a chlorine atom, a bromine atom, a cyano group or a trifluoromethyl group, $R_{41}$ to $R_{46}$ each independently represents a hydrogen atom, a fluorine atom or a fluorinated alkyl group, provided that at least one of $R_{41}$ to $R_{46}$ is not a hydrogen atom, $X_2$ represents a hydrogen atom or a group decomposable by the action of an acid, n represents an integer of 2 to 5, provided that $R_{41}$ to $R_{46}$ and $X_2$ may be the same or different when they each exist in a number of 2 or more.

7. The positive resist composition according to claim 6, wherein the resin (A2) comprises at least one type of repeating unit formed with vinyl ether compounds.

8. The positive resist composition according to claim 6, wherein the resin (A2) comprises at least one type of repeating unit formed with a α-halogenated acrylate ester or a α-trihalogenated methacrylate ester.

9. The positive resist composition according to claim 6, wherein the resin (A2) has a weight average molecular weight of 3,000 to 30,000 and a molecular weight dispersion degree of 1.1 to 1.5.

10. The positive resist composition according to claim 6, wherein the resin (A2) is obtained by a procedure of removing low molecular components from the polymer resulting from radical polymerization.

11. The positive resist composition according to claim 6, wherein the resin (A2) is obtained by continuous or intermittent addition of monomers during the radical polymerization of monomers in the presence of radical polymerization initiators.

12. The positive resist composition according to claim 1 or 6, wherein the compound (B) comprises a compound (B1) which is capable of generating an organic sulfonic acid by irradiation of actinic ray or radiation.

13. The positive resist composition according to claim 12, wherein the compound (B1) comprises:
   a compound capable of generating an organic sulfonic acid by irradiation of actinic ray or radiation, in which the organic sulfonic acid is substituted with at least one fluorine atom; and
   a compound capable of generating an organic sulfonic acid by irradiation of actinic ray or radiation, in which the organic sulfonic acid is not substituted with a fluorine atom.

14. The positive resist composition according to claim 1 or 6, wherein the compound (B) comprises a compound (B2) capable of generating a carboxylic acid by irradiation of actinic ray or radiation.

15. The positive resist composition according to claim 1 or 6, further comprising (X) a non-polymer type dissolution inhibitor.

16. The positive resist composition according to claim 1 or 6, further comprising a mixture solvent of propylene glycol monoalkyl ether acetates with propylene glycol monoalkyl ethers or alkyl lactates.

* * * * *